(12) United States Patent
Shimada et al.

(10) Patent No.: US 9,905,242 B2
(45) Date of Patent: Feb. 27, 2018

(54) SIGNAL ANALYSIS DEVICE, SIGNAL CONTROL DEVICE, ITS SYSTEM, METHOD, AND PROGRAM

(75) Inventors: Osamu Shimada, Minato-ku (JP); Toshiyuki Nomura, Minato-ku (JP); Akihiko Sugiyama, Minato-ku (JP); Osamu Houshuyama, Minato-ku (JP)

(73) Assignee: NEC CORPORATION, Minato-ku, Tokyo (JP)

(*) Notice: Subject to any disclaimer, the term of this patent is extended or adjusted under 35 U.S.C. 154(b) by 1162 days.

(21) Appl. No.: 12/666,941

(22) PCT Filed: Jun. 26, 2008

(86) PCT No.: PCT/JP2008/061621
§ 371 (c)(1),
(2), (4) Date: Dec. 28, 2009

(87) PCT Pub. No.: WO2009/001886
PCT Pub. Date: Dec. 31, 2008

(65) Prior Publication Data
US 2010/0189280 A1    Jul. 29, 2010

(30) Foreign Application Priority Data

Jun. 27, 2007    (JP) .................... 2007-168544

(51) Int. Cl.
*G10L 21/0208*    (2013.01)
*H03G 3/32*    (2006.01)
(52) U.S. Cl.
CPC .......... *G10L 21/0208* (2013.01); *H03G 3/32* (2013.01); *H04S 2400/13* (2013.01)

(58) Field of Classification Search
CPC ..... G10L 21/0208; H03G 3/32; H04R 2400/13
USPC .................. 381/94.1; 370/458, 498, 514
See application file for complete search history.

(56) References Cited

U.S. PATENT DOCUMENTS

| | | | |
|---|---|---|---|
| 4,980,886 A * | 12/1990 | Bernstein | 370/433 |
| 5,793,903 A | 8/1998 | Lopresti et al. | |
| 5,867,815 A * | 2/1999 | Kondo et al. | 704/228 |
| 6,339,758 B1 * | 1/2002 | Kanazawa et al. | 704/226 |
| 6,782,361 B1 | 8/2004 | El-Maleh et al. | |
| 7,415,120 B1 * | 8/2008 | Vaudrey et al. | 381/109 |

(Continued)

FOREIGN PATENT DOCUMENTS

| | | |
|---|---|---|
| EP | 0653846 A1 | 5/1995 |
| JP | 07-203400 A | 8/1995 |

(Continued)

OTHER PUBLICATIONS

Kazuhiro Yamato et al., "Post-Processing Noise Suppressor with Adaptive Gain-Flooring for Cell-Phone Handsets and IC Recorders", IEEE, 2007.

(Continued)

*Primary Examiner* — Davetta W Goins
*Assistant Examiner* — Daniel Sellers
(74) *Attorney, Agent, or Firm* — Sughrue Mion, PLLC

(57) ABSTRACT

A signal analysis device includes: a signal reception unit which receives an input signal containing a plurality of constituent elements; and a signal analysis unit which generates analysis information indicating the relationship between the constituent elements from the input signal.

17 Claims, 23 Drawing Sheets

(56) References Cited

U.S. PATENT DOCUMENTS

| | | | |
|---|---|---|---|
| 8,027,478 B2* | 9/2011 | Barry et al. | 381/17 |
| 8,483,410 B2* | 7/2013 | Park et al. | 381/119 |
| 2002/0040295 A1* | 4/2002 | Saunders et al. | 704/200 |
| 2003/0053680 A1* | 3/2003 | Lin | H04S 5/005 382/154 |
| 2005/0254446 A1* | 11/2005 | Breebaart | 370/315 |
| 2006/0104458 A1* | 5/2006 | Kenoyer et al. | 381/92 |
| 2011/0013790 A1* | 1/2011 | Hilbert et al. | 381/300 |

FOREIGN PATENT DOCUMENTS

| | | |
|---|---|---|
| JP | 2000-047699 A | 2/2000 |
| JP | 2000-099096 A | 4/2000 |
| JP | 2001-100800 A | 4/2001 |
| JP | 2003-271166 A | 9/2003 |
| WO | 2006/022308 A1 | 3/2006 |
| WO | WO 2006/084916 A2 | 8/2006 |

OTHER PUBLICATIONS

Manfred R. Schroeder et al., "Code-Excited Linear Prediction (CELP): High-Quality Speech at Very Low Bit Rates", IEEE, 1985, pp. 937-940.

Yariv Ephraim et al., "Speech Enhancement Using a Minimum Mean-Square Error Short-Time Spectral Amplitude Estimator", IEEE Transactions on Acoustics, Speech, and Signal Processing, Dec. 1984, pp. 1109-1121, vol. ASSP-32, No. 6.

Y. Ephraim et al., "Speech Enhancement Using a Minimum Mean-Square Error Log-Spectral Amplitude Estimator", IEEE Transactions on Acoustics, Speech and Signal Processing, Apr. 1985, pp. 443-445, vol. ASSP-33, No. 2.

Thomas Lotter et al., "Speech Enhancement by MAP Spectral Amplitude Estimation Using a Super-Gaussian Speech Model", EURASIP Journal on Applied Signal Processing, 2005, pp. 1110-1126.

Steven F. Boll et al, "Suppression of Acoustic Noise in Speech Using Spectral Subtraction", IEEE Transactions on Acoustics, Speech, and Signal Processing, Apr. 1979, pp. 113-120, vol. ASSP-27, No. 2.

International Standard, "Information Technology—MPEG audio technologies", ISO-IEC 23003-1, 2007, pp. 1-19.

"Call for Proposals on Spatial Audio Object Coding," International Organisation for Standardisation, ISO/IEC JTC1/SC29/WG11, Jan. 2007, Marrakech, Morocco.

Search Report dated Apr. 18, 2012 by the European Patent Office in counterpart European Application No. 08790636.8.

* cited by examiner

SIGNAL CONTROL INFORMATION

SIGNAL CONTROL INFORMATION

SIGNAL CONTROL INFORMATION

SIGNAL CONTROL INFORMATION

SIGNAL CONTROL INFORMATION

SIGNAL CONTROL INFORMATION

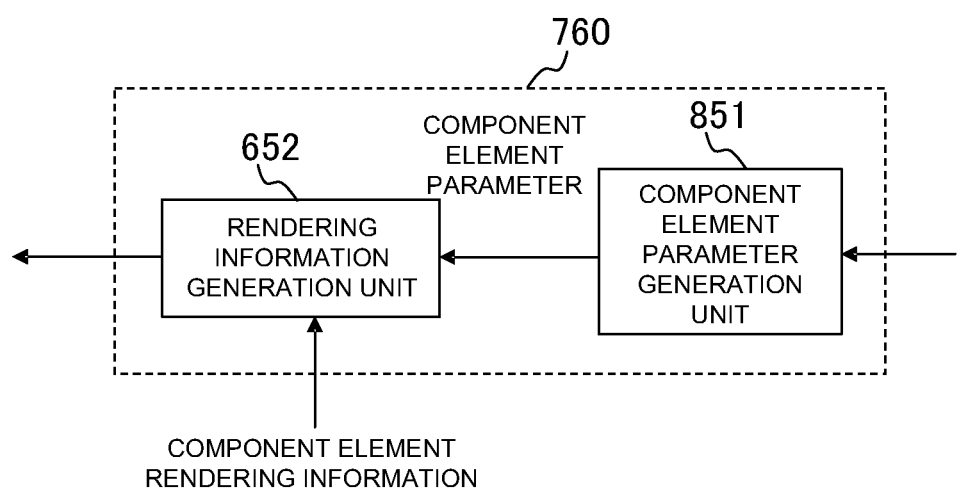
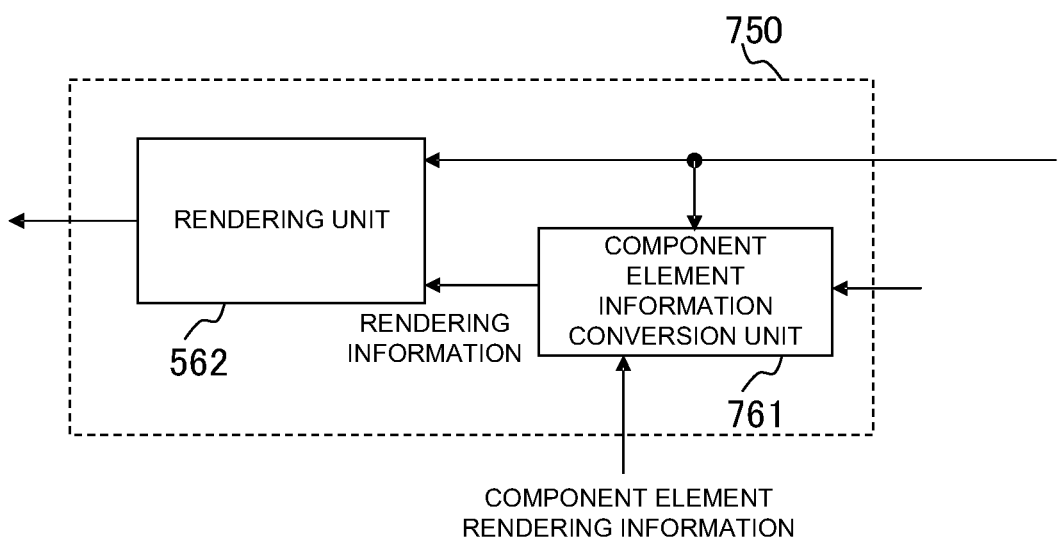

SIGNAL ANALYSIS DEVICE, SIGNAL CONTROL DEVICE, ITS SYSTEM, METHOD, AND PROGRAM

APPLICABLE FIELD IN THE INDUSTRY

The present invention relates to a signal analysis device, a signal control device, a system thereof, a method thereof, and a program thereof.

BACKGROUND ART

As a system for suppressing background noise of an input signal having a plurality of sound sources each of which is configured of desired sound and background noise, a noise suppression system (hereinafter, referred to as a noise suppressor) is known. The noise suppressor is a system for suppressing noise superposed upon a desired sound signal. The noise suppressor, as a rule, estimates a power spectrum of a noise component by employing an input signal converted in a frequency region, and subtracts the estimated power spectrum of the noise component from the input signal. With this, the noise coexisting in the desired sound signal is suppressed. In addition, these noise suppressors are applied also for the suppression of non-constant noise by successively estimating the power spectrum of the noise component. There exists, for example, the technique described in Patent document 1 as a prior art related to these noise suppressors (hereinafter, referred to as a first related prior art).

Normally, the noise suppressor of the first related prior art, which is utilized for communication, fulfils a function as a pretreatment of an encoder. An output of the noise suppressor is encoded, and is transmitted to a communication path. In a receiving unit, the signal is decoded, and an audible signal is generated. In a one-input noise suppression system employing the noise suppressor of the first related prior art, as a rule, residual noise that stays as a result of being not suppressed, and distortion of emphasized sound that is outputted are in a relation of trade-off. Reducing the residual noise leads to an increase in the distortion, and reducing the distortion leads to an increase in the residual noise. The best status of a balance between the residual noise and the distortion differs dependent upon individual users. However, with a configuration in which the noise suppressor exists in the upstream side of the encoder, namely, exists in a transmission unit, the user cannot adjust a balance between the residual noise and the distortion to its own taste.

As a noise suppressor assuming a configuration capable of solving this problem, a receiving side noise suppressor shown in FIG. 58 disclosed in Non-patent document 1 is known (hereinafter, referred to as a second related prior art). In the configuration of the second related prior art, a noise suppression unit 9501 is included not in the transmission unit, but in the receiving unit. The noise suppression unit 9501 performs a process of suppressing the noise of the signal inputted from a decoder. This enables the user to adjust a balance between the residual noise and the distortion to its own taste.

Patent document 1: JP-P2002-204175A

Non-patent document 1: IEEE INTERNATIONAL CONFERENCE ON CONSUMER ELECTRONICS, 6.1-4, January 2007

DISCLOSURE OF THE INVENTION

Problems to be Solved by the Invention

The foregoing first related prior art causes a problem that the user cannot adjust a balance between the residual noise and the distortion to its own taste. The foregoing second related prior art exists as a means for solving this problem.

However, the second related prior art causes a problem that an arithmetic quantity of the receiving unit is augmented because the receiving unit performs an arithmetic operation of the noise suppressor, which the transmission unit performs in the first related prior art. In addition, the second related prior art causes a problem that a noise suppression function cannot be incorporated when an important function other than the function of the noise suppressor exists in the receiving unit, or a problem that the other functions cannot be incorporated due to the incorporation of the noise suppression function. Further, the arithmetic quantity of the receiving unit (or a reproduction unit) is much, which incurs a decline in a sound quality and in convenience due to a limit put to a receiver function. In addition, there is a problem that the configurations as well of the first related prior art and the second related prior art cannot be applied for general separation of the signal because they aim for separating the sound from the background noise.

Thereupon, the present invention has been accomplished in consideration of the above-mentioned problems, and an object thereof is to provide a signal analysis device, a signal control device, a system thereof, a method thereof, and a program thereof that are capable of configuring the receiving unit with a small arithmetic quantity, and of controlling the input signal for each component element.

Means to Solve the Problem

The present invention for solving the above-mentioned problem is a signal analysis device, comprising: a signal receiving unit for receiving an input signal including a plurality of component elements; and a signal analysis unit for generating analysis information indicative of a relation between said plurality of component elements from said input signal.

In addition, the present invention for solving the above-mentioned problem is a signal control device, comprising: a signal receiving unit for receiving a signal including a plurality of component elements, and analysis information indicative of a relation between said plurality of component elements; and a signal control unit for controlling a relation between said plurality of component elements based upon said analysis information.

In addition, the present invention for solving the above-mentioned problem is a signal control device, comprising: a signal receiving unit for receiving a signal including a plurality of component elements, and analysis information indicative of a relation between said plurality of component elements; and a signal control unit for receiving signal control information for controlling a specific component element, and controlling said plurality of component elements based upon said analysis information and said signal control information.

In addition, the present invention for solving the above-mentioned problem is a signal control device, comprising: a signal receiving unit for receiving a signal including a plurality of component elements, and analysis information indicative of a relation between said plurality of component elements; and an output signal generation unit for receiving component element rendering information for controlling an output of said component element, controlling said component element based upon said analysis information and said component element rendering information, and generating an output signal.

In addition, the present invention for solving the above-mentioned problem is a signal analysis method, comprising generating analysis information from an input signal including a plurality of component elements, said analysis information indicating a relation between said plurality of component elements.

In addition, the present invention for solving the above-mentioned problem is a signal control method, comprising: receiving a signal including a plurality of component elements, and analysis information indicative of a relation between said plurality of component elements; and controlling a relation between said plurality of component elements based upon said analysis information.

In addition, the present invention for solving the above-mentioned problem is a signal control method, comprising: receiving a signal including a plurality of component elements, and analysis information indicative of a relation between said plurality of component elements, and signal control information for controlling a specific component element, and controlling said plurality of component elements based upon said analysis information and said signal control information.

In addition, the present invention for solving the above-mentioned problem is a signal control method, comprising: receiving a signal including a plurality of component elements, analysis information indicative of a relation between said plurality of component elements, and component element rendering information for controlling an output of said component element; and controlling said component element based upon said analysis information and said component element rendering information, and generating an output signal.

In addition, the present invention for solving the above-mentioned problem is a system, comprising: a signal receiving unit for receiving a signal including a plurality of component elements; a signal analysis unit for generating analysis information indicative of a relation between said plurality of component elements from said signal; a signal receiving unit for receiving said signal including said plurality of component elements, and said analysis information; and a signal control unit for controlling a relation between said plurality of component elements based upon said analysis information.

In addition, the present invention for solving the above-mentioned problem is a system, comprising: a signal receiving unit for receiving a signal including a plurality of component elements; a signal analysis unit for generating analysis information indicative of a relation between said plurality of component elements from said signal; a signal receiving unit for receiving said signal including said plurality of component elements, and said analysis information; and a signal control unit for receiving signal control information for controlling a specific component element, and controlling said plurality of component elements based upon said analysis information and said signal control information.

In addition, the present invention for solving the above-mentioned problem is a system, comprising: a signal receiving unit for receiving a signal including a plurality of component elements; a signal analysis unit for generating analysis information indicative of a relation between said plurality of component elements from said signal; a signal receiving unit for receiving said signal including said plurality of component elements, and said analysis information; and an output signal generation unit for receiving component element rendering information for controlling an output of said component element, controlling said component element based upon said analysis information and said component element rendering information, and generating an output signal.

In addition, the present invention for solving the above-mentioned problem is a signal analysis program, said program causing an information processing device to execute: a signal receiving process of receiving an input signal including a plurality of component elements; and a signal analysis process of generating analysis information indicative of a relation between said plurality of component elements from said input signal.

In addition, the present invention for solving the above-mentioned problem is a signal control program, comprising: a signal receiving process of receiving a signal including a plurality of component elements, and analysis information indicative of a relation between said plurality of component elements; and a signal control process of controlling a relation between said plurality of component elements based upon said analysis information.

In addition, the present invention for solving the above-mentioned problem is a signal control program, said program causing an information processing device to execute: a signal receiving process of receiving a signal including a plurality of component elements and analysis information indicative of a relation between said plurality of component elements; and a signal control process of receiving signal control information for controlling a specific component element, and controlling said plurality of component elements based upon said analysis information and said signal control information.

In addition, the present invention for solving the above-mentioned problem is a signal control program, comprising: a signal receiving process of receiving a signal including a plurality of component elements, and analysis information indicative of a relation between said plurality of component elements; and an output signal generation process of receiving component element rendering information for controlling an output of said component element, controlling said component element based upon said analysis information and said component element rendering information, and generating an output signal.

An Advantageous Effect of the Invention

With the foregoing means, the present invention enables the receiving unit to reduce the arithmetic quantity relating to a signal analysis because the transmission unit analyzes the signal. In addition, the present invention enables the receiving unit to control the input signal, which is configured of a plurality of the sound sources, for each component element corresponding to each sound source base upon signal analysis information coming from the transmission unit.

BRIEF DESCRIPTION OF THE DRAWINGS

FIG. 39 shows a configuration example of a component element information conversion unit 760.

FIG. 40 shows a second configuration example of the output signal generation unit 750.

Figure 1:
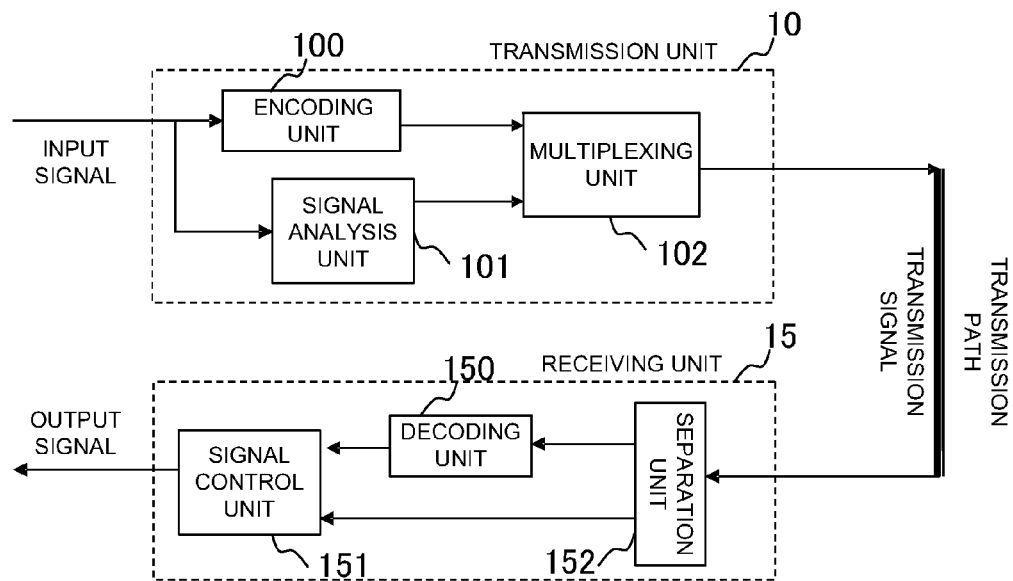
FIG. 1 is a block diagram illustrating a first embodiment of the present invention.

DESCRIPTION OF NUMERALS 1 transmission/receiving unit
10, 13 and 90 transmission units
15, 18, 35, 55, and 75 receiving units
100 and 1100 encoding units
101, 900, and 1101 signal analysis units
102 multiplexing unit
110, 120, 171, and 920 conversion units
111 quantization unit
121, 911, and 912 analysis information generation units
150 and 1150 decoding units
151, 350, and 1151 signal control units
152 separation unit
160 inverse quantization unit
161 and 173 inverse conversion units
172 and 360 signal processing units
200 and 1020 background sound estimation units
201, 252, and 452 suppression coefficient calculation units
202 background sound information generation unit
203 and 207 signal versus background sound ratio calculation units
204 signal versus background sound ratio encoding unit
205 background sound encoding unit
250 and 450 suppression coefficient re-configuration units 251, 451, and 470 multipliers
253 subtracter
260 suppression coefficient decoding unit
261 signal versus background sound ratio decoding unit
262 suppression coefficient conversion unit
263 background sound decoding unit
264 suppression coefficient generation unit
460 suppression coefficient modification unit
461 signal versus background sound ratio modification unit
464 background sound modification unit
471 comparison unit
472 designated suppression coefficient control unit
473 switch
550 and 750 output signal generation units
560 and 565 signal control units
561, 563, 564, 655, 760, and 761 component element information conversion units
562 rendering unit
651, 653, 851, and 853 component element parameter generation units
652 rendering information generation unit
910 quantizing distortion calculation unit
1200 signal separation analysis unit
1201 separation filter encoding unit
1202 separation filter decoding unit
1203 filter
1210 sound environment analysis unit
1211 sound environment information encoding unit
1212 sound environment information decoding unit
1213 sound environment information processing unit
1300 and 1301 computers
2021 suppression coefficient encoding unit

BEST MODE FOR CARRYING OUT THE INVENTION

Embodiments of the signal analysis control system of the present invention will be explained in details by making a reference to the accompanied drawings.

A first embodiment of the signal analysis control system of the present invention will be explained by making a reference to FIG. 1. The signal analysis control system of the present invention assumes a configuration in which a transmission unit 10 and a receiving unit 15 are connected via a transmission path. The transmission unit 10 receives an input signal that is configured of a plurality of the sound sources, and outputs a transmission signal. The transmission signal is inputted into the receiving unit 15 via the transmission path. The receiving unit 15 receives the transmission signal, and outputs an output signal. Further, the transmission unit, the transmission path, and the receiving unit could be a recording unit, a storage medium, and a reproduction unit, respectively.

The transmission unit 10 is configured of an encoding unit 100, a signal analysis unit 101, and a multiplexing unit 102. The input signal is inputted into the encoding unit 100 and the signal analysis unit 101. The signal analysis unit 101 calculates analysis information indicative of a relation of a component element that corresponds to each sound source being included in the input signal. The signal analysis unit 101 outputs the analysis information to the multiplexing unit 102. The encoding unit 100 encodes the input signal. The encoding unit 100 outputs the encoded signal to the multiplexing unit 102. The multiplexing unit 102 multiplexes the encoded signal being inputted from the encoding unit 100, and the analysis information being inputted from the signal analysis unit 101. The multiplexing unit 102 outputs the multiplexed signal to the transmission path as a transmission signal.

The receiving unit 15 is configured of a decoding unit 150, a signal control unit 151, and a separation unit 152. At first, the transmission signal is inputted into the separation unit 152. The separation unit 152 separates the transmission signal into a main signal and the analysis information. Continuously, the separation unit 152 outputs the main signal to the decoding unit 150, and outputs the analysis information to the signal control unit 151, respectively. The decoding unit 150 decodes the main signal, and generates the decoded signal. And, the decoding unit 150 outputs the decoded signal to the signal control unit 151. Herein, the decoded signal is configured of general plural sound sources. The signal control unit 151 manipulates the decoded signal received from the decoding unit 150 for each component element that corresponds to each sound source, based upon the analysis information received from the separation unit 152. The signal control unit 151 outputs the manipulated signal as an output signal. The signal control unit 151 may manipulate the decoded signal with the component element group, which is configured of a plurality of the component elements, defined as a unit instead of the component element that corresponds to each sound source.

Continuously, a configuration example of the encoding unit 100 will be explained in details by making a reference to FIG. 2. The encoding unit 100 receives the input signal, and outputs the encoded signal. The encoding unit 100 is configured of a conversion unit 110 and a quantization unit 111. At first, the input signal is inputted into the conversion unit 110. Next, the conversion unit 110 decomposes the input signal into frequency components, and generates a first converted signal. The conversion unit 110 outputs the first converted signal to the quantization unit 111. And, the quantization unit 111 quantizes the first converted signal, and outputs it as an encoded signal.

The conversion unit 110 configures one block by collecting a plurality of input signal samples, and applies a frequency conversion for this block. As an example of the frequency conversion, a Fourier transform, a cosine transform, a KL (Karhunen Loeve) transform, etc. are known. The technology related to a specific arithmetic operation of these transforms, and its properties are disclosed in Non-patent document 2 (DIGITAL CODING OF WAVEFORMS, PRINCIPLES AND APPLICATIONS TO SPEECH AND VIDEO, PRENTICE-HALL, 1990).

The conversion unit 110 also can apply the foregoing transforms for a result obtained by weighting one block of the input signal samples with a window function. As such a window function, the window functions such as a Hamming window, a Hanning (Hann) window, a Kaiser window, and a Blackman window are known. Further, more complicated window functions can be employed. The technology related to these window functions is disclosed in Non-patent document 3 (DIGITAL SIGNAL PROCESSING, PRENTICE-HALL, 1975) and Non-patent document 4 (MULTIRATE SYSTEMS AND FILTER BANKS, PRENTICE-HALL, 1993).

An overlap of each block may be permitted at the moment that the conversion unit 110 configures one block from a plurality of the input signal samples. For example, with the case of applying an overlap of 30% of a block length, the last 30% of the signal sample belonging to a certain block is repeatedly employed in a plurality of the blocks as the first 30% of the signal sample belonging to the next block. The technology relating to the blocking involving the overlap and the conversion is disclosed in the Non-patent document 2.

In addition, the conversion unit 110 may be configured of a band-division filter bank. The band-division filter bank is configured of a plurality of band-pass filters. The band-division filter bank divides the received input signal into a plurality of frequency bands, and outputs them to the quantization unit 111. An interval of each frequency band of the band-division filter bank could be equal in some cases, and unequal in some cases. Band-dividing the input signal at an unequal interval makes it possible to lower/raise a time resolution, that is, the time resolution can be lowered by dividing the input signal into narrows bands with regard to a low-frequency area, and the time resolution can be raised by dividing the input signal into wide bands with regard to a high-frequency area. As a typified example of the unequal-interval division, there exists an octave division in which the band gradually halves toward the low-frequency area, a critical band division that corresponds to an auditory feature of a human being, or the like. The technology relating to the band-division filter bank and its design method is disclosed in the Non-patent document 4.

The quantization unit 111 removes redundancy of the inputted signal, and outputs the encoded signal. As a method of removing redundancy, there exists the method of taking a control such that a correlation between the inputted signals is minimized. In addition, the signal component that is not auditorily recognized may be removed by utilizing the auditory feature such as a masking effect. As a quantization method, the quantization methods such as a linear quantization method and a non-linear quantization method are known. The redundancy of the quantized signal can be furthermore removed by employing Huffman coding etc.

A configuration example of the decoding unit 150 will be explained in details by making a reference to FIG. 3. The decoding unit 150 receives the main signal, and outputs the decoded signal. The decoding unit 150 is configured of an inverse quantization unit 160 and an inverse conversion unit 161. The inverse quantization unit 160 inverse-quantizes the received main signal of each frequency, and generates the first converted signal that is configured of a plurality of the frequency components. And, the inverse quantization unit 160 outputs the first converted signal to the inverse conversion unit 161. The inverse conversion unit 161 inverse-converts the first converted signal, and generates the decoded signal. And, the inverse conversion unit 161 outputs the decoded signal.

As an inverse conversion that the inverse conversion unit 161 applies, the inverse conversion corresponding to the conversion that the conversion unit 110 applies is preferably selected. For example, when the conversion unit 110 configures one block by collecting a plurality of the input signal samples, and applies the frequency conversion for this block, the inverse conversion unit 161 applies the corresponding inverse conversion for the samples of which number is identical. Further, when an overlap of each block is permitted at the moment that the conversion unit 110 configures one block by collecting a plurality of the input signal samples, the inverse conversion unit 161, responding to this, applies an identical overlap for the inverse-converted signal. In addition, when the conversion unit 110 is configured of the band-division filter bank, the inverse conversion unit 161 is configured of a band-synthesis filter bank. The technology relating to the band-synthesis filter bank and its design method is disclosed in the Non-patent document 4.

Figure 2:
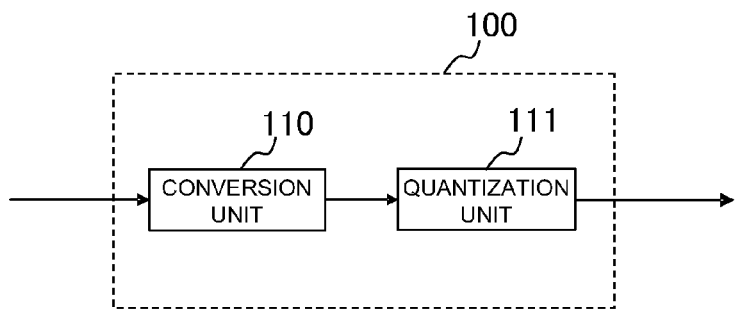
FIG. 2 shows a configuration example of an encoding unit 100.
Figure 3:
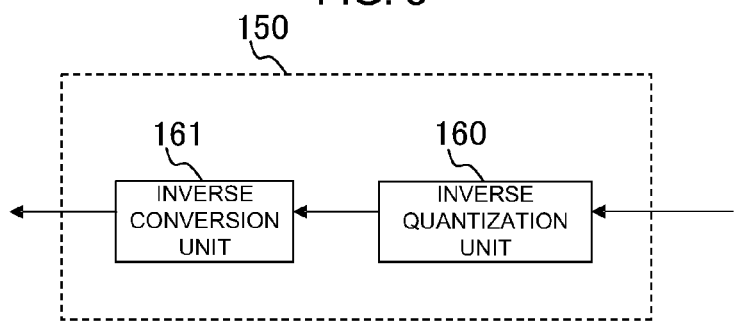
FIG. 3 shows a configuration example of a decoding unit 150.

While the encoding unit 100 of FIG. 2 and the decoding unit 150 of FIG. 3 were explained on the assumption that conversion/encoding having the conversion unit included therein was applied, a pulse code modulation (PCM), an adaptive differential pulse code modulation (ADPCM), and analysis-by-synthesis coding, which is typified by CELP etc., in addition hereto may be applied. The technology relating to the PCM/ADPCM is disclosed in the Non-patent document 2. Further, the technology relating to the CELP is disclosed in Non-patent document 5 (IEEE INTERNATIONAL CONFERENCE ON ACOUSTIC, SPEECH, AND SIGNAL PROCESSING, 25.1.1, March 1985, pp. 937-940)

Further, the encoding unit 100 may output the input signal as it stands to the multiplexing unit 102 without performing the encoding process therefor, and the decoding unit 150 may input the main signal as it stands into the signal control unit 151 without performing the decoding process therefor. This configuration makes it possible to eliminate the distortion of the signal accompanied by the encoding/decoding process. In addition, a configuration may be made so that the encoding unit 100 and the decoding unit 150 perform a distortion-less compression/expansion process. This configuration enables the signal control unit 151 to receive the decoded signal without distorting the input signal.

Figure 4:
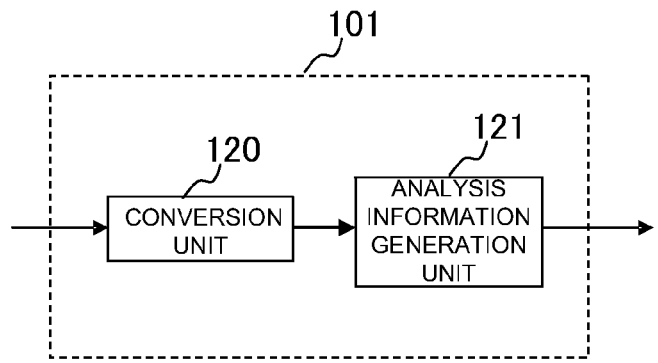
FIG. 4 shows a configuration example of a signal analysis unit 101.

A configuration example of the signal analysis unit 101 will be explained in details by making a reference to FIG. 4. The signal analysis unit 101 receives the input signal, and outputs the analysis information. The signal analysis unit 101 is configured of a conversion unit 120 and an analysis information generation unit 121. The conversion unit 120 decomposes the received input signal into the frequency components, and generates the second converted signal. The conversion unit 120 outputs the second converted signal to the analysis information generation unit 121. The analysis information generation unit 121 decomposes the second converted signal into the component elements that correspond to the sound source, and generates the analysis information indicative of a relation between a plurality of the component elements. And, the analysis information generation unit 121 outputs the analysis information. Further, the analysis information generation unit 121 may decompose the second converted signal into component element groups each of which is configured of a plurality of the component elements, and calculate the analysis information. The signal analysis unit 101 may encode the analysis information when the redundancy exists in the analysis information. This makes it possible to minimize the redundancy of the analysis information. The technique of the conversion in the conversion unit 110 may be employed for the technique of the conversion in the conversion unit 120.

A configuration example of the signal control unit 151 will be explained in details by making a reference to FIG. 5. The signal control unit 151 receives the decoded signal and the analysis information, and outputs the output signal. The signal control unit 151 is configured of a conversion unit 171, a signal processing unit 172, and an inverse conversion unit 173. The conversion unit 171 decomposes the received decoded signal into the frequency components, and generates the second converted signal. The signal control unit 151 outputs the second converted signal to the signal processing unit 172. The signal processing unit 172 decomposes the second converted signal into the component elements that correspond to the sound source by employing the analysis information, changes a relation between a plurality of the component elements, and generates the modified decoded signal. And, the signal processing unit 172 outputs the modified decoded signal to the inverse conversion unit 173.

Further, the signal processing unit 172 may decompose the second converted signal into component element groups each of which is configured of a plurality of the component elements, and change a relation between a plurality of the component elements. The signal processing unit 172 performs the above-mentioned process after finishing the decoding process in the case that the analysis information has been encoded in the analysis information generation unit 121. The inverse conversion unit 173 inverse-converts the modified decoded signal, and generates the output signal. And, the inverse conversion unit 173 outputs the output signal. The technique of the inverse conversion in the inverse conversion unit 161 can be employed for the technique of the inverse conversion in the inverse conversion unit 173.

As explained above, the first embodiment of the present invention enables the receiving unit to control the input signal, which is configured of a plurality of the sound sources, for each component element corresponding to each sound source based upon the analysis information of the input signal being outputted from the transmission unit. In addition, the receiving unit can curtail the arithmetic quantity relating to the signal analysis because the transmission unit analyses the signal.

Continuously, a second embodiment of the present invention will be explained in details. The second embodiment of the present invention is for controlling the input signal that is configured of objective sound and background sound as a sound source. A configuration of the second embodiment is represented in FIG. 1. The second embodiment differs from the first embodiment in the configurations of the signal analysis unit 101 and the signal control unit 151. The signal analysis unit 101 of the second embodiment receives the input signal that is configured of the objective sound and the background sound, and outputs the information indicative of a relation between the objective sound and the background sound as analysis information to the multiplexing unit 102. Further, the signal control unit 151 receives the decoded signal and the analysis information, generates the output signal by controlling the objective sound and the background sound, and outputs it.

In a first example, the signal analysis unit 101 calculates a suppression coefficient as analysis information. The suppression coefficient is a coefficient for suppressing the background sound, which is caused to act upon the input signal that is configured of the objective sound and the background sound. The signal control unit 151 controls the decoded signal by employing the suppression coefficient. A configuration of the signal analysis unit 101 is represented in FIG. 4. A configuration of the analysis information calculation unit 121 of this example differs from that of the analysis information calculation unit 121 of the first embodiment. Further, the signal control unit 151 of this embodiment is represented in FIG. 5. A configuration of the signal control unit 151 of this example differs from that of the signal control unit 151 of the first embodiment.

Figure 6:
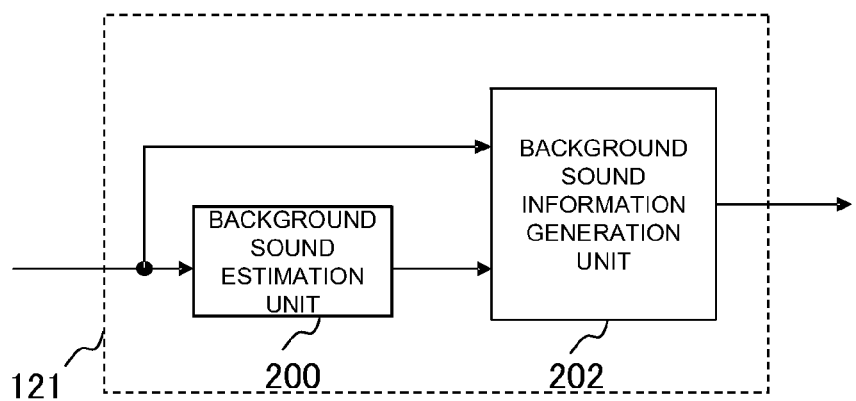
FIG. 6 shows a configuration example of an analysis information generation unit 121.

A configuration example of the analysis information generation unit 121 will be explained in details by making a reference to FIG. 6. The analysis information generation unit 121 receives the second converted signal, and outputs the suppression coefficient as analysis information. The analysis information generation unit 121 is configured of a background sound estimation unit 200 and a background sound information generation unit 202. The background sound estimation unit 200 receives the second converted signal, estimates the background sound, and generates information of the background sound. The background sound estimation unit 200 outputs the information of the background sound to the background sound information generation unit 202. As information of the background sound, there exist an amplitude absolute value and an energy value of the background sound, an amplitude ratio and an energy ratio of the background sound and the input signal, an average value thereof, and so on. The background sound information generation unit 202 receives the second converted signal and the information of the background sound. The background sound information generation unit 202 calculates the suppression coefficient based upon the second converted signal and the information of the background sound. And, the background sound information generation unit 202 outputs the suppression coefficient or the encoded suppression coefficient as analysis information.

Figure 7:
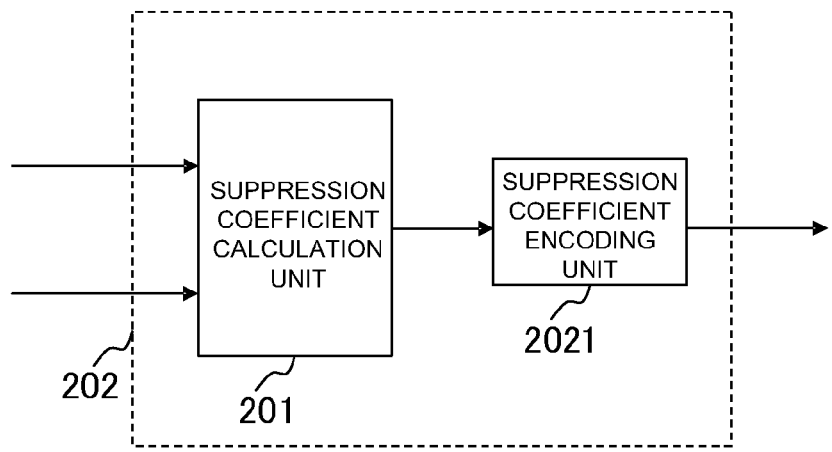
FIG. 7 shows a configuration example of a background sound information generation unit 202.

A configuration example of the background sound information generation unit 202 will be explained in details by making a reference to FIG. 7. The background sound information generation unit 202 receives the second converted signal and the information of the background sound, and outputs the suppression coefficient as analysis information. The background sound information generation unit 202 is configured of a suppression coefficient calculation unit 201 and a suppression coefficient encoding unit 2021. The suppression coefficient calculation unit 201 calculates an appropriate suppression coefficient for suppressing the background sound by employing the second converted signal and the information of the background sound. And, the suppression coefficient calculation unit 201 outputs the suppression coefficient to the suppression coefficient encoding unit 2021. As a technology relating to the method of calculating the suppression coefficient, the method founded upon minimum mean square error short-time spectral amplitude (MMSE STSA) is disclosed in Non-patent document 6 (IEEE TRANSACTIONS ON ACOUSTIC, SPEECH, AND SIGNAL PROCESSING, VOL. 32, NO. 6, pp. 1109-1121, December 1984), the method founded upon minimum mean square error log spectral amplitude (MMSE LSA) is disclosed in Non-patent document 7 (IEEE TRANSACTIONS ON ACOUSTIC, SPEECH, AND SIGNAL PROCESSING, VOL. 33, NO. 2, pp. 443-445, April 1985, and the method founded upon minimum mean square error short-time spectral amplitude (MMSE STSA), or the like is disclosed in Non-patent document 8 (EURASIP JOURNAL ON ADVANCES IN SIGNAL PROCESSING, VOLUME 2005, Issue 7, July 2005, pp. 1110-1126).

The suppression coefficient encoding unit 2021 receives and encodes the suppression coefficient. The suppression coefficient encoding unit 2021 outputs the encoded suppression coefficient as analysis information. The suppression coefficient encoding unit 2021 subjects the suppression coefficient to the quantization such as linear quantization and non-linear quantization, and outputs the suppression coefficient encoded with the Huffman coding etc. This makes it possible to remove the redundancy of the suppression coefficient. Further, when the information quantity does not need to be curtailed, the suppression coefficient encoding unit 2021 may output the suppression coefficient as analysis information without performing these encoding processes.

Next, a configuration example of the signal processing unit 172 will be explained in details by making a reference to FIG. 8. The signal processing unit 172 receives the second converted signal and the analysis information, and outputs the modified decoded signal. The signal processing unit 172 is configured of a suppression coefficient re-configuration unit 250 and a multiplier 251. The second converted signal is inputted into the multiplier 251, and the analysis information is inputted into the suppression coefficient re-configuration unit 250. The suppression coefficient re-configuration unit 250 re-configures the suppression coefficient by employing the inputted analysis information, and outputs the suppression coefficient to the multiplier 251. The multiplier 251 multiplies the second converted signal by the suppression coefficient, and generates the modified decoded signal. The multiplier 251 outputs the modified decoded signal to the inverse conversion unit 173.

A configuration example of the suppression coefficient re-configuration unit 250 will be explained in details by making a reference to FIG. 9. The suppression coefficient re-configuration unit 250 receives the encoded suppression coefficient as analysis information, and outputs the suppression coefficient. The suppression coefficient re-configuration unit 250 is configured of a suppression coefficient decoding unit 260. The suppression coefficient decoding unit 260 decodes the received suppression coefficient. The suppression coefficient decoding unit 260 outputs the suppression coefficient without performing the decoding process when the suppression coefficient has not been encoded.

In a second example, the signal analysis unit 101 calculates a signal versus background sound ratio as analysis information. The signal control unit 151, responding to this, calculates the suppression coefficient based upon the signal versus background sound ratio. The signal control unit 151 controls the decoded signal by employing this suppression coefficient. With this, the signal of which the background sound has been suppressed can be obtained from the input signal that is configured of the objective sound and the background sound.

At first, the signal analysis unit 101 will be explained. The signal analysis unit 101, similarly to the case of the first example, is represented in FIG. 4. Upon comparing this example with the first example, the former differs from the latter in a configuration of the background sound information generation unit 202 being included in the analysis information generation unit 121 shown in FIG. 6.

Figure 10:
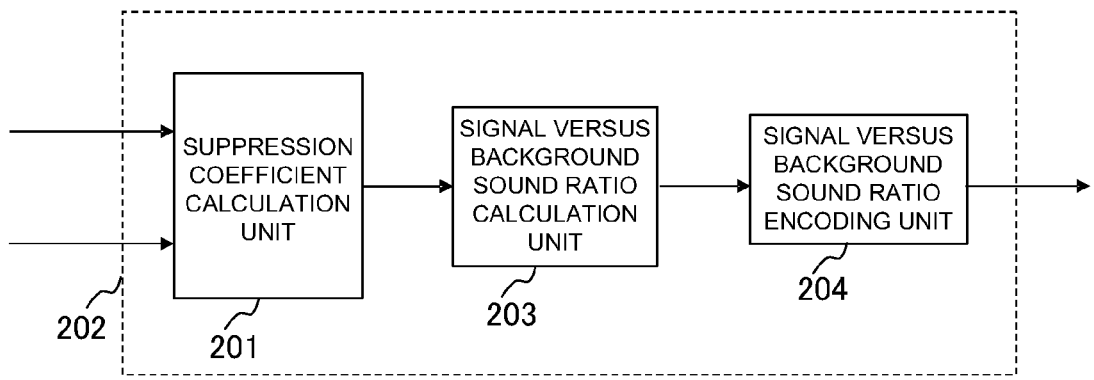
FIG. 10 shows a second configuration example of the background sound information generation unit 202.

A configuration example of the background sound information generation unit 202 of this example will be explained in details by making a reference to FIG. 10. The background sound information generation unit 202 receives the second converted signal and the information of the background sound, and outputs the encoded signal versus background sound ratio as analysis information. The background sound information generation unit 202 is configured of a suppression coefficient calculation unit 201, a signal versus background sound ratio calculation unit 203, and a signal versus background sound ratio encoding unit 204. The suppression coefficient calculation unit 201 calculates an appropriate suppression coefficient for suppressing the background sound by employing the second converted signal and the information of the background sound. And, the suppression coefficient calculation unit 201 outputs the suppression coefficient to the signal versus background sound ratio calculation unit 203. As a method of calculating the suppression coefficient, the calculation method of the suppression coefficient calculation unit 201 of the first example shown in FIG. 7 can be employed. The signal versus background sound ratio calculation unit 203 calculates a signal versus background sound ratio R by employing an inputted suppression coefficient G. Upon defining the input signal as X, the objective sound as S, and the background sound as N, the following relation holds.

$$X = S + N \quad \text{[Numerical equation 1]}$$

$$S = G \times X \quad \text{[Numerical equation 2]}$$

$$R = \frac{S^2}{N^2} \quad \text{[Numerical equation 3]}$$

R based upon this definition is known as a prior signal-to noise ratio (prior SNR) when the background sound is noise. Upon substituting [Numerical equation 1] and [Numerical equation 2] into [Numerical equation 3], the following equation is yielded.

$$R = \frac{S^2}{(X-S)^2} = \frac{G^2}{1-G^2} \quad \text{[Numerical equation 4]}$$

The signal versus background sound ratio calculation unit 203 outputs the calculated signal versus background sound ratio R to the signal versus background sound ratio encoding unit 204. The signal versus background sound ratio encoding unit 204 encodes the inputted signal versus background sound ratio R. The signal versus background sound ratio encoding unit 204 outputs the encoded signal versus background sound ratio R as analysis information. With regard to the details of the encoding process, an encoding process similar to the encoding process being performed in the suppression coefficient encoding unit 2021 can be employed. This makes it possible to remove the redundancy of the signal versus background sound ratio R. Further, when the information quantity does not need to be curtailed, the signal versus background sound ratio encoding unit 204 may output the signal versus background sound ratio as analysis information without performing the encoding process for the signal versus background sound ratio R.

Next, the signal control unit 151 of this example will be explained in details. The signal control unit 151, similarly to the case of the first example, is represented in FIG. 5. This example differs from the first example in a configuration of the suppression coefficient re-configuration unit 250 being included in the signal processing unit 172 shown in FIG. 8.

A configuration example of the suppression coefficient re-configuration unit 250 will be explained in details by making a reference to FIG. 11. The suppression coefficient re-configuration unit 250 receives the encoded signal versus background sound ratio R as analysis information, and outputs the suppression coefficient G. The suppression coefficient re-configuration unit 250 is configured of a signal versus background sound ratio decoding unit 261 and a suppression coefficient conversion unit 262. The signal versus background sound ratio decoding unit 261 decodes the encoded signal versus background sound ratio R that has been received, and outputs the signal versus background sound ratio R to the suppression coefficient conversion unit 262. The signal versus background sound ratio decoding unit 261 outputs the signal versus background sound ratio without performing the decoding operation when the signal versus background sound ratio R has not been encoded. The suppression coefficient conversion unit 262 converts the signal versus background sound ratio R into the suppression coefficient G. And, the suppression coefficient conversion unit 262 has the suppression coefficient G as an output. The conversion from R to G is made based upon [Numerical equation 4]. Upon solving [Numerical equation 4] for G, the following equation is yielded.

$$G = \sqrt{\frac{R}{1+R}} \qquad \text{[Numerical equation 5]}$$

Figure 12:
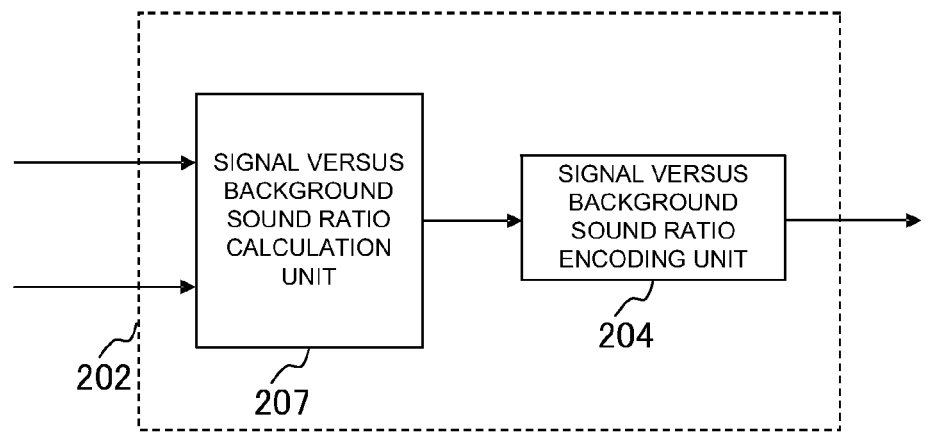
FIG. 12 shows a third configuration example of the background sound information generation unit 202.

Further, another configuration example of the background sound information generation unit 202 will be explained in details by making a reference to FIG. 12. Upon making a comparison with the background sound information generation unit 202 shown in FIG. 10, the background sound information generation unit 202 of this configuration example differs in a point of not including the suppression coefficient calculation unit 201. In the configuration of the background sound information generation unit 202 shown in FIG. 12, [Numerical equation 6] is employed as a definition of the signal versus background sound ratio R instead of [Numerical equation 3]. R based upon this definition is known as a posterior signal-to noise ratio (posterior SNR) when the background sound is noise.

$$R = \frac{X^2}{N^2} \qquad \text{[Numerical equation 6]}$$

That is, this example is configured to employ the posterior SNR as analysis information instead of the prior SNR when the background sound is noise. R of [Numerical equation 6], which does not demand the suppression coefficient G, is calculated from the input signal and the background sound. This enables the signal versus background sound ratio calculation unit 207 to calculate the signal versus background sound ratio based upon the second converted signal and the information of the background sound. And, the signal versus background sound ratio calculation unit 207 outputs the signal versus background sound ratio to the signal versus background sound ratio encoding unit 204. An operation of the signal versus background sound ratio encoding unit 204 is similar to that of the signal versus background sound ratio encoding unit 204 shown in FIG. 10, so its explanation is omitted.

On the other hand, [Numerical equation 1] and [Numerical equation 2] are substituted into [Numerical equation 6], and upon assuming that S and N have no correlation to each other, the following equation is yielded.

$$R = \frac{1}{1-G^2} \qquad \text{[Numerical equation 7]}$$

That is, the signal versus background sound ratio calculation unit 203 may calculate the signal versus background sound ratio R by employing [Numerical equation 7].

Figure 8:
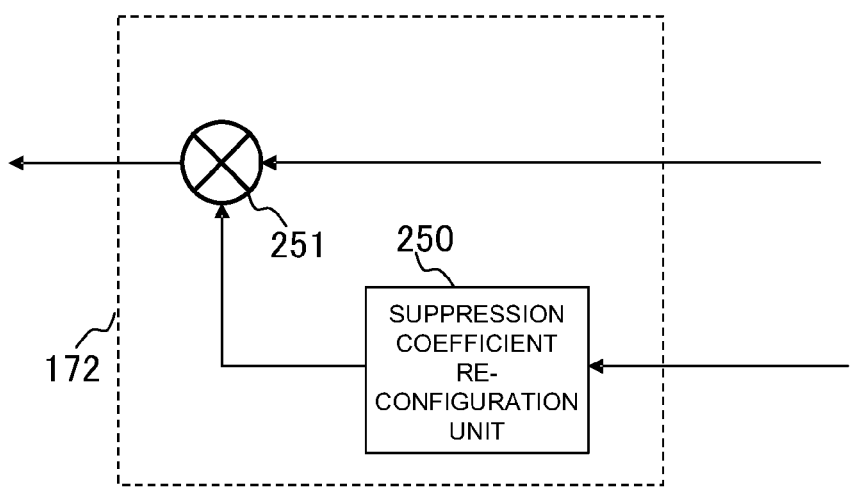
FIG. 8 shows a configuration example of a signal processing unit 172.
Figure 11:
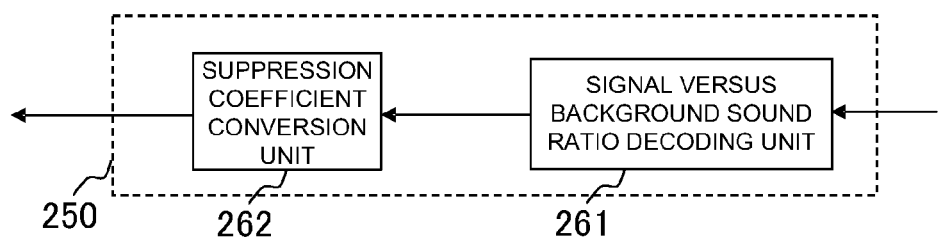
FIG. 11 shows a second configuration example of the suppression coefficient re-configuration unit 250.

In this configuration example, the suppression coefficient re-configuration unit 250 shown in FIG. 8 of the receiving side is represented in FIG. 11 similarly to the case of the foregoing configuration example. The signal versus background sound ratio decoding unit 261 decodes the encoded signal versus background sound ratio R received from the signal versus background sound ratio encoding unit 204, and outputs the signal versus background sound ratio R to the suppression coefficient conversion unit 262. The suppression coefficient conversion unit 262 converts the signal versus background sound ratio R into the suppression coefficient G, and outputs the suppression coefficient G. The conversion from R to G is made based upon [Numerical equation 8]. That is, upon solving [Numerical equation 7] for G, the following equation is yielded.

$$G = \sqrt{\frac{R-1}{R}} \qquad \text{[Numerical equation 8]}$$

Continuously, a third example will be explained. In the third example, the signal analysis unit 101 outputs the background sound itself as analysis information. The signal control unit 151, responding to this, controls the decoded signal by employing the background sound.

At first, the signal analysis unit 101 will be explained. The signal analysis unit 101, similarly to the case of the first example, is represented in FIG. 4. A configuration of the analysis information generation unit 121 of this example differs from that of the analysis information generation unit 121 of the first example shown in FIG. 6.

Figure 13:
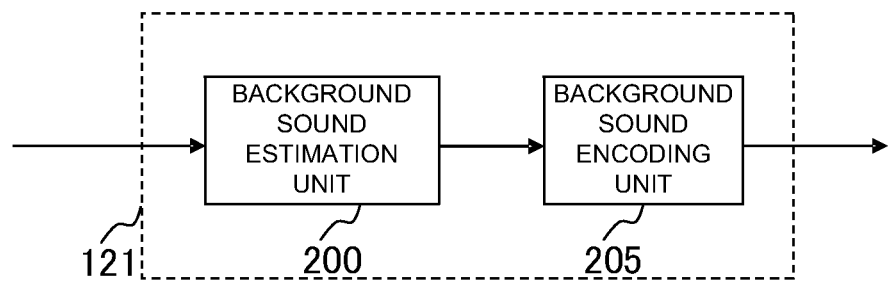
FIG. 13 shows a second configuration example of the analysis information generation unit 121.

A configuration example of the analysis information generation unit 121 of this example will be explained in details by making a reference to FIG. 13. Upon making a comparison with the configuration example of the analysis information generation unit 121 of the first embodiment shown in FIG. 6, the background sound information generation unit 202 is replaced with a background sound encoding unit 205. The analysis information generation unit 121 of this configuration example receives the second converted signal, and outputs the encoded background sound as analysis information. The analysis information generation unit 121 of this configuration example is configured of a background sound estimation unit 200 and the background sound encoding unit 205. The background sound estimation unit 200 of this configuration example outputs the background sound itself to the background sound encoding unit 205. The background sound encoding unit 205 encodes and outputs the inputted background sound. This makes it possible to remove the redundancy of the background sound. Further, when the information quantity does not need to be curtailed, the background sound encoding unit 205 may output the background sound as analysis information without performing the encoding process for the background sound.

With regard to the encoding process, an encoding process similar to that of the suppression coefficient encoding unit 2021 can be employed.

Next, the signal control unit 151 will be explained. The signal control unit 151, similarly to the case of the first example, is represented in FIG. 5. A configuration of the signal processing unit 172 of this example differs from that of the signal processing unit 172 of the first example shown in FIG. 8.

Figure 14:
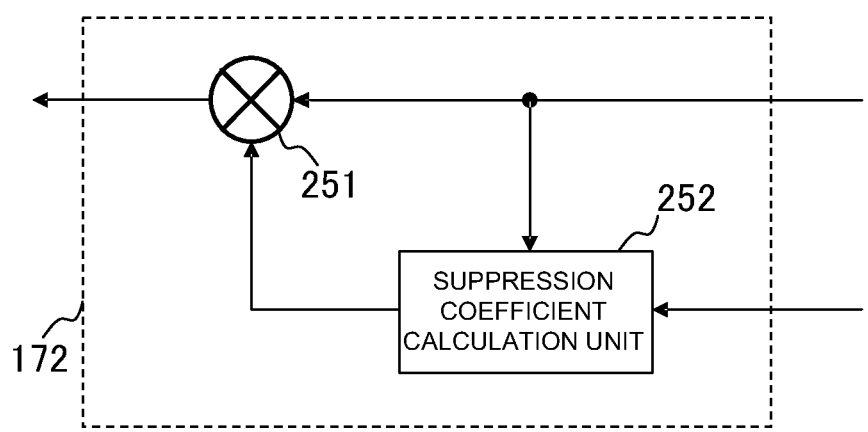
FIG. 14 shows a second configuration example of the signal processing unit 172.

A configuration example of the signal processing unit 172 of this example will be explained in details by making a reference to FIG. 14. Upon making a comparison with the configuration example of the signal processing unit 172 of the first example shown in FIG. 8, the suppression coefficient re-configuration unit 250 is replaced with a suppression coefficient calculation unit 252. The signal processing unit 172 receives the second converted signal and the encoded background sound as analysis information, and outputs the modified decoded signal. The signal processing unit 172 is configured of the suppression coefficient calculation unit 252 and an multiplier 251. The second converted signal is inputted into the suppression coefficient calculation unit 252 and the multiplier 251, and the encoded background sound is inputted as analysis information into the suppression coefficient calculation unit 252. The suppression coefficient calculation unit 252 calculates the suppression coefficient based upon the background sound and the second converted signal. And, the suppression coefficient calculation unit 252 outputs the suppression coefficient to the multiplier 251. The multiplier 251 multiplies the second converted signal by the suppression coefficient, and outputs the modified decoded signal to the inverse conversion unit 173.

Figure 15:
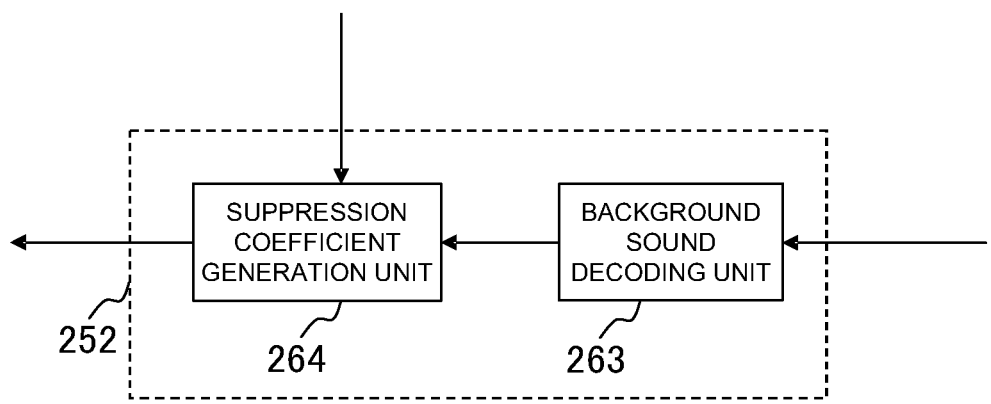
FIG. 15 shows a configuration example of a suppression coefficient calculation unit 252.

In addition, a configuration example of the suppression coefficient calculation unit 252 will be explained in details by making a reference to FIG. 15. The suppression coefficient calculation unit 252 is configured of a background sound decoding unit 263 and a suppression coefficient generation unit 264. The background sound decoding unit 263 receives the encoded background sound as analysis information. And, the background sound decoding unit 263 decodes the encoded background sound, and outputs the background sound to the suppression coefficient generation unit 264. The background sound decoding unit 263 outputs the background sound without performing the decoding operation when the background sound has not been encoded. The suppression coefficient generation unit 264 receives the background sound and the second converted signal. And, the suppression coefficient generation unit 264 calculates an appropriate suppression coefficient for suppressing the background sound based upon the background sound and the second converted signal. A calculation method similar to that of the suppression coefficient calculation unit 201 shown in FIG. 10 may be employed for to calculating this suppression coefficient. The suppression coefficient generation unit 264 outputs the suppression coefficient. As a technology related to the method of calculating the suppression coefficient, there exists the technology disclosed in the foregoing Non-patent document 6, Non-patent document 7, or Non-patent document 8.

Figure 16:
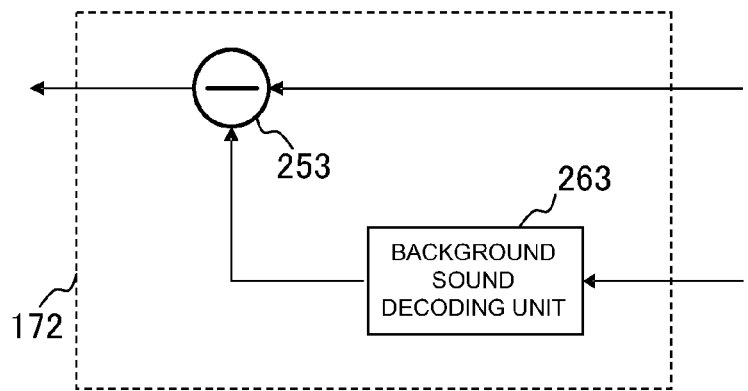
FIG. 16 shows a third configuration example of the signal processing unit 172.

In addition, another configuration example of the signal processing unit 172 will be explained in details by making a reference to FIG. 16. The signal processing unit 172 receives the second converted signal and the encoded background sound, and outputs the signal of which the background sound has been removed as a modified decoded signal. The signal processing unit 172 of this configuration example is configured of a background sound decoding unit 263 and a subtracter 253. The second converted signal is inputted into the subtracter 253, and the encoded background sound is inputted into the background sound decoding unit 263 as analysis information. The background sound decoding unit 263 decodes the encoded background sound, and outputs the background sound to the subtracter 253. The background sound decoding unit 263 is useless when the analysis information is not-encoded background sound. The subtracter 253 subtracts the background sound from the second converted signal. And, the subtracter 253 outputs the signal of which the background sound has been removed as a modified decoded signal. This subtraction is known as spectral subtraction when the background sound is noise. The technology relating to the spectral subtraction is disclosed in Non-patent document 9 (IEEE TRANSACTION ON ACOUSTICS, SPEECH, AND SIGNAL PROCESSING, VOL. 27, NO. 2, pp. 113-120, April 1979).

Further, an addition function besides the subtraction can be incorporated into the subtracter 253. For example, as an addition function, the function of, when the subtraction result indicates a negative value, correcting this value to zero or a minute positive value, a limiter function of setting a minimum value of the subtraction result to a positive value, or the function of, after correcting the subtraction result by multiplying the background sound information by the coefficient or adding a constant hereto, subtracting the background sound can be listed.

In addition, in this embodiment, the transmission unit 10 may calculate the analysis information of the above-mentioned first to third examples independently channel by channel when the input signal is configured of a plurality of channels. Further, the transmission unit 10 may calculate a sum of all channels of the input signal, and calculate the analysis information common to all channels from the summed signals. Or, the transmission unit 10 may divide the input signal into a plurality of groups, calculate a sum of the input signals of respective groups, and calculate the analysis information common to the group from the above summed signals. The receiving unit 15, responding to this, controls the decoded signal by employing the analysis information corresponding to each channel.

Further, the analysis information explained in the above-mentioned first to third examples may be calculated as analysis information common to a plurality of the frequency bands. For example, the transmission unit 10 may divide the frequency band at an equal interval, and calculate the analysis information for each divided frequency band. In addition, the transmission unit 10 may divide the input signal into fine frequency bands to an auditory feature of a human being with regard to the low-frequency area, divide the input signal into rough frequency bands with regard to the high-frequency area, and calculate the analysis information in a divided unit. This makes it possible to curtail the information quantity of the analysis information.

As explained above, the second embodiment of the present invention makes it possible to control the input signal, which is configured of the objective sound and the background sound, because the transmission unit analyzes the signal. In addition, the receiving unit can curtail the arithmetic quantity relating to the calculation of the analysis information because the transmission unit calculates the analysis information such as the suppression coefficient and the signal versus background sound ratio.

Continuously, a third embodiment of the present invention will be explained in details by making a reference to FIG. 17. In the third embodiment of the present invention, a receiving unit 35, which assumes a configuration in which the signal control information can be received, can control a specific sound source independently. Upon comparing the third embodiment shown in FIG. 17 with the first embodiment shown in FIG. 1, while the receiving unit 15 is configured of the signal control unit 151, the receiving unit 35 is configured of a signal control unit 350. Further, in this example, the transmission unit, the transmission path, and the receiving unit could be a recoding unit, a storage medium, and a reproduction unit, respectively. From now on, explanation of the portion which overlaps FIG. 1 is omitted.

Figure 18:
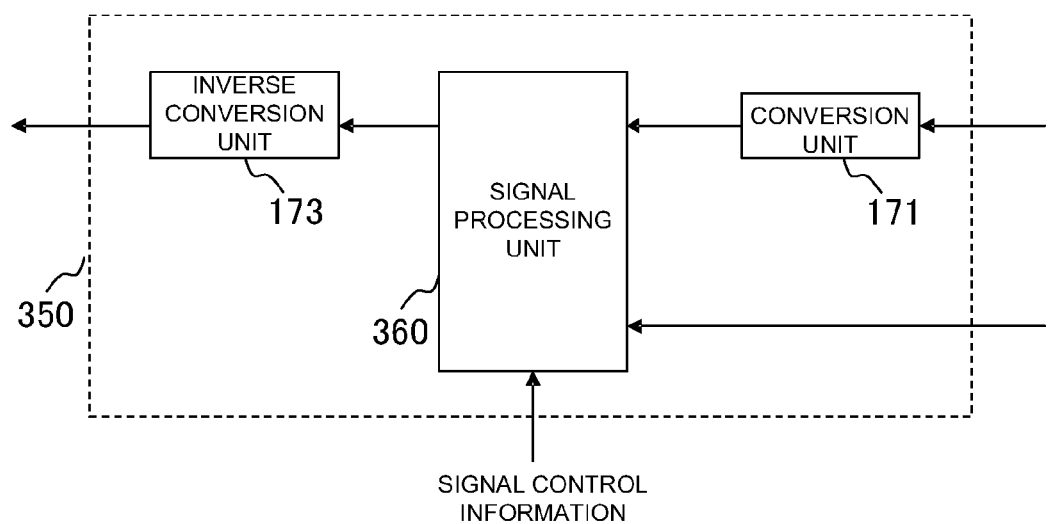
FIG. 18 shows a configuration example of a signal control unit 350.

A configuration example of the signal control unit 350 will be explained in details by making a reference to FIG. 18. The signal control unit 350 is configured of a conversion unit 171, a signal processing unit 360 and an inverse conversion unit 173. Upon making a comparison with the first embodiment, while the signal control unit 151 is configured of the signal processing unit 172, the signal control unit 151 is configured of a signal processing unit 360 in this embodiment. The signal control unit 350 receives the analysis information and the signal control information, and outputs the output signal. The signal control unit 350 manipulates the decoded signal received from the decoding unit 150 for each component element corresponding to each sound source, based upon the signal control information and the analysis information. Further, the signal control unit 350 also can manipulate the decoded signal with the component element group, which is configured of a plurality of the component elements, defined as a unit instead of the component element corresponding to each sound source. The signal processing unit 360 receives the second converted signal coming from the conversion unit 171 and the signal control information. The signal processing unit 360 controls the component element of the frequency component of the second converted signal based upon the analysis information and the signal control information, and generates the modified decoded signal. The signal processing unit 360 outputs the modified decoded signal to the inverse conversion unit 173.

In addition, specifically, the signal processing unit 360 derives a by-frequency analysis parameter based upon the analysis information. And, the signal processing unit 360 decomposes the second converted signal into the component elements corresponding to the sound resources based upon the analysis parameter. In addition, the signal processing unit 360 prepares the modified decoded signal in which a relation between of a plurality of the component elements has been changed, responding to the by-frequency analysis parameter based upon the signal control information. The signal processing unit 360 outputs the modified decoded signal to the inverse conversion unit 173. Further, the signal processing unit 360 may decompose the second converted signal based upon the analysis parameter for each component element groups that is configured of a plurality of the component elements.

Continuously, the method of preparing the modified decoded signal will be specifically explained.

Upon defining the frequency component of the decoded signal (namely, the second converted signal) in a certain frequency band f as $X_k(f)$, k=1, 2, ..., P (P is the number of the channels of the decoded signal), the frequency component of the component element as $Y_j(f)$, j=1, 2, ..., M (M is the number of the component elements), the frequency component of the component element modified based upon the signal control information as $Y'_j(f)$, and the modified decoded signal as $X'_k(f)$, the following relation holds by employing a conversion function $F_{501}$ being specified with the analysis parameter, and a conversion function $F_{502}$ being specified with the signal control information.

$Y_j(f) = F_{501}(X_1(f), X_2(f), \ldots, X_P(f))$  [Numerical equation 9]

$Y'_j(f) = F_{502}(Y_j(f))$  [Numerical equation 10]

$X'_k(f) = F_{503}(Y'_j(f))$  [Numerical equation 11]

Where, the conversion function $F_{503}$ is a function for converting the modified component element into the modified decoded signal.

Further, integration of the conversion functions $F_{500}$, $F_{501}$, $F_{502}$, and $F_{503}$ can lead to the following equation.

$X'(f) = F_{504}(X(f))$  [Numerical equation 12]

At this time, the conversion function $F_{504}$ is specified with the analysis parameter and the signal control information.

As a specific example of the above-mentioned conversion function, upon expressing an analysis parameter B(f) of the frequency band f by the following equation 13, and a by-frequency parameter A(f), which is governed responding to the signal control information, by the following equation 14, [Numerical equation 9] to [Numerical equation 12] can be expressed by the following [Numerical equation 15].

$$B(f) = \begin{bmatrix} C_{11}(f) & C_{12}(f) & \ldots & C_{1P}(f) \\ C_{21}(f) & C_{22}(f) & \ldots & C_{2P}(f) \\ \vdots & \vdots & \ddots & \vdots \\ C_{M1}(f) & C_{M2}(f) & \ldots & C_{MP}(f) \end{bmatrix}$$ [Numerical equation 13]

$$A(f) = \begin{bmatrix} A_1(f) & 0 & \ldots & 0 \\ 0 & A_2(f) & \ldots & 0 \\ \vdots & \vdots & \ddots & \vdots \\ 0 & 0 & \ldots & A_M(f) \end{bmatrix}$$ [Numerical equation 14]

$$X(f) = \begin{bmatrix} X_1(f) \\ X_2(f) \\ \vdots \\ X_P(f) \end{bmatrix}$$ [Numerical equation 15]

$Y(f) = B(f) \cdot X(f),$ $Y'(f) = A(f) \cdot Y(f)$ $\quad = A(f) \cdot B(f) \cdot X(f),$ $X'(f) = D(f) \cdot Y'(f)$ $\quad = D(f) \cdot A(f) \cdot B(f) \cdot X(f)$ That is, a matrix for converting the decoded signal into the modified decoded signal can be calculated as D(f)×A(f)×B(f). Where, D(f) is an arbitrary P-row and M-column matrix, and for example, an inverse matrix of B(f) can be employed as D(f). Additionally, as apparent from [Numerical equation 15], it is appropriate as a manipulation of converting the modified component element into the modified decoded signal to employ the inverse matrix of B(f) as D(f).

A configuration may be made so that the signal control information is inputted from the outside by a user. For example, as signal control information being inputted from the outside, there exists personal information such as a taste of the user pre-registered into the receiving unit, an operational status of the receiving unit (including external environment information such as a switched-off loudspeaker), a format or a kind of the receiving unit, a use status of a power source and a cell or its residual quantity, and a kind and a status of an antenna (a shape of being folded in, its direction, etc.). Further, a configuration may be made so that the signal control information is automatically captured in the other formats. A configuration may be made so that the signal control information is automatically captured via a sensor installed inside or near to the receiving unit. For example, as signal control information being automatically captured, there exists a quantity of the external noise, brightness, a time band, a geometric position, a temperature, information synchronous with video, barcode information captured through a camera, and so on.

The third embodiment of the present invention makes it possible to control a specific sound source independently based upon the signal control information received by the receiving unit. Further, the transmission unit can analyze the signal, and the receiving unit can control the input signal, which is configured of a plurality of the sound sources, for each component element corresponding to each sound source. In addition, the arithmetic quantity relating to the signal analysis by the receiving unit can be curtailed because the transmission unit analyzes the signal.

The fourth embodiment of the present invention is for controlling the input signal, which is configured of the objective sound and the background sound, based upon the signal control information being inputted into the receiving unit in such a manner that the objective sound and the background sound are controlled independently from each other. This embodiment will be explained in details by making a reference to FIG. 17. Upon comparing this embodiment with the second embodiment, while the receiving unit 15 shown in FIG. 1 is configured of the signal control unit 151, the receiving unit 35 shown in FIG. 17 is configured of a signal control unit 350. Further, in this embodiment, the signal control information is inputted into the signal control unit 350. Signal control information is similar to the signal control information employed in the third embodiment, so its explanation is omitted. In addition, a configuration of the signal control unit 350 will be explained in details by making a reference to FIG. 18. The signal control unit 350 is configured of a conversion unit 171, a signal processing unit 360, and an inverse conversion unit 173. Upon making a comparison with the second embodiment, while signal control unit 151 shown in FIG. 5 is configured of the signal processing unit 172, the signal control unit 350 is configured of the signal processing unit 360 in this embodiment.

Continuously, a first example will be explained. In the first example, the suppression coefficient is employed as analysis information.

Figure 19:
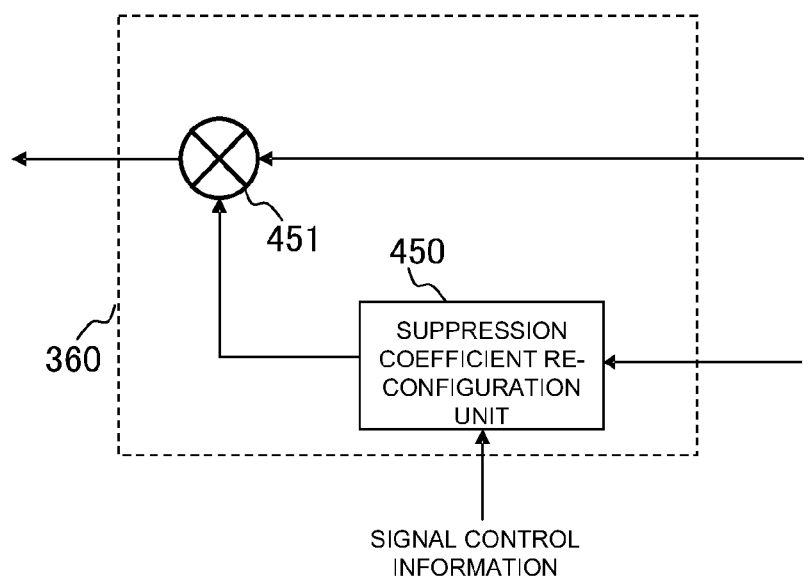
FIG. 19 shows a configuration example of a signal processing unit 360.

A configuration example of the signal processing unit 360 will be explained in details by making a reference to FIG. 19. Upon making a comparison with the second embodiment, while the signal processing unit 172 shown in FIG. 8 is configured of the suppression coefficient re-configuration unit 250, the signal processing unit 360 is configured of a suppression coefficient re-configuration unit 450. The suppression coefficient re-configuration unit 450 receives the signal control information from the outside. The above signal control information is similar to the signal control information employed in the third embodiment, so its explanation is omitted.

The signal processing unit 360 receives the second converted signal, the analysis information, and the signal control information, and outputs the modified decoded signal. The signal processing unit 360 is configured of a suppression coefficient re-configuration unit 450 and a multiplier 451. The second converted signal is inputted into the multiplier 451, and the analysis information and the signal control information are inputted into the suppression coefficient re-configuration unit 450. The suppression coefficient re-configuration unit 450 generates the modified suppression coefficient by employing the inputted analysis information and signal control information. The modified suppression coefficient is one obtained by modifying the suppression coefficient received as analysis information by employing the signal control information. The suppression coefficient re-configuration unit 450 outputs the modified suppression coefficient to the multiplier 451. The multiplier 451 multiplies the second converted signal by the modified suppression coefficient, and generates the modified decoded signal. The multiplier 451 outputs the modified decoded signal to the inverse conversion unit 173.

Figure 20:
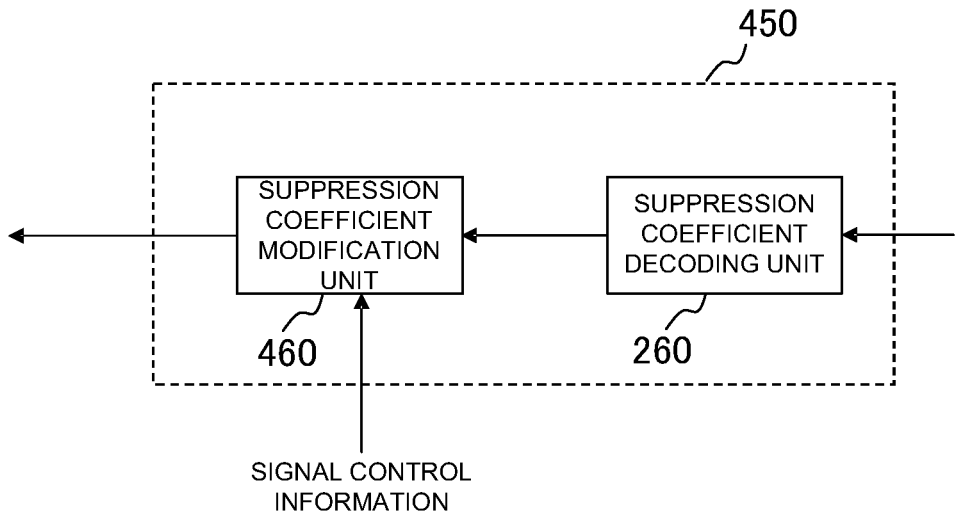
FIG. 20 shows a configuration example of a suppression coefficient re-configuration unit 450.

A configuration of the suppression coefficient re-configuration unit 450 of the first example will be explained in details by making a reference to FIG. 20. The suppression coefficient re-configuration unit 450 includes a suppression coefficient modification unit 460.

Figure 9:
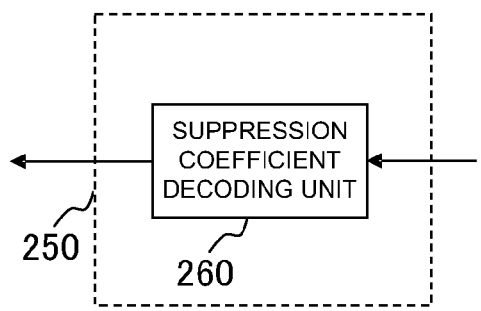
FIG. 9 shows a configuration example of a suppression coefficient re-configuration unit 250.

The suppression coefficient re-configuration unit 250 of the second embodiment shown in FIG. 9 does not include the suppression coefficient modification unit 460. The suppression coefficient modification unit 460 modifies the suppression coefficient by employing the signal control information inputted from the outside. This signal control information is similar to the signal control information already employed in the third embodiment, so its explanation is omitted.

The suppression coefficient re-configuration unit 450 receives the encoded suppression coefficient as analysis information, and the signal control information, and outputs the modified suppression coefficient. The suppression coefficient re-configuration unit 450 is configured of a suppression coefficient decoding unit 260 and a suppression coefficient modification unit 460. The suppression coefficient decoding unit 260 decodes the received suppression coefficient. The suppression coefficient decoding unit 260 outputs the suppression coefficient to the suppression coefficient modification unit 460 without performing the decoding operation when the suppression coefficient has not been encoded. The suppression coefficient modification unit 460 modifies the inputted suppression coefficient by employing the signal control information inputted from the outside. The suppression coefficient modification unit 460 outputs the modified suppression coefficient.

Figure 21:
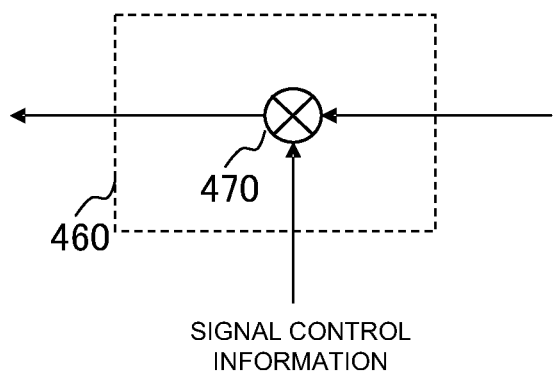
FIG. 21 shows a configuration example of a suppression coefficient modification unit 460.

A first configuration example of the suppression coefficient modification unit 460 will be explained in details by making a reference to FIG. 21. The suppression coefficient modification unit 460 receives the suppression coefficient and the signal control information, and outputs the modified suppression coefficient. The suppression coefficient modification unit 460 of this configuration example is configured of a multiplier 470. The multiplier 470 calculates a product of the suppression coefficient and the signal control information, and outputs the modified suppression coefficient. In this configuration example, a magnification for the suppression coefficient is inputted as the signal control information. Such a configuration makes it possible to control the suppression coefficient with the simple signal control information.

Figure 22:
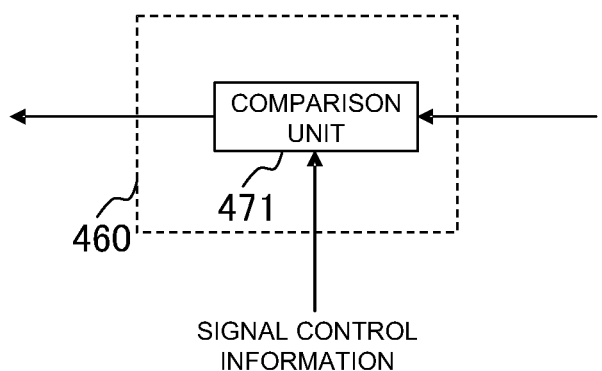
FIG. 22 shows a second configuration example of a suppression coefficient modification unit 460.

A second configuration example of the suppression coefficient modification unit 460 will be explained in details by making a reference to FIG. 22. The suppression coefficient modification unit 460 receives the suppression coefficient and the signal control information, and outputs the modified suppression coefficient. The suppression coefficient modification unit 460 of this configuration example is configured of a comparison unit 471. The comparison unit 471 compares the suppression coefficient with the signal control information, and outputs the signal responding to its comparison result. For example, the comparison unit 471 outputs the suppression coefficient or the signal control information, which is larger, when making a maximum comparison. Further, the comparison unit 471 may make a minimum comparison. In these cases, the maximum value or the minimum value of the suppression coefficient is inputted as the signal control information. Such a configuration makes it possible to pre-specify a range of the output signal, and to avoid a decline in the sound quality due to the output of the unexpected signal.

Figure 23:
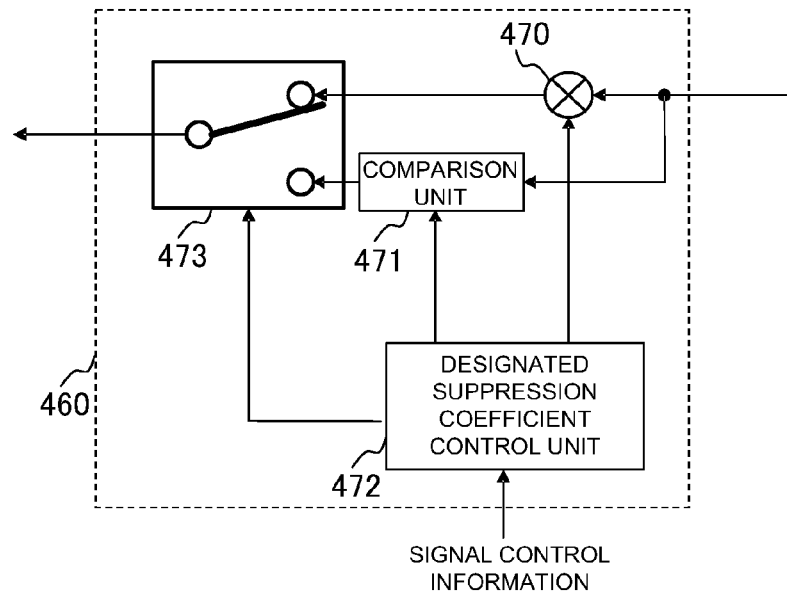
FIG. 23 shows a third configuration example of a suppression coefficient modification unit 460.

A third configuration example of the suppression coefficient modification unit 460 will be explained in details by making a reference to FIG. 23. The third configuration example of the suppression coefficient modification unit 460 is one obtained by combining the foregoing first configuration example and second configuration example. The suppression coefficient modification unit 460 receives the suppression coefficient and the signal control information, and outputs the modified suppression coefficient. The suppression coefficient modification unit 460 of this configuration example is configured of a multiplier 470, a comparison unit 471, a designated suppression coefficient control unit 472, and a switch 473. The designated suppression coefficient control unit 472 outputs the signal control information to the multiplier 470, the comparison unit 471, or the switch 473. Herein, the signal control information includes at least a magnification of the suppression coefficient being used in the multiplier 470 and the maximum value or the minimum value of the suppression coefficient being used in the comparison unit 471. In addition, the signal control information may include the control information for selection being made by the switch 473. The designated suppression coefficient control unit 472 outputs a magnification of the suppression coefficient to the multiplier 470 when receiving a magnification of the suppression coefficient as signal control information. The multiplier 470 calculates a product of the suppression coefficient and a magnification of the suppression coefficient, and outputs the modified suppression coefficient to the switch 473. The designated suppression coefficient control unit 472 outputs the maximum value or the minimum value of the suppression coefficient to the comparison unit 471 when receiving the maximum value or the minimum value of the suppression coefficient as signal control information. The comparison unit 471 compares the suppression coefficient with the maximum value or the minimum value of the suppression coefficient, and outputs the signal responding to its comparison result as a modified suppression coefficient to the switch 473. The designated suppression coefficient control unit 472 outputs the control information to the switch 473 when receiving the control information for the selection. When the control information is inputted from the designated suppression coefficient control unit 472, the switch 473 selects and outputs one of an output of the multiplier 470 and an output of the comparison unit 471 responding to the above signal control information.

Next, a second example will be explained. In the second example, the signal versus background sound ratio, being a configuration ratio of the objective sound and the background sound, is employed as analysis information. The signal processing unit 360 of the second example, which is similar to the signal processing unit of the first example shown in FIG. 19, differs in a configuration of a suppression coefficient re-configuration unit 450.

Figure 24:
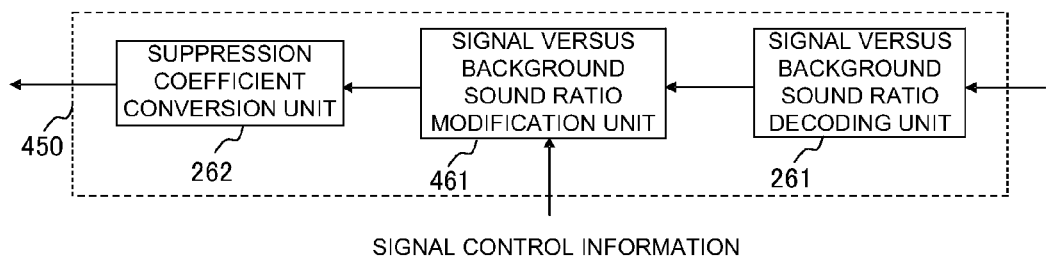
FIG. 24 shows a second configuration example of the suppression coefficient re-configuration unit 450.

A configuration example of the suppression coefficient re-configuration unit 450 of the second example will be explained in details by making a reference to FIG. 24. Upon making a comparison with the suppression coefficient re-configuration unit 250 of the second embodiment shown in FIG. 11, the suppression coefficient re-configuration unit 450 of this configuration example further includes a signal versus background sound ratio modification unit 461.

The suppression coefficient re-configuration unit 450 receives the encoded signal versus background sound ratio and the signal control information, and outputs the modified suppression coefficient. The suppression coefficient re-configuration unit 450 is configured of a signal versus background sound ratio decoding unit 261, the signal versus background sound ratio modification unit 461, and a suppression coefficient conversion unit 262. The signal versus background sound ratio decoding unit 261 decodes the received signal versus background sound ratio, which has been encoded, and outputs the signal versus background sound ratio to the signal versus background sound ratio modification unit 461. The signal versus background sound ratio decoding unit 261 outputs the signal versus background sound ratio without performing the decoding operation when the signal versus background sound ratio has not been encoded. The signal versus background sound ratio modification unit 461 modifies the inputted signal versus background sound ratio by employing the signal control information received from the outside, and generates the modified signal versus background sound ratio. A modification method similar to that of the suppression coefficient modification unit 460 in the first example may be applied for modifying the signal versus background sound ratio. That is, the signal versus background sound ratio may be modified by inputting a magnification of the signal versus background sound ratio as signal control information. Further, the signal versus background sound ratio may be modified by inputting the maximum value or the minimum value of the signal versus background sound ratio as signal control information. In addition, the signal versus background sound ratio may be modified by inputting the signal control information for selecting one of the signal versus background sound ratio modified with a magnification of the signal versus background sound ratio and the signal versus background sound ratio modified with the maximum value or the minimum value of the signal versus background sound ratio as signal control information. The signal versus background sound ratio modification unit 461 outputs the modified signal versus background sound ratio to the suppression coefficient conversion unit 262. The suppression coefficient conversion unit 262 converts the modified signal versus background sound ratio into the suppression coefficient, and outputs the modified suppression coefficient. As a method of converting the signal versus background sound ratio into the suppression coefficient, a conversion method similar to that of the suppression coefficient conversion unit 262 shown in FIG. 11 may be employed. In the second example, after the signal versus background sound ratio is modified with the signal control information, it is converted into the modified signal versus background sound ratio suppression coefficient. The above signal control information is similar to the signal control information employed in the third embodiment, so its explanation is omitted.

In addition, a third example will be explained. Upon making a comparison with the foregoing second example, the third example assumes a configuration in which after the signal versus background sound ratio is converted into the suppression coefficient, the suppression coefficient is modified with the signal control information.

Figure 25:
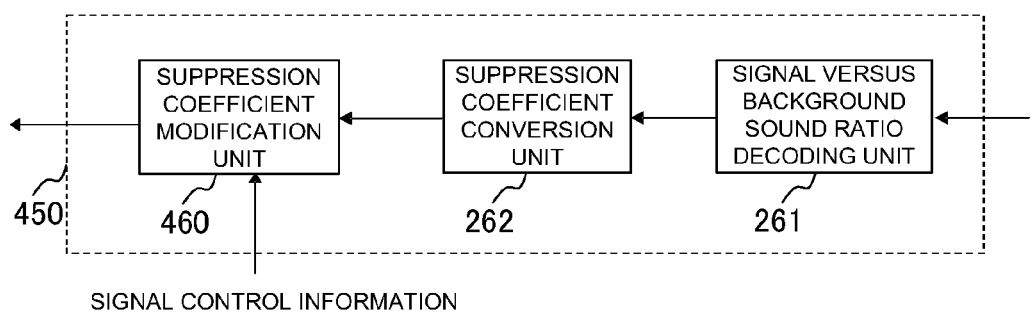
FIG. 25 shows a third configuration example of the suppression coefficient re-configuration unit 450.

The suppression coefficient re-configuration unit 450 of the third example will be explained in details by making a reference to FIG. 25. Upon making a comparison with the suppression coefficient re-configuration unit 250 of the second embodiment shown in FIG. 11, the suppression coefficient re-configuration unit 450 of this example further includes a suppression coefficient modification unit 460.

The suppression coefficient re-configuration unit 450 receives the encoded signal versus background sound ratio and the signal control information, and outputs the modified suppression coefficient. The suppression coefficient re-configuration unit 450 is configured of a signal versus background sound ratio decoding unit 261, a suppression coefficient conversion unit 262, and a suppression coefficient modification unit 460. The signal versus background sound ratio decoding unit 261 receives and decodes the encoded signal versus background sound ratio. The signal versus background sound ratio decoding unit 261 outputs the signal versus background sound ratio to the suppression coefficient conversion unit 262. The suppression coefficient conversion unit 262 converts the decoded signal versus background sound ratio into the suppression coefficient. The suppression coefficient conversion unit 262 outputs the suppression coefficient to the suppression coefficient modification unit 460. The suppression coefficient modification unit 460 modifies the suppression coefficient inputted from the suppression coefficient conversion unit 262 by employing the signal control information received from the outside. The suppression coefficient modification unit 460 outputs the modified suppression coefficient. The above signal control information is similar to the signal control information employed in the third embodiment, so its explanation is omitted. A configuration of the suppression coefficient modification unit 460 is similar to the suppression coefficient modification unit 460 of the first example shown in FIG. 20, so its explanation is omitted.

Figure 26:
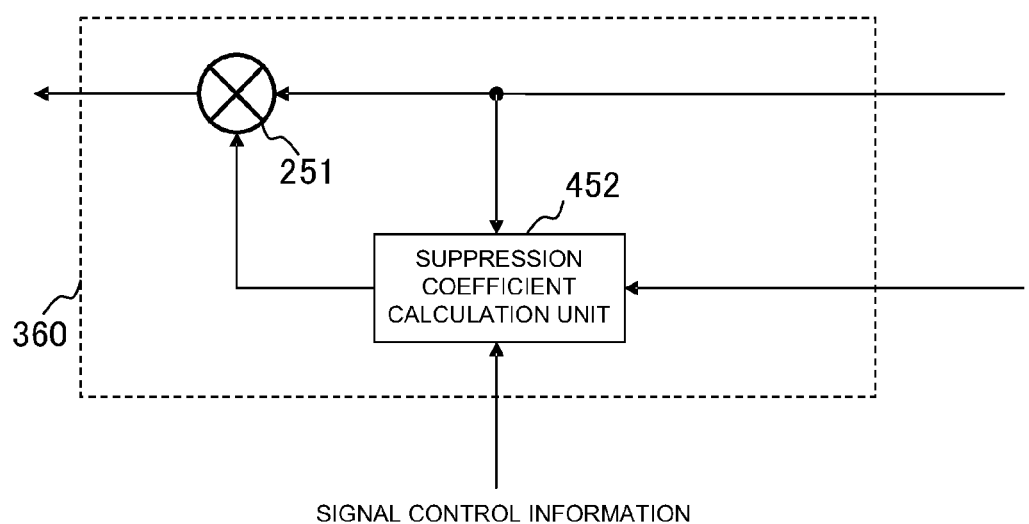
FIG. 26 shows a second configuration example of the signal processing unit 360.

Continuously, a fourth example will be explained. The fourth example is a configuration example of the case of employing the background sound itself as analysis information. A first configuration example of the signal processing unit 360 of the fourth example will be explained in details by making a reference to FIG. 26. While the signal processing unit 172 of the second example shown in FIG. 14 is configured of the suppression coefficient calculation unit 252, the signal processing unit 360 of this example is configured of a suppression coefficient calculation unit 452. The suppression coefficient calculation unit 452 receives the signal control information from the outside.

The signal processing unit 360 receives the second converted signal, the encoded background sound, and the signal control information, and outputs the modified decoded signal. The signal processing unit 360 is configured of the suppression coefficient calculation unit 452 and a multiplier 251. The second converted signal is inputted into the suppression coefficient calculation unit 452 and the multiplier 251, and the encoded background sound is inputted as analysis information into the suppression coefficient calculation unit 452. The suppression coefficient calculation unit 452 calculates the modified suppression coefficient based upon the encoded background sound, the second converted signal, and the signal control information. And, the suppression coefficient calculation unit 452 outputs the modified suppression coefficient to the multiplier 251. The multiplier 251 multiplies the second converted signal by the suppression coefficient, and outputs the modified decoded signal to the inverse conversion unit 173. The above signal control information is similar to the signal control information employed in the third embodiment, so its explanation is omitted.

Figure 27:
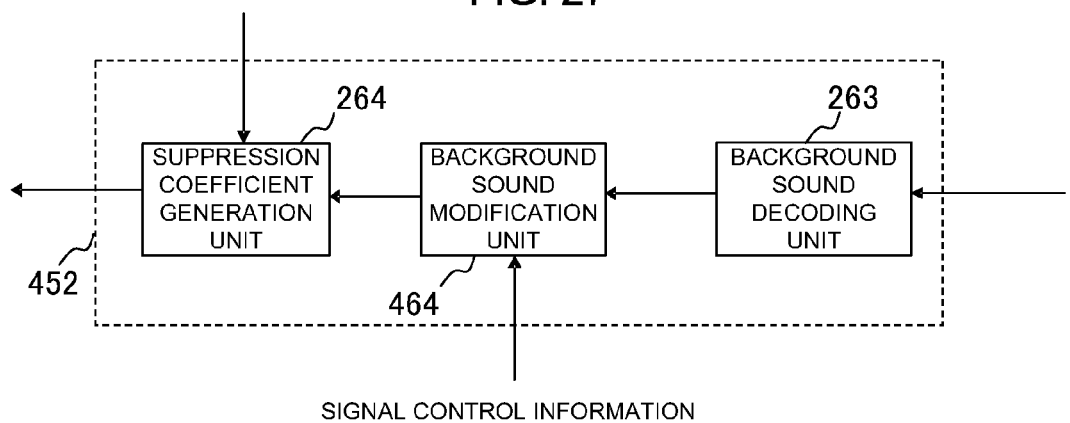
FIG. 27 shows a configuration example of a suppression coefficient calculation unit 452.

A configuration example of the suppression coefficient calculation unit 452 will be explained in details by making a reference to FIG. 27. The suppression coefficient calculation unit 452 receives the second converted signal, the encoded background sound, and the signal control information, and outputs the suppression coefficient. The suppression coefficient calculation unit 452 is configured of a background sound decoding unit 263, a background sound modification unit 464, and a suppression coefficient generation unit 264.

The background sound decoding unit 263 receives and decodes the encoded background sound. The background sound decoding unit 263 outputs the decoded background sound to the background sound modification unit 464. The background sound decoding unit 263 outputs the background sound to the background sound modification unit 464 without performing the decoding operation when the background sound has not been encoded. The background sound modification unit 464 modifies the background sound by employing the signal control information inputted from the outside. A modification method similar to that of the suppression coefficient modification unit 460 in the first example may be applied for modifying the background sound. That is, the background sound may be modified by inputting a magnification of the background sound as signal control information. Further, the background sound may be modified by inputting the maximum value or the minimum value of the background sound as signal control information. In addition, the background sound may be modified by inputting the signal control information for selecting one of the background sound modified with a magnification of the background sound and the background sound modified with the maximum value or the minimum value of the background sound as signal control information. The background sound modification unit 464 outputs the modified background sound to the suppression coefficient generation unit 264. The suppression coefficient generation unit 264 calculates an appropriate suppression coefficient for suppressing the background sound by employing the second converted signal and the modified background sound. As a method of calculating this suppression coefficient, a calculation method similar to that of the suppression coefficient calculation unit 201 shown in FIG. 10 may be employed. The suppression coefficient generation unit 264 outputs the suppression coefficient. The above signal control information is similar to the signal control information employed in the third embodiment, so its explanation is omitted.

Figure 28:
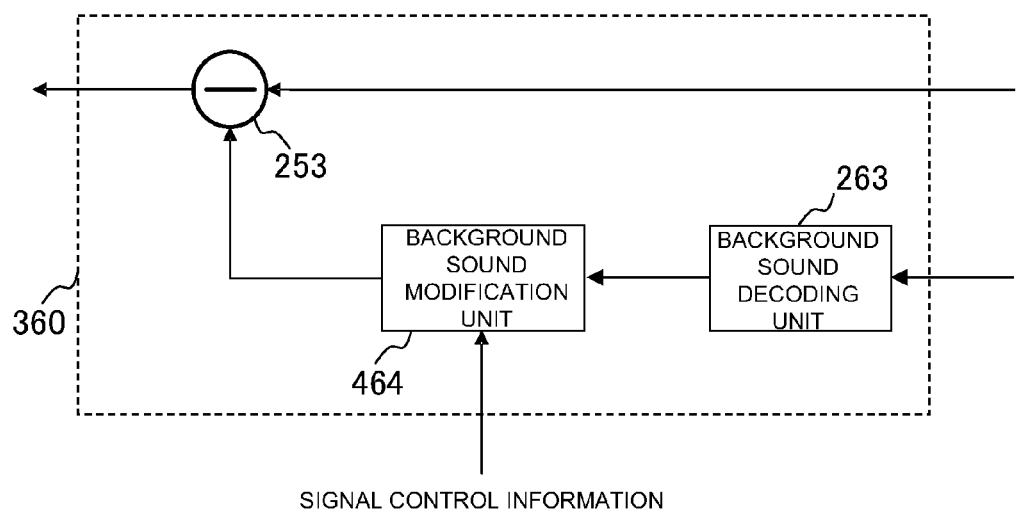
FIG. 28 shows a third configuration example of the signal processing unit 360.

A second configuration example of the signal processing unit 360 will be explained in details by making a reference to FIG. 28. The signal processing unit 360 of this configuration example is configured of a background sound decoding unit 263, a background sound modification unit 464, and a subtracter 253. The signal processing unit 360 receives the second converted signal, the encoded background sound, and the signal control information, and outputs the signal of which the background sound has been controlled.

The second converted signal is inputted into the subtracter 253. Further, the encoded background sound is inputted into the background sound decoding unit 263 as analysis information. The background sound decoding unit 263 decodes the encoded background sound that has been inputted. And, the background sound decoding unit 263 outputs the decoded background sound to the background sound modification unit 464. The background sound decoding unit 263 outputs the background sound without performing the decoding operation therefor when the background sound has not been encoded. The background sound modification unit 464 modifies the background sound information by employing the signal control information, and generates the modified background sound. The background sound modification unit 464 outputs the modified background sound to the subtracter 253. The subtracter 253 subtracts the modified background sound from the second converted signal, and outputs a subtraction result.

Next, a fifth example will be explained. Upon making a comparison with the fourth example, this example assumes a configuration in which after the suppression coefficient is generated from the decoded background sound, the suppression coefficient is modified with the signal control information.

Figure 29:
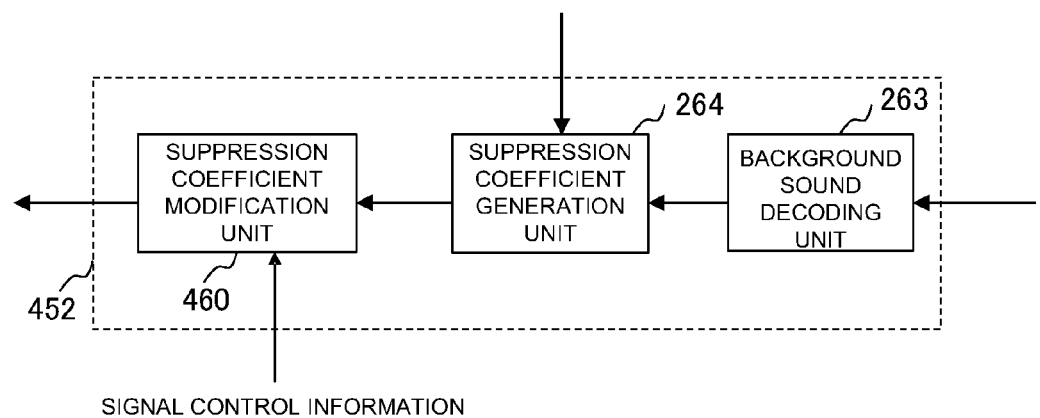
FIG. 29 shows a second configuration example of the suppression coefficient calculation unit 452.

The suppression coefficient calculation unit 452 will be explained in details by making a reference to FIG. 29. The suppression coefficient calculation unit 452 receives the second converted signal, the encoded background sound, and the signal control information, and outputs the modified suppression coefficient. The suppression coefficient calculation unit 452 is configured of a background sound decoding unit 263, a suppression coefficient generation unit 264, and a suppression coefficient modification unit 460.

The background sound decoding unit 263 receives and decodes the encoded background sound. And, the background sound decoding unit 263 outputs the decoded background sound to the suppression coefficient generation unit 264. The suppression coefficient generation unit 264 generates the suppression coefficient from the second converted signal and the decoded background sound. As a calculation of this suppression coefficient, a calculation method similar to that of the suppression coefficient calculation unit 201 shown in FIG. 10 may be employed. And, the suppression coefficient generation unit 264 outputs the suppression coefficient to the suppression coefficient modification unit 460. The suppression coefficient modification unit 460 modifies the suppression coefficient by employing the received signal control information, and generates the modified suppression coefficient. A modification method similar to that of the suppression coefficient modification unit 460 shown in FIG. 23 may be applied for modifying the suppression coefficient. That is, the suppression coefficient may be modified by inputting a magnification of the suppression coefficient as signal control information. Further, the suppression coefficient may be modified by inputting the maximum value or the minimum value of the suppression coefficient as signal control information. In addition, the suppression coefficient may be modified by inputting the signal control information for selecting a magnification of the suppression coefficient, or the maximum value or the minimum value of the suppression coefficient as signal control information. The suppression coefficient modification unit 460 outputs the modified suppression coefficient. The above signal control information is similar to the signal control information employed in the third embodiment, so its explanation is omitted.

As explained above, the fourth embodiment of the present invention makes it possible to curtail the arithmetic quantity of the receiving unit for controlling only the signal, and to control the input signal, which is configured of the objective sound and the background sound, because the transmission unit (or the recording unit) analyzes the signal. Further, this embodiment makes it possible to independently control only a specific sound source by employing the signal control information received by the receiving unit.

A fifth embodiment of the present invention will be explained by making a reference to FIG. 30. Upon comparing FIG. 30 with FIG. 17 indicative of the third embodiment, the former differs from the latter in a point that the receiving unit 35 is replaced with a receiving unit 55. The receiving unit 55, into which the transmission signal, the signal control information, and the component element rendering information are inputted, outputs the output signal that is configured of a plurality of the channels. Upon making a comparison with the third embodiment, the fifth embodiment differs in a point of having the component element rendering information as well as an input, and a point that the output signal is a signal that is configured of a plurality of the channels.

The so-called component element rendering information is information indicating a relation between the component element being included in the decoded signal and the output signal of the receiving unit 55 for each frequency component. For example, it indicates constant position information of each of the component elements being mixed in the decoded signal. It may include information for manipulating localization feeling, for example, by shading-off the sound image.

Utilizing the component element rendering information makes it possible to control the signal outputted to each channel for each component element. Each component element may be output from a specific one channel (for example, a loudspeaker) in some cases, and may be distributed and outputted to a plurality of the channels in some cases.

Figure 17:
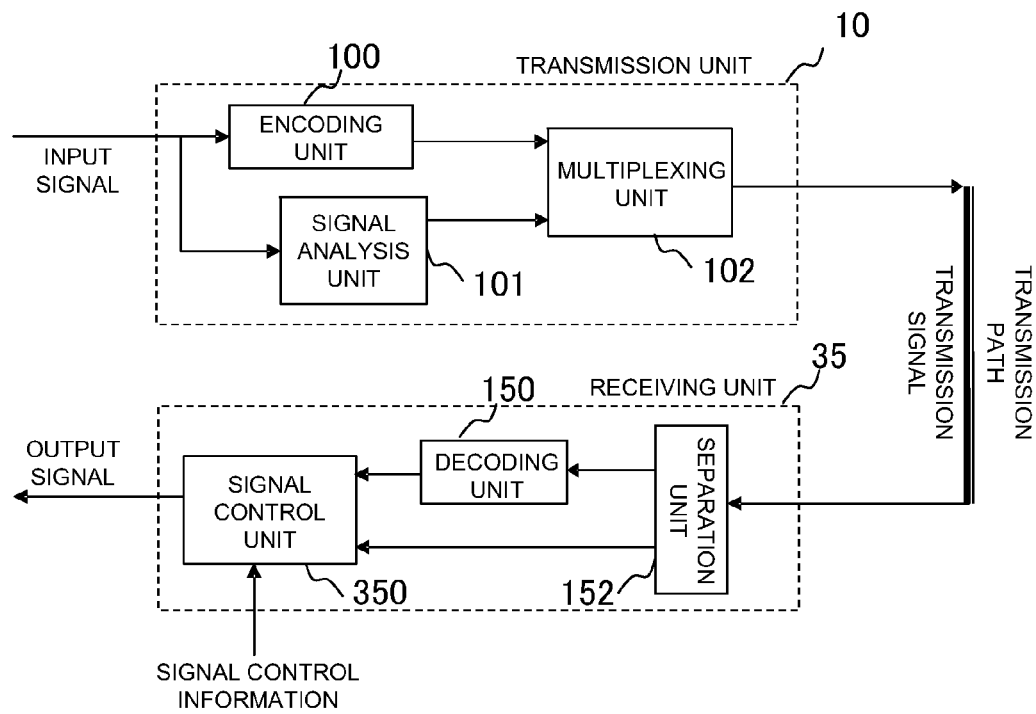
FIG. 17 is a block diagram illustrating a third embodiment of the present invention.

Upon making a comparison with the receiving unit 35 of FIG. 17 explained in the third embodiment, the receiving unit 55 differs in a point that the signal control unit 350 is replaced with an output signal generation unit 550. The component element rendering information as well besides the decoded signal, the analysis information, and the signal control information is inputted into the output signal generation unit 550.

Hereinafter, a configuration example of the output signal generation unit 550, which is characteristic of this embodiment, will be explained. A first configuration example is shown in FIG. 31, a second configuration example in FIG. 32, and a third configuration example in FIG. 33.

Figure 31:
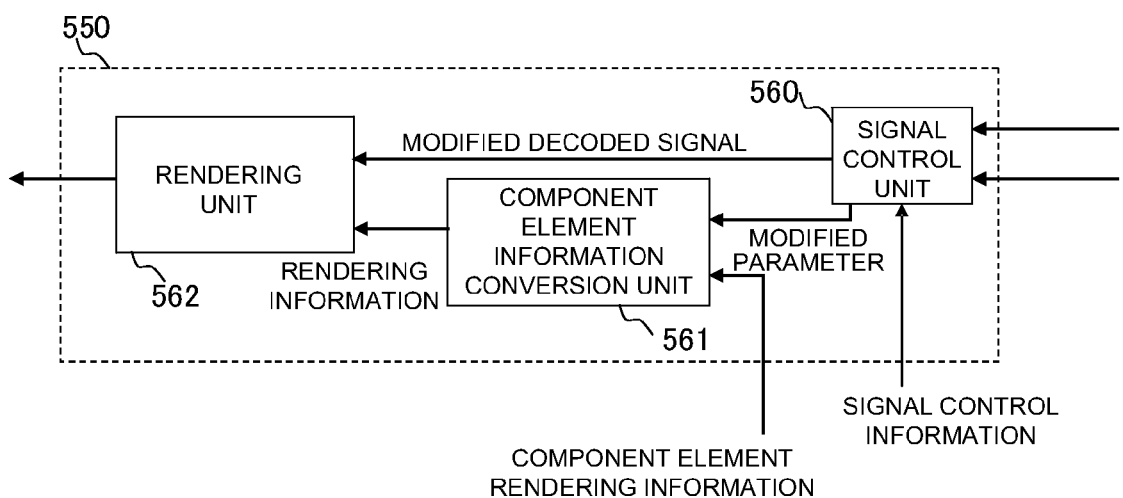
FIG. 31 shows a configuration example of an output signal generation unit 550.

Upon making a reference to FIG. 31, the output signal generation unit 550 in the first configuration example is configured of a signal control unit 560, a component element information conversion unit 561, and a rendering unit 562. This configuration example is characterized in that the modified decoded signal being inputted into the rendering unit 562 is a signal pre-manipulated for each component element based upon the signal control information.

The signal control unit 560 has the decoded signal and the analysis information as an input. At first, the signal control unit 560 decodes the analysis information, and generates the analysis parameter corresponding to each frequency component. Next, the signal control unit 560 decomposes the decoded signal into the respective component elements based upon the analysis parameter. In addition, the signal control unit 560 manipulates each component element by employing the signal control information, generates the modified component element, re-configures the generated modified component element, and outputs the re-configured signal to the rendering unit 562 as a modified decoded signal. Further, the signal control unit 560 generates a modified parameter indicating a relation between the modified decoded signal and the modified component element for each frequency component, and outputs it to the component element information conversion unit 561 as well. Herein, the decoded signal is one that is configured of general plural sound sources.

Additionally, the signal control unit 560 may convert the decoded signal into the modified decoded signal by employing the analysis parameter and the signal control information without generating the modified component element as another operation example. In this case, the signal control unit 560 outputs the modified parameter used at the moment of converting the decoded signal into the modified decoded signal to the component element information conversion unit 561.

Hereinafter, a specific example of an operation of the signal control unit 560 will be explained.

Upon defining the frequency component of the decoded signal in a certain frequency band f as $X_k(f)$, k=1, 2, ..., P (P is the number of the channels of the decoded signal), the frequency component of the component element as $Y_j(f)$, j=1, 2, ..., M (M is the number of the component elements), the frequency component of the component element modified based upon the signal control information as $Y'_j(f)$, and the modified decoded signal as $X'(f)$, the following relation holds by employing a conversion function $F_{501}$ being specified with the analysis parameter, and a conversion function $F_{502}$ being specified with the signal control information.

$$Y_j(f)=F_{501}(X_1(f),X_2(f),\ldots,X_P(f))\qquad\text{[Numerical equation 9]}$$

$$Y'_j(f)=F_{502}(Y_j(f))\qquad\text{[Numerical equation 10]}$$

$$X'(f)=F_{503}(Y'_j(f))\qquad\text{[Numerical equation 11]}$$

Where, the conversion function $F_{503}$ is a function for converting the modified component element into the modified decoded signal, and the modified parameter becomes a parameter indicative of the inverse function of the conversion function $F_{503}$.

As mentioned as another operation example, by integrating the conversion functions $F_{500}$, $F_{501}$, $F_{502}$, and $F_{503}$, the following equation may be yielded.

$$X'(f)=F_{504}(X(f))\qquad\text{[Numerical equation 12]}$$

At this time, the conversion function $F_{504}$ is specified with the analysis parameter, the signal control information, and the modified parameter.

As a specific example of the above-mentioned conversion, upon expressing an analysis parameter B(f) of the frequency band f as the following equation 13, and a signal control information A(f) as the following equation 14, [Numerical equation 9] to [Numerical equation 12] can be expressed by the following [Numerical equation 15].

$$B(f)=\begin{bmatrix}C_{11}(f) & C_{12}(f) & \ldots & C_{1P}(f)\\ C_{21}(f) & C_{22}(f) & \ldots & C_{2P}(f)\\ \vdots & \vdots & \ddots & \vdots\\ C_{M1}(f) & C_{M2}(f) & \ldots & C_{MP}(f)\end{bmatrix}\qquad\text{[Numerical equation 13]}$$

$$A(f)=\begin{bmatrix}A_1(f) & 0 & \ldots & 0\\ 0 & A_2(f) & \ldots & 0\\ \vdots & \vdots & \ddots & \vdots\\ 0 & 0 & \ldots & A_M(f)\end{bmatrix}\qquad\text{[Numerical equation 14]}$$

$$X(f)=\begin{bmatrix}X_1(f)\\ X_2(f)\\ \vdots\\ X_P(f)\end{bmatrix}\qquad\text{[Numerical equation 15]}$$

That is, a matrix for converting the decoded signal into the modified decoded signal can be calculated as D(f)×A(f)×B(f). Herein, D(f) is an arbitrary P-row and M-column matrix, and upon defining the modified parameter as E(f), the following equation is yielded.

$$E(f)=D^{-1}(f)\qquad\text{[Numerical equation 16]}$$

For example, when the inverse matrix of B(f) is employed as D(f), the modified parameter behaves like E(f)=B(f). Additionally, as apparent from [Numerical equation 15], it is appropriate as a manipulation of converting the modified component element into the modified decoded signal to employ the inverse matrix of B(f) as D(f).

The component element information conversion unit 561 converts the component element rendering information supplied via an input terminal into rendering information by employing the modified parameter outputted from the signal control unit 560, and outputs the rendering information to the rendering unit 562.

As a specific example of converting the component element rendering information into the rendering information, upon expressing the component element rendering information U(f) and the rendering information W(f) as the following equations, respectively, W(f)=U(f)×E(f) can be yielded.

$$U(f)=\begin{bmatrix}U_{11}(f) & U_{12}(f) & \ldots & U_{1M}(f)\\ U_{21}(f) & U_{22}(f) & \ldots & U_{2M}(f)\\ \vdots & \vdots & \ddots & \vdots\\ U_{Q1}(f) & U_{Q2}(f) & \ldots & U_{QM}(f)\end{bmatrix},\qquad\text{[Numerical equation 17]}$$

$$W(f)=\begin{bmatrix}W_{11}(f) & W_{12}(f) & \ldots & W_{1P}(f)\\ W_{21}(f) & W_{22}(f) & \ldots & W_{2P}(f)\\ \vdots & \vdots & \ddots & \vdots\\ W_{Q1}(f) & W_{Q2}(f) & \ldots & W_{QP}(f)\end{bmatrix}$$

Where, Q is the number of the channels of the output signal.

Additionally, the rendering information, which is information indicating a relation between the modified decoded signal and the output signal of the output signal generation unit 550 for each frequency component, can be expressed by employing an energy differences, a time difference, a correlation between the signals, etc. As one example of the rendering information, the information disclosed in Non-patent document 10 (ISO/IEC 23003-1: 2007 Part 1 MPEG Surround) is known.

The rendering unit 562 converts the modified decoded signal outputted from the signal control unit 560 and generates the output signal by employing the rendering information outputted from the component element information conversion unit 561, and outputs it as an output signal of the output signal generation unit 550.

As a method of the conversion, the method disclosed in the Non-patent document 10 is known. When a MPEG Surround decoder disclosed in the Non-patent document 10 is employed, a data stream being supplied to the MPEG Surround decoder is outputted as rendering information. Additionally, the parameter being used within the MPEG Surround decoder may be supplied to the rendering unit without being converted into the data stream.

While, in the foregoing, a configuration was explained in which the modified decoded signal decomposed into the frequency components was supplied to the rendering unit 562 as an output of the signal control unit 560, the rendering unit 562 decomposes the time signal into the frequency components, and then performs a process therefor when the modified decoded signal is inverse-converted and supplied to the rendering unit 562 as a time signal in the output of the signal control unit 560. The rendering unit 562 outputs a signal obtained by inverse-converting the signal decomposed into the frequency components as an output signal.

Upon defining the frequency component of the output signal as $V_k(f)$, k=1, 2, ..., Q (Q is the number of the channels of the output signal), and expressing V(f) by the following equation, an operation of the rendering unit becomes V(f)=W(f)×X'(f).

$$V(f)=\begin{bmatrix}V_1(f)\\ V_2(f)\\ \vdots\\ V_Q(f)\end{bmatrix}\qquad\text{[Numerical equation 18]}$$

Next, a second configuration example will be explained. Upon making a reference to FIG. 32, the output signal generation unit 550 in the second configuration example is configured of a component element information conversion unit 563 and a rendering unit 562. This configuration example is characterized in incorporating information for taking a control for each component element into the rendering information, and in realizing the manipulation for each component element in the rendering unit 562.

The component element information conversion unit 563 has the analysis information, the signal control information, and the component element rendering information as an input. At first, the component element information conversion unit 563 decodes the analysis information, and generates the analysis parameter corresponding to each frequency component. Next, the component element information conversion unit 563 calculates the modified analysis parameter from the analysis parameter and the signal control information, calculates the rendering information indicating a relation between the decoded signal and the output signal for each frequency component from the modified analysis parameter and the component element rendering information, and outputs it to the rendering unit 562.

Additionally, as another operation, the component element information conversion unit 563 may generate the rendering information indicating a relation between the decoded signal and the output signal for each frequency component from the analysis parameter, the signal control information, and the component element rendering information without generating the modified analysis parameter.

As a specific example of the above-mentioned conversion, upon defining a modified analysis parameter B'(f) of a frequency band f as the following equation, the modified analysis parameter B'(f) can be calculated as A(f)×B(f).

$$B'(f) = \begin{bmatrix} C'_{11}(f) & C'_{12}(f) & \ldots & C'_{1P}(f) \\ C'_{21}(f) & C'_{22}(f) & \ldots & C'_{2P}(f) \\ \vdots & \vdots & \ddots & \vdots \\ C'_{M1}(f) & C'_{M2}(f) & \ldots & C'_{MP}(f) \end{bmatrix}$$ [Numerical equation 19]

In addition, the rendering information W(f) expressed by [Numerical equation 17] can be defined as W(f)=U(f)×B'(f) by employing the component element rendering information U(f) and the modified analysis parameter B'(f).
As mentioned as another operation example, the rendering information W(f) may be defined as W(f)=U(f)×A(f)×B(f) without the modified analysis parameter B'(f) calculated.

An operation of the rendering unit 562 is identical to the operation explained in the first configuration example of this embodiment. Specifically, the operation behaves like V(f)=W(f)×X(f).

Making such a configuration makes it possible to incorporate the information for controlling each component element, which is included in the decoded signal, into the rendering information.

Next, a third configuration example will be explained. Upon making a reference to FIG. 33, the output signal generation unit 550 in the third configuration is configured of a component element information conversion unit 564, a rendering unit 562, and a signal control unit 565.

This configuration example is characterized in manipulating each component element based upon the signal control information by employing the signal in which the decoded signal has been rendered.

The component element information conversion unit 564, into which the analysis information and the component element rendering information are inputted, outputs the rendering information. At first, the component element information conversion unit 564 decodes the analysis information, and generates the analysis parameter corresponding to each frequency component. Next, the component element information conversion unit 564 calculates the rendering information indicating a relation between the decoded signal and the output signal for each frequency component from the analysis parameter and the component element rendering information. As a specific example of the above-mentioned conversion, the rendering information W(f) can be defined as W(f)=U(f)×B(f) from the analysis parameter B(f) and the component element rendering information U(f) defined in [Numerical equation 13] and [Numerical equation 17], respectively.

The rendering unit 562 generates a rendering signal from the decoded signal and the rendering information, and outputs it to the signal control unit 565. The rendering unit 562 operates as explained in the first configuration of this embodiment. Upon defining the frequency component of the rendering signal in a certain frequency band f as $I_k(f)$, k=1, 2, . . . , Q (Q is the number of the channels of the output signal), the rendering signal behaves like $I(f)=[I_1(f)I_2(f) \ldots I_Q(f)]^T=W(f) \times X(f)$.

The signal control unit 565 generates the output signal from the rendering signal, the component element rendering information, and the signal control information. The following relation of the output signal V(f) holds by employing a conversion function $F_{505}$ that is specified with the component element rendering information and the signal control information.

$$V(f)=F_{505}(I(f))$$ [Numerical equation 20]

As a specific example of the above-mentioned conversion, when the signal control information A(f) and the component element rendering information U(f) defined in [Numerical equation 14] and [Numerical equation 17], respectively, are employed, [Numerical equation 20] can be expressed as follows.

$$V(f)=U(f) \cdot A(f) \cdot U^{-1}(f) \cdot I(f)$$ [Numerical equation 21]

As explained above, the fifth embodiment of the present invention enables the receiving unit to control the input signal independently for each component element corresponding to each sound source of the input signal based upon the analysis information. Further, the localization of each component element can be controlled based upon the component element rendering information. Further, only a specific sound source can be also controlled independently based upon the signal control information.

In addition, the receiving unit can curtail the arithmetic quantity relating to the calculation of the analysis information because the transmission unit calculates the analysis information.

A sixth embodiment of the present invention will be explained. This embodiment is for controlling the objective sound and the background sound by employing the transmission signal, the component element rendering information, and the signal control information with the input signal, in which the objective sound and the background sound coexist, targeted as a sound source. This embodiment, which is represented in FIG. 30 similarly to the fifth embodiment, differs in configurations of a signal analysis unit 101 and an output signal generation unit 550. Thereupon, the signal analysis unit 101 and the output signal generation unit 550 will be explained in details.

A first example of this embodiment relates to the case that the analysis information is a suppression coefficient. In FIG. 30, the signal analysis unit 101 outputs the suppression coefficient as analysis information. The output signal generation unit 550, responding to this, controls the decoded signal based upon the signal control information and the component element rendering information by employing the suppression coefficient. The configuration of the signal analysis unit 101 was explained in details in the first example of the second embodiment, so its explanation is omitted. Hereinafter, the output signal generation unit 550 will be explained in details.

Figure 30:
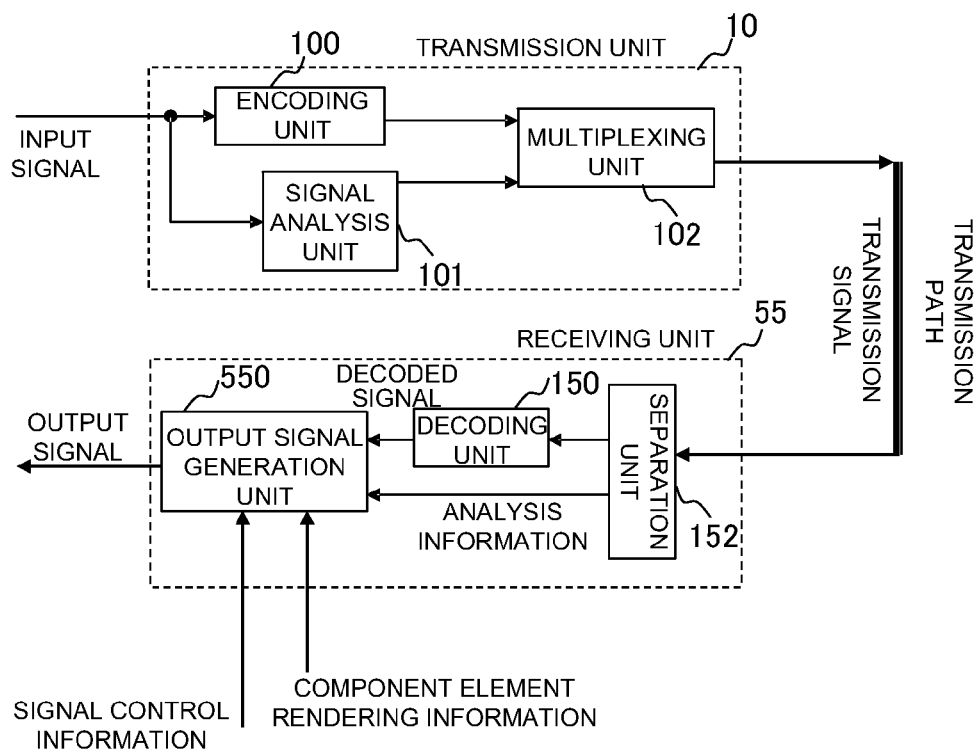
FIG. 30 is a block diagram illustrating a fifth embodiment of the present invention.
Figure 32:
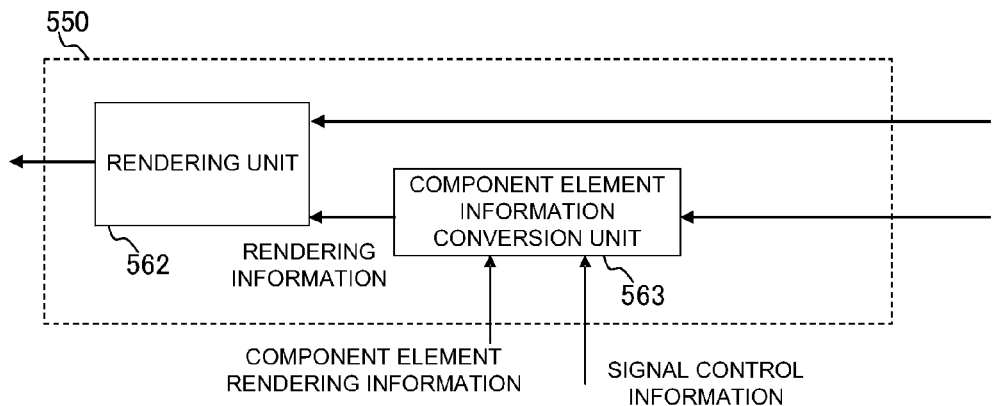
FIG. 32 shows a second configuration example of the output signal generation unit 550.
Figure 33:
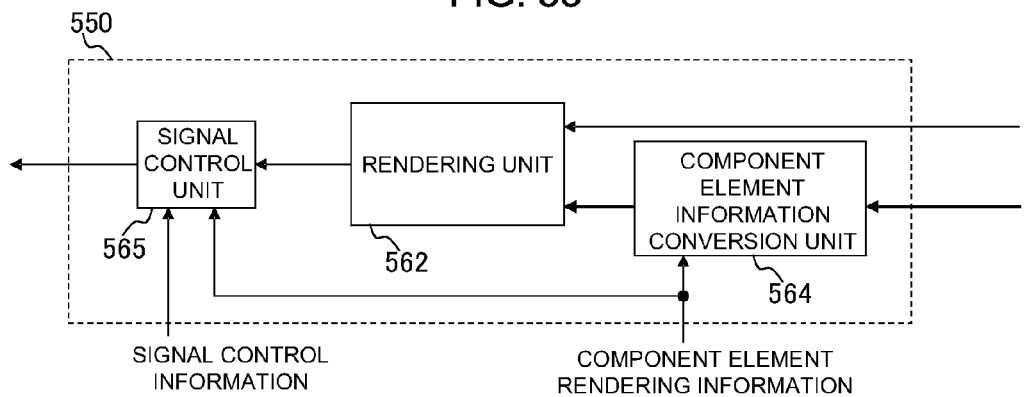
FIG. 33 shows a third configuration example of the output signal generation unit 550.

While a configuration of the output signal generation unit 550 of FIG. 30 for controlling the objective sound and the background sound by employing the suppression coefficient is represented in FIG. 32 similarly to the second configuration example of the output signal generation unit 550 in the fifth embodiment, the former differs from the latter in a configuration of a component element information conversion unit 563. Thereupon, hereinafter, the component element information conversion unit 563 will be explained.

Figure 34:
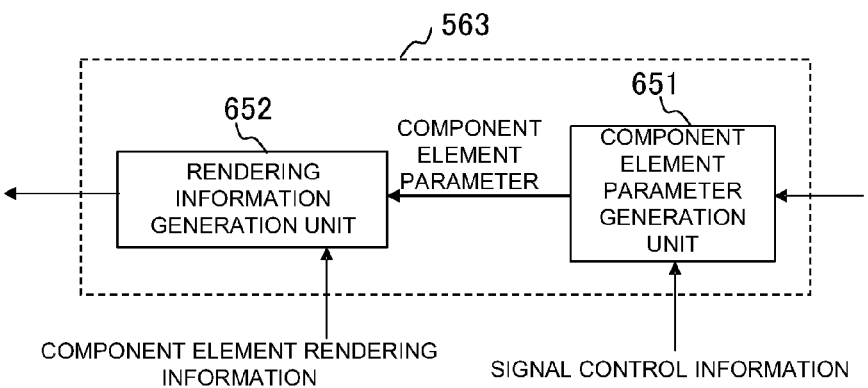
FIG. 34 shows a configuration example of a component element information conversion unit 563.

A configuration example of the component element information conversion unit 563 is shown in FIG. 34. The component element information conversion unit 563 is configured of a component element parameter generation unit 651 and a rendering information generation unit 652. The component element parameter generation unit 651 re-configures the suppression coefficient corresponding to each frequency component from the analysis information, calculates the component element parameter based upon the signal control information, and supplies it to the rendering information generation unit 652.

As a specific example of the above-mentioned conversion, upon defining the suppression coefficient corresponding to each frequency component of a certain frequency band f as $g_i(f)$, i=1, 2, ..., P (P is the number of the channels of the decoded signal), the signal control information for controlling the objective sound as $A_{main}(f)$, and the signal control information for controlling the background sound as $A_{sub}(f)$, a component element parameter H(f) can be expressed with the following equation.

$$H(f) = \begin{bmatrix} A_{main}(f) & 0 \\ 0 & A_{sub}(f) \end{bmatrix} \begin{bmatrix} g_1(f) & \cdots & g_P(f) \\ 1-g_1(f) & \cdots & 1-g_P(f) \end{bmatrix}$$ [Numerical equation 22]

The rendering information generation unit 652 outputs the rendering information indicating a relation between the decoded signal and the output signal based upon the component element parameter and the component element rendering information. Now think about the case that M=2 in [Numerical equation 17] as a specific example of the above-mentioned conversion, the rendering information W(f) can be defined as W(f)=U(f)×H(f).

Additionally, as another configuration example of the component element information conversion unit 563, the component element parameter generation unit 651 and the rendering information generation unit 652 in FIG. 34 can be also integrated. In this case, the analysis information is decoded, the suppression coefficient corresponding to each frequency component is calculated, the rendering information is calculated from the suppression coefficient, the signal control information, and the component element rendering information, and the rendering information is outputted to the rendering unit 562.

Now think about the case that M=2 in [Numerical equation 17] as a specific example of the above-mentioned conversion, the rendering information W(f) can be expressed with the following equation.

$$W(f) = U(f) \cdot \begin{bmatrix} A_{main}(f) & 0 \\ 0 & A_{sub}(f) \end{bmatrix} \begin{bmatrix} g_1(f) & \cdots & g_P(f) \\ 1-g_1(f) & \cdots & 1-g_P(f) \end{bmatrix}$$ [Numerical equation 23]

A second example of this embodiment relates to the case that the analysis information is a signal versus background sound ratio. In FIG. 30, the signal analysis unit 101 outputs the signal versus background sound ratio as analysis information. The output signal generation unit 550, responding to this, controls the decoded signal based upon the signal control information and the component element rendering information by employing the signal versus background sound ratio. The second example differs from the first example only in configurations of the signal analysis unit 101 and the output signal generation unit 550. The signal analysis unit 101 for calculating the signal versus background sound ratio as analysis information was explained in details in the second example of the second embodiment, so its explanation is omitted. Hereinafter, an operation of the output signal generation unit 550 will be explained in details.

A configuration of the output signal generation unit 550 of FIG. 30 for controlling the objective sound and the background sound by employing the signal versus background sound ratio is represented in FIG. 32 and FIG. 34 similarly to case of the first example. Upon making a comparison with the first example, this example differs in a configuration of the component element parameter generation unit 651 of FIG. 34. Thereupon, hereinafter, the component element parameter generation unit 651 will be explained.

The component element parameter generation unit 651 decodes the analysis information, calculates the signal versus background sound ratio corresponding to each frequency component, calculates the component element parameter for controlling the objective sound and the background sound based upon the signal control information from the signal versus background sound ratio, and supplies it to the rendering information generation unit 652. For example, after the signal versus background sound ratio is converted into the suppression coefficient as explained in the second embodiment, the component element parameter can be calculated based upon the signal control information by employing [Numerical equation 22] as explained in the first embodiment. Further, as explained in the fourth embodiment, the method of, after manipulating the signal versus background sound ratio based upon the signal control information, and converting the manipulated signal versus background sound ratio into the suppression coefficient, calculating the component element parameter may be employed as another method. In this case, upon defining the converted suppression coefficient as $g'_i(f)$, a component element parameter H(f) behaves like the following equation.

$$H(f) = \begin{bmatrix} g'_1(f) & \cdots & g'_P(f) \\ 1-g'_1(f) & \cdots & 1-g'_P(f) \end{bmatrix}$$ [Numerical equation 24]

As another configuration example of the component element information conversion unit 563 of FIG. 32, the component element parameter generation unit 651 and the rendering information generation unit 652 of FIG. 34 can be integrated. In this case, the signal versus background sound ratio corresponding to each frequency component is calculated by decoding the analysis information, the rendering information is calculated from the signal versus background sound ratio, the signal control information, and the component element rendering information, and the rendering information is outputted to the rendering unit 562. As a specific example, for example, after the signal versus background sound ratio is converted into the suppression coefficient as explained in the second embodiment, the rendering information is calculated from the suppression coefficient, the signal control information, and the component element rendering information by employing [Numerical equation 23], and the rendering information is outputted to the rendering unit 562 as explained in the first embodiment. Further, as another method, as explained in the fourth embodiment, after the signal versus background sound ratio is manipulated based upon the signal control information, and the manipulated signal versus background sound ratio is converted into the suppression coefficient, the rendering information may be calculated from the converted suppression coefficient and the component element rendering information. In this case, the rendering information W(f) behaves like the following equation.

$$W(f) = U(f) \cdot \begin{bmatrix} g'_1(f) & \ldots & g'_P(f) \\ 1-g'_1(f) & \ldots & 1-g'_P(f) \end{bmatrix}$$ [Numerical equation 25]

A third example of this embodiment relates to the case that the analysis information is background sound. Upon making a reference to FIG. 30, the signal analysis unit 101 calculates the background sound as analysis information. The output signal generation unit 550, responding to this, controls the decoded signal based upon the signal control information and the component element rendering information by employing the background sound. The third example differs from the first example only in configurations of the signal analysis unit 101 and the output signal generation unit 550. The signal analysis unit 101 for calculating the background sound as analysis information was explained in details in the third example of the second embodiment, so its explanation is omitted. Thereupon, hereinafter, an operation of the output signal generation unit 550 will be explained in details.

Figure 35:
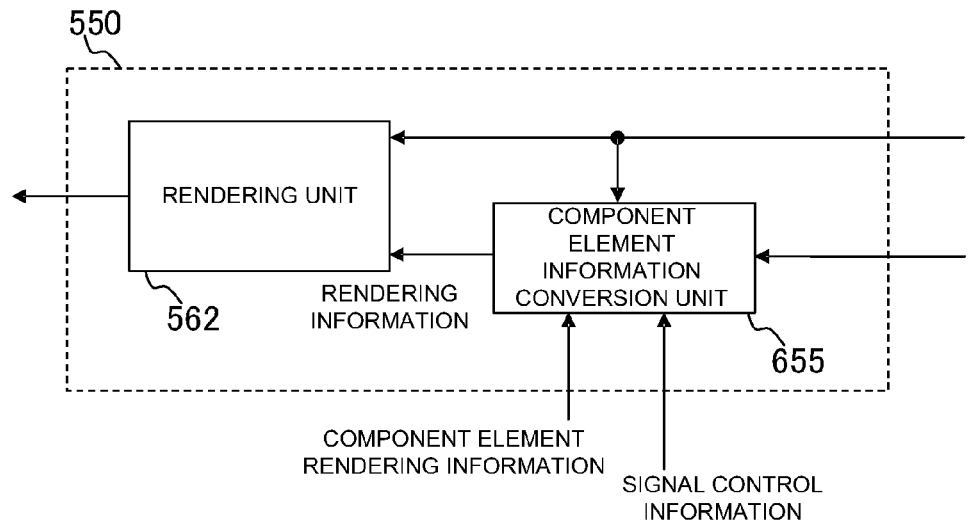
FIG. 35 shows a fourth configuration example of the output signal generation unit 550.

A configuration example of the output signal generation unit 550 of FIG. 30 for controlling the objective sound and the background sound by employing the background sound is shown in FIG. 35. The third example of FIG. 35 differs from the first example shown in FIG. 32 in a point that the component element information conversion unit 563 is replaced with a component element information conversion unit 655. Hereinafter, the component element information conversion unit 655 will be explained.

Figure 36:
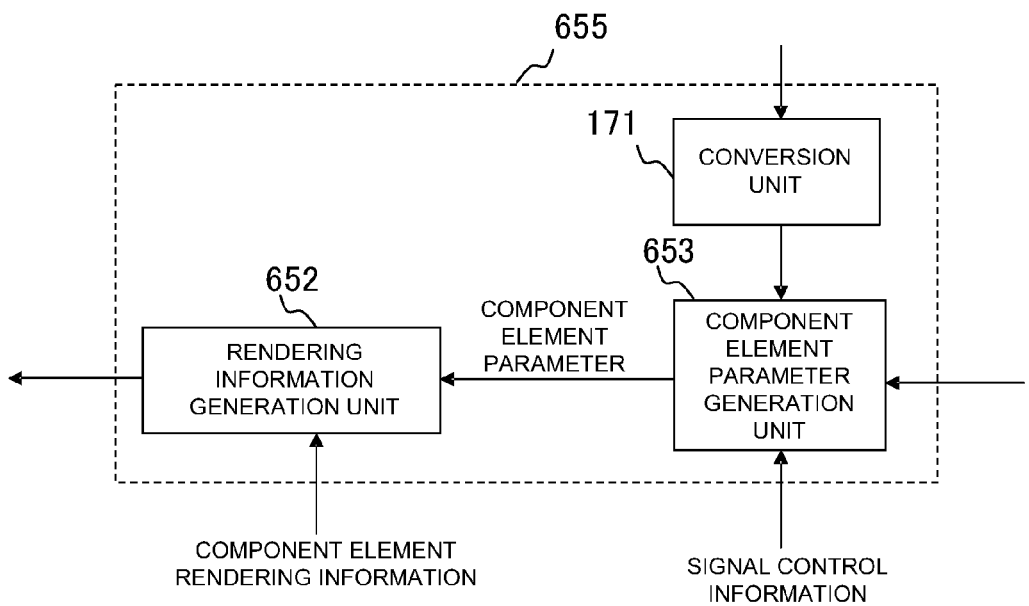
FIG. 36 shows a configuration example of a component element information conversion unit 655.

The component element information conversion unit 655, into which the decoded signal, the analysis information, the signal control information, and the component element rendering information are inputted, generates the rendering information indicating a relation between the decoded signal and the output signal for each frequency component, and outputs it to the rendering unit 562. A configuration example of the component element information conversion unit 655 is shown in FIG. 36. The component element information conversion unit 655 is configured of a conversion unit 171, a component element parameter generation unit 653, and a rendering information generation unit 652. The conversion unit 171 decomposes the decoded signal into the respective frequency components, generates the second converted signal, and outputs the second converted signal to the component element parameter generation unit 653.

The component element parameter generation unit 653 has the second converted signal, the analysis information, and the signal control information as an input. The component element parameter generation unit 653 calculates the background sound by decoding the analysis information, calculates the component element parameter for controlling the objective sound and the background sound based upon the signal control information from the second converted signal and the background sound, and outputs it to the rendering information generation unit 652.

Hereinafter, a specific example of the method of calculating the component element parameter is shown. In a first method, the suppression coefficient is calculated from the background sound and the second converted signal as explained in the third example of the second embodiment. In addition, the component element parameter is calculated based upon the signal control information by applying [Numerical equation 25] for the suppression coefficient. In a second method, the suppression coefficient is calculated from the background sound, the signal control information, and the second converted signal with the method explained in the fourth example and the fifth example of the fourth embodiment. The component element parameter is calculated by applying [Numerical equation 24] for the suppression coefficient calculated with the foregoing methods.

Additionally, the component element parameter generation unit 653 and the rendering information generation unit 652 of FIG. 36 can be also integrated as another configuration example of the component element information conversion unit 655 of FIG. 35. In this case, the rendering information is calculated from the second converted signal corresponding to each frequency component, the background sound corresponding to each frequency component in which the analysis information has been decoded, the signal control information, and the component element rendering information, and the rendering information is outputted to the rendering unit 562.

Hereinafter, a specific example of the method of calculating the rendering information is shown. In a first method, the suppression coefficient is calculated from the background sound by employing the decoded signal as explained in the third example of the second embodiment. In addition, the rendering information is calculated from the suppression coefficient, the signal control information, and the component element rendering information by employing [Numerical equation 23]. In a second method, the suppression coefficient is calculated from the background sound, the signal control information, and the second converted signal with the method explained in the fourth example and the fifth example of the fourth embodiment. The rendering information is calculated from the suppression coefficient and the component element rendering information by employing [Numerical equation 25] for the suppression coefficient calculated with the foregoing methods.

As explained above, the sixth embodiment of the present invention enables the receiving unit to control the input signal, which is configured of the objective sound and the background sound, independently based upon the analysis information. Further, the localization of the objective sound and the background sound can be controlled based upon the component element rendering information. Further, only a specific sound source can be also controlled independently based upon the signal control information.

In addition, the receiving unit can curtail the arithmetic quantity relating to the calculation of the analysis information because the transmission unit calculates the analysis information.

A seventh embodiment of the present invention will be explained by making a reference to FIG. 37. Upon comparing FIG. 37 with FIG. 30 indicative of the fifth embodiment, the former differs from the latter in a point that the receiving unit 55 of FIG. 30 is replaced with a receiving unit 75 in FIG. 37. The receiving unit 75, into which the transmission signal and the component element rendering information are inputted, outputs the signal, which is configured of a plurality of the channels, as an output signal. The receiving unit 75 differs from the receiving unit 55 of the fifth embodiment in a point of not having the signal control signal as an input, and a point that the output signal generation unit 550 is replaced with an output signal generation unit 750. Additionally, the component element rendering information of this embodiment may include the information for manipulating each component element that is included in the decoded signal. The output signal generation unit 750 can manipulate the decoded signal with the component element group, which is configured of a plurality of the component element, defined as a unit instead of each component element corresponding to the sound source.

Upon comparing the receiving unit 75 with the receiving unit 55 explained in the fifth embodiment, the former differs from the latter in a point that the output signal generation unit 550 is replaced with the output signal generation unit 750. Hereinafter, a configuration example of the output signal generation unit 750, which is characteristic of this embodiment, will be explained.

Figure 37:
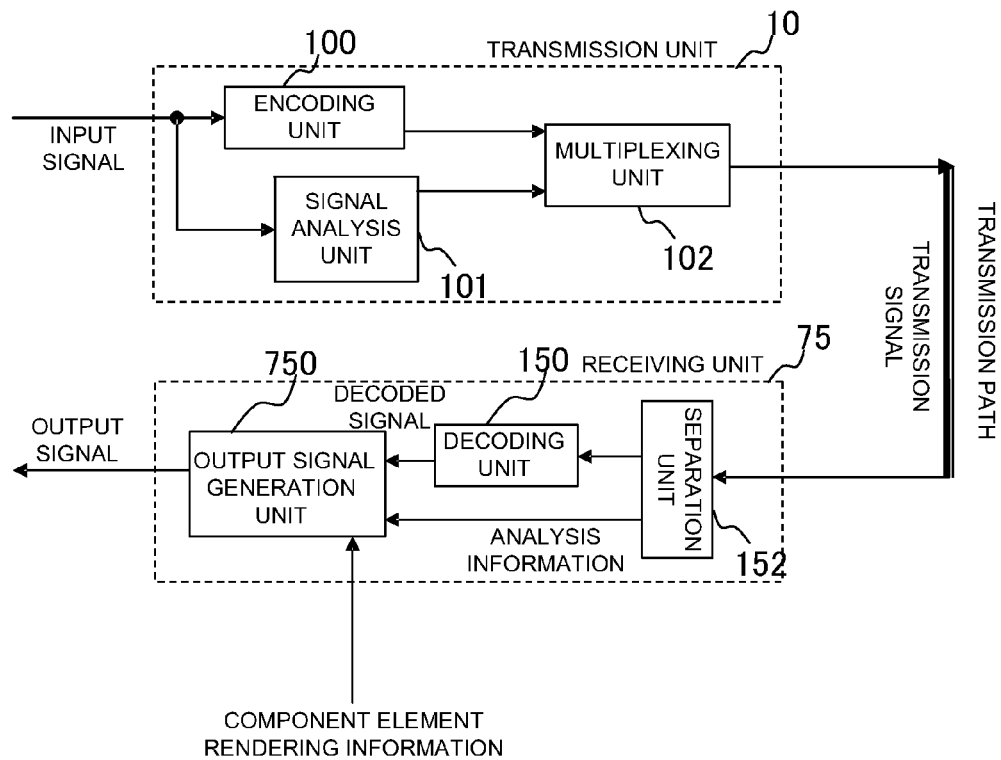
FIG. 37 is a block diagram illustrating a seventh embodiment of the present invention.
Figure 38:
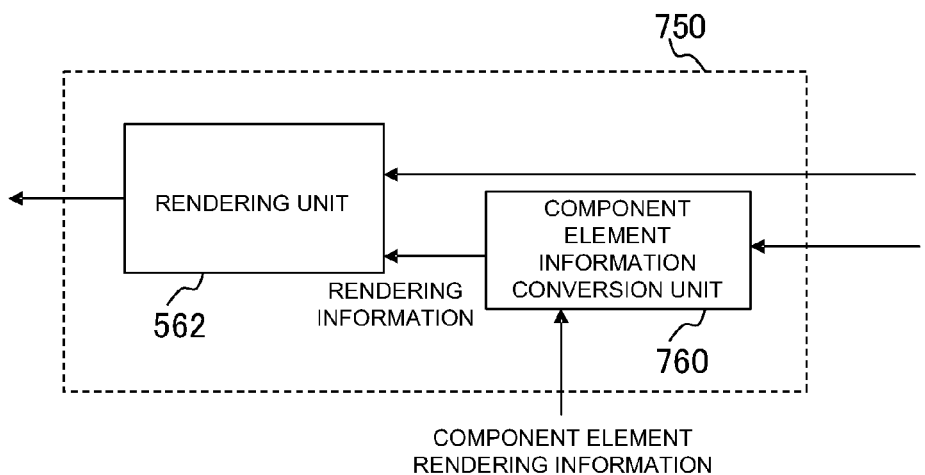
FIG. 38 shows a configuration example of an output signal generation unit 750.

In FIG. 38, a configuration example of the output signal generation unit 750 of FIG. 37 is shown. The output signal generation unit 750 is configured of a component element information conversion unit 760 and a rendering unit 562. The output signal generation unit 750 differs from the output signal generation unit 550 shown in FIG. 32 of the fifth embodiment in a point that the component element information conversion unit 563 is replaced with the component element information conversion unit 750. Hereinafter, a configuration example of the component element information conversion unit 760 will be explained.

The component element information conversion unit 760, into which the analysis information and the component element rendering information are inputted, outputs the rendering information. At first, the component element information conversion unit 760 decodes the analysis information, and calculates the analysis parameter corresponding to each frequency component. In addition, the component element information conversion unit 760 generates the rendering information indicating a relation between the decoded signal and the output signal of the output signal generation unit 750 for each frequency component by employing the analysis parameter and the component element rendering information.

As a specific example of the above-mentioned conversion, the rendering information $W(f)$ can be expresses by $W(f)=U(f) \times B(f)$ by employing [Numerical equation 13] and [Numerical equation 17]. Where $B(f)$ is an analysis parameter of the frequency band f, and $U(f)$ is component element rendering information.

This configuration example is characterized in incorporating the information for taking a control for each component element into the rendering information, and realizing the manipulation for each component element in the rendering unit 562.

As explained above, the seventh embodiment of the present invention enables the receiving unit to control the input signal independently for each component element corresponding to each sound source of the input signal based upon the analysis information. In addition, the localization of each component element can be controlled based upon the component element rendering information.

In addition, the receiving unit can curtail the arithmetic quantity relating to the calculation of the analysis information because the transmission unit calculates the analysis information.

An eighth embodiment of the present invention will be explained. This embodiment makes it possible to control the objective sound and the background sound independently, and to control the localization of the objective sound and the background sound by employing the component element rendering information supplied to the receiving unit with the input signal, in which the objective sound and the background sound coexist as a sound source, targeted. This embodiment, which is represented in FIG. 37 similarly to the seventh embodiment, differs in configurations of the signal analysis unit 101 and the output signal generation unit 750. Hereinafter, the signal analysis unit 101 and the output signal generation unit 750 will be explained in details.

A first example of this embodiment relates to the case that the analysis information is a suppression coefficient. The signal analysis unit 101 of the transmission unit 10 outputs the suppression coefficient as analysis information. The output signal generation unit 750, responding to this, controls the decoded signal by employing the component element rendering information and the suppression coefficient. The signal analysis unit 101 in the case of employing the suppression coefficient as analysis information was explained in details in the first example of the second embodiment, so its explanation is omitted. Hereinafter, an operation of the output signal generation unit 750 will be explained in details.

While a configuration example of the output signal generation unit 750 of FIG. 37 for controlling the objective sound and the background sound by employing the suppression coefficient is represented in FIG. 38 similarly to that of the output signal generation unit 750 of the seventh embodiment, the former differs from the latter in a configuration of a component element information conversion unit 760. A configuration example of the component element information conversion unit 760 is shown in FIG. 39. The component element information conversion unit 760 is configured of a component element parameter generation unit 851 and a rendering information generation unit 652.

The component element parameter generation unit 851 has the analysis information as an input. The component element parameter generation unit 851 decodes the analysis information, re-configures the suppression coefficient corresponding to each frequency component, calculates the component element parameter, and outputs it to the rendering information generation unit 652. As a specific example of this conversion, upon defining the suppression coefficient corresponding to each frequency component of the frequency band f as $g_t(f)$, a component element parameter $H(f)$ is equivalent to the case that $A_{main}(f)=1$ and $A_{sub}(f)=1$ in [Numerical equation 22], namely, behaves like the following equation.

$$H(f) = \begin{bmatrix} g_1(f) & \cdots & g_P(f) \\ 1-g_1(f) & \cdots & 1-g_P(f) \end{bmatrix} \quad \text{[Numerical equation 26]}$$

The rendering information generation unit 652 was already explained in the sixth embodiment by employing FIG. 34, so its explanation is omitted.

A second example of this embodiment relates to the case that the analysis information is a signal versus background sound ratio. The signal analysis unit 101 of the transmission unit 10 outputs the signal versus background sound ratio as analysis information. The output signal generation unit 750, responding to this, controls the decoded signal based upon the component element rendering information by employing the signal versus background sound ratio. The signal analysis unit 101 in the case of employing the signal versus background sound ratio as analysis information was explained in details in the second example of the second embodiment, so its explanation is omitted. Hereinafter, an operation of the output signal generation unit 750 will be explained in details.

A configuration example of the output signal generation unit 750 of FIG. 37 for controlling the objective sound and the background sound by employing the signal versus background sound ratio is represented in FIG. 38 similarly to the case of the first example. This example differs from the first example in a configuration of a component element parameter generation unit 851 of FIG. 39 indicative of a configuration of the component element information conversion unit 760. Hereinafter, the component element parameter generation unit 851 will be explained.

The component element parameter generation unit 851, into which the analysis information is inputted, decodes the analysis information, and calculates the signal versus background sound ratio corresponding to each frequency component. In addition, the component element parameter generation unit 851 calculates the component element parameter from the signal versus background sound ratio, and outputs it to the rendering information generation unit 652. As a method of calculating the component element parameter, for example, the signal versus background sound ratio is converted into the suppression coefficient as explained in the second example of the second embodiment. In addition, the component element parameter is calculated from the suppression coefficient by employing [Numerical equation 26] as explained in the first example of this embodiment.

A third example of this embodiment relates to the case that the analysis information is background sound. The signal analysis unit 101 of the transmission unit 10 outputs the background sound as analysis information. The output signal generation unit 750, responding to this, controls the decoded signal based upon the background sound and the component element rendering information. The signal analysis unit 101 in the case of employing the signal versus background sound ratio as analysis information was explained in details in the third example of the second embodiment, so its explanation is omitted. Hereinafter, an operation of the output signal generation unit 750 will be explained in details.

A configuration example of the output signal generation unit 750 of FIG. 37 for controlling the objective sound and the background sound by employing the background sound is represented in FIG. 40. This example of FIG. 40 differs from the first example of FIG. 38 in a point that the component element information conversion unit 760 is replaced with a component element information conversion unit 761. The rendering information generation unit 652 was already explained by employing FIG. 34, so its explanation is omitted.

Figure 41:
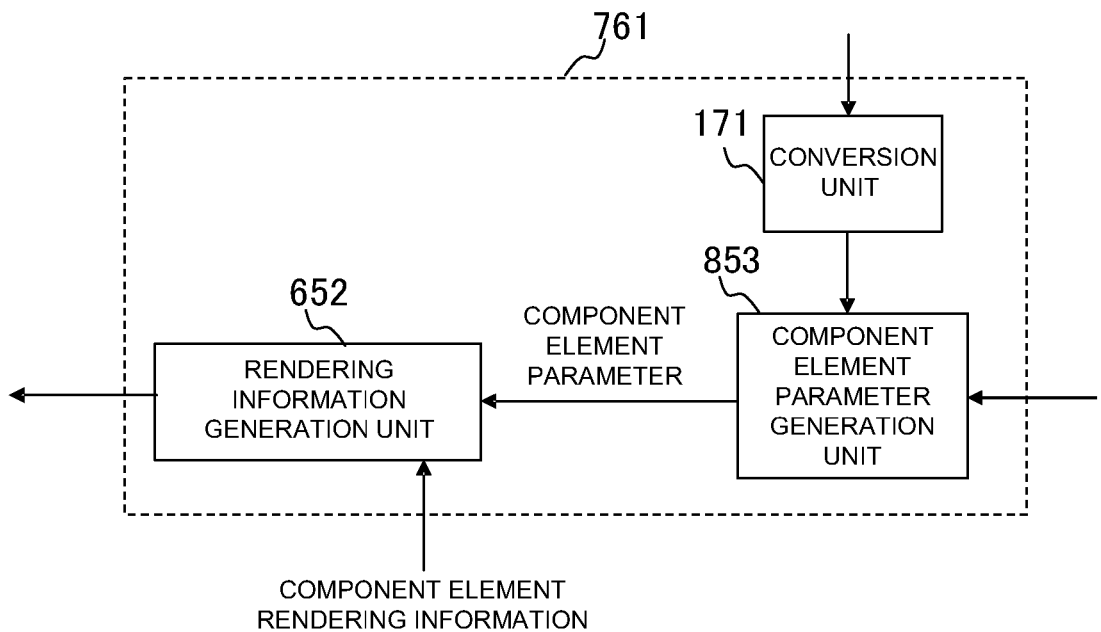
FIG. 41 shows a configuration example of a component element information conversion unit 761.

The component element information conversion unit 761 generates the rendering information indicating a relation between the decoded signal and the output signal for each frequency component from the decoded signal, the analysis information, and the component element rendering information, and supplies it to the rendering unit 562. A configuration example of the component element information conversion unit 761 is shown in FIG. 41. The component element information conversion unit 761 is configured of a conversion unit 171, a component element parameter generation unit 853, and a rendering information generation unit 652. The conversion unit 171 decomposes the decoded signal into the respective frequency components, generates the second converted signal, and supplies the second converted signal to the component element parameter generation unit 853.

The component element parameter generation unit 853 has the analysis information and the second converted signal as an input. The component element parameter generation unit 853 decodes the analysis information, calculates the background sound, calculates the component element parameter based upon the second converted signal and the background sound, and outputs it to the rendering information generation unit 652. As a method of calculating the component element parameter, for example, the background sound is converted into the suppression coefficient as explained in the third example of the second embodiment. In addition, the component element parameter is calculated from the suppression coefficient by employing [Numerical equation 26] as explained in the first example of this embodiment.

As explained above, the eighth embodiment of the present invention enables the receiving unit to control the input signal, which is configured of the objective sound and the background sound, independently based upon the analysis information. Further, the localization of the objective sound and the background sound can be controlled based upon the component element rendering information.

In addition, the receiving unit can curtail the arithmetic quantity relating to the calculation of the analysis information because the transmission unit calculates the analysis information such as the suppression coefficient and the signal versus background sound ratio.

A ninth embodiment of the present invention will be explained in details by making a reference to FIG. 42. Upon making a comparison with the first embodiment of the present invention shown in FIG. 1, the transmission unit 10 of the first embodiment is replaced with a transmission unit 90. In addition, while the transmission unit 10 is configured of the signal analysis unit 101, the transmission unit 90 is configured of a signal analysis unit 900. Further, the input signal and the encoded signal coming from an encoding unit 100 are inputted into the signal analysis unit 900.

Further, in the second embodiment to the eighth embodiment, the signal analysis unit 101 being included in the transmission unit 10 may be replaced with the signal analysis unit 900 of this embodiment. In this case, it is enough for the input signal and the encoded signal coming from an encoding unit 100 to be inputted into the signal analysis unit 900.

With the ninth embodiment, the signal analysis unit 900 makes an analysis taking into consideration an influence of quantizing distortion that has occurred in the encoding unit, thereby enabling the quantizing distortion, which occurs at the moment that the receiving unit 15 performs the decoding, to be reduced.

A first configuration example of the signal analysis unit 900 will be explained in details by making a reference to FIG. 43.

The signal analysis unit 900 generates the analysis information from the input signal and the encoded signal coming from an encoding unit 100. The signal analysis unit 900 can generate the analysis information by taking the quantizing distortion quantity into consideration because the encoded signal is a signal to which the quantizing distortion has been added.

The signal analysis unit 900 receives the input signal and the encoded signal coming from an encoding unit 100, and outputs the analysis information. The signal analysis unit 900 is configured of a conversion unit 120, a decoding unit 150, a quantizing distortion calculation unit 910, an analysis information generation unit 911, and a conversion unit 920.

The input signal is inputted into the conversion unit 120. Further, the encoded signal coming from an encoding unit 100 is inputted into the decoding unit 150.

The decoding unit 150 decodes the encoded signal inputted from the encoding unit 100. The decoding unit 150 outputs the decoded signal to the conversion unit 920. The conversion unit 920 decomposes the decoded signal into the frequency components. The conversion unit 920 outputs the decoded signal decomposed into the frequency components to the quantizing distortion calculation unit 910.

The conversion unit 120 decomposes the input signal into the frequency components. The conversion unit 120 outputs the input signal decomposed into the frequency components to the quantizing distortion calculation unit 910 and the analysis information generation unit 911. The quantizing distortion calculation unit 910 compares the decoded signal decomposed into the frequency components with the input signal decomposed into the frequency components, and calculates the quantizing distortion quantity for each frequency component. For example, a difference between magnitude of each frequency component of the decoded signal decomposed into the frequency components and magnitude of each frequency component of the input signal decomposed into the frequency components could be the quantizing distortion in the above frequency. The quantizing distortion calculation unit 910 outputs the quantizing distortion quantity of each frequency to the analysis information generation unit 911.

The analysis information generation unit 911 receives the input signal decomposed into the frequency components from the conversion unit 120, and receives the quantizing distortion quantity of each frequency from the quantizing distortion calculation unit 910. With regard to the input signal decomposed into the frequency components, the analysis information generation unit 911 decomposes the input signal corresponding to each frequency component for each component element corresponding to the sound source. And, the analysis information generation unit 911 generates the analysis information indicative of a relation between a plurality of the component elements. The analysis information generation unit 911 outputs the analysis information. Further, With regard to the input signal decomposed into the frequency components, the analysis information generation unit 911 may decompose the input signal for each component element group that is configured of a plurality of the component elements.

The analysis information generation unit 911, taking the quantizing distortion quantity into consideration, calculates the analysis information so that the quantizing distortion quantity is reduced at the moment that the receiving unit performs the decoding. For example, the analysis information generation unit 911 may calculate the analysis information from magnitude of each frequency component of the input signal decomposed into the frequency components and magnitude of the quantizing distortion in the above frequency so that the quantizing distortion is auditorily masked. Herein, the analysis information generation unit 911 may utilize the fact that the small component becomes hard to hear in a frequency neighboring the frequency of which the frequency component is large due to the auditory masking. The magnitude of the component, which becomes hard to hear in the neighboring frequency due to the magnitude of each frequency component, is defined as a masking characteristic. The analysis information generation unit 911 calculates the masking characteristic in terms of all frequencies. The analysis information generation unit 911 corrects the analysis information by taking an influence of the quantizing distortion into consideration in each frequency. The quantizing distortion is hard to hear when the magnitude of the quantizing distortion is smaller than the masking characteristic. In this case, the analysis information generation unit 911 does not correct the analysis information because an influence of the quantizing distortion is small. The quantizing distortion is not masked when the magnitude of the quantizing distortion is larger than the masking characteristic. In this case, the analysis information generation unit 911 corrects the analysis information so that the quantizing distortion is reduced. For example, when the suppression coefficient is employed as analysis information, the suppression coefficient, which is relatively small, should be employed so as to suppress the quantizing distortion as well simultaneously with the background sound.

As mentioned above, the analysis information generation unit 911 corrects the analysis information, thereby allowing quantizing distortion to be auditorily masked, and the distortion and the noise to be reduced at the moment that the receiving unit performs the decoding.

So far, the correction of the analysis information such that the quantizing distortion was reduced by taking the auditory masking into consideration was explained. However, a configuration for correcting the analysis information so that the quantizing distortion is reduced in all frequencies without the auditory masking taken into consideration may be employed.

Figure 44:
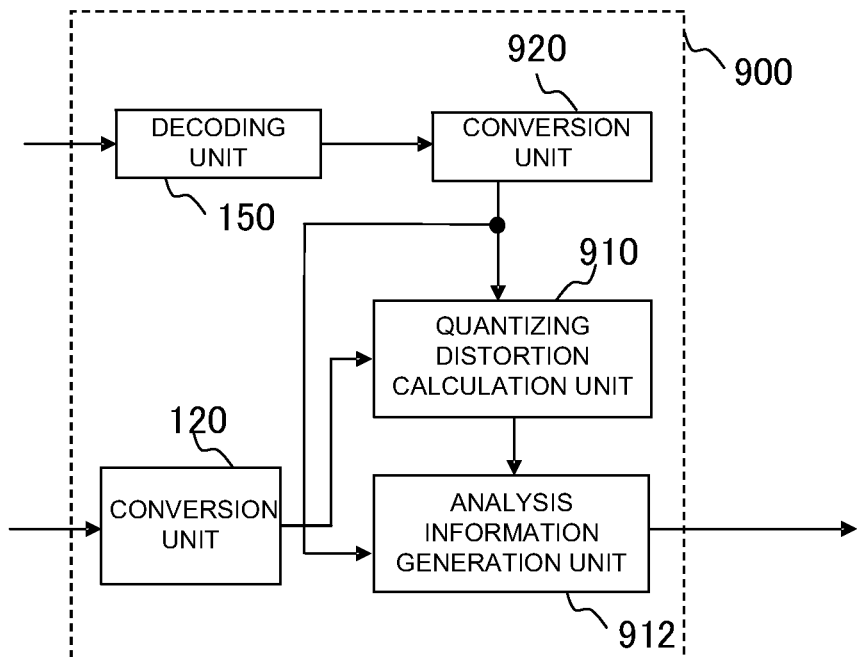
FIG. 44 shows a second configuration example of the signal analysis unit 900.

A second configuration example of the signal analysis unit 900 will be explained in details by making a reference to FIG. 44.

The signal analysis unit 900 receives the input signal and the encoded signal coming from the encoding unit 100, and outputs the analysis information. The signal analysis unit 900 is configured of a conversion unit 120, a decoding unit 150, a quantizing distortion calculation unit 910, an analysis information generation unit 912, and a conversion unit 920.

The input signal is inputted into the conversion unit 120. Further, the encoded signal coming from the encoding unit 100 is inputted into the decoding unit 150.

The decoding unit 150 decodes the encoded signal inputted from the encoding unit 100.

The decoding unit 150 outputs the decoded signal to the conversion unit 920. The conversion unit 920 decomposes the decoded signal into the frequency components. The conversion unit 920 outputs the decoded signal decomposed into the frequency components to the quantizing distortion calculation unit 910 and the analysis information generation unit 912.

The conversion unit 120 decomposes the input signal into the frequency components. The conversion unit 120 outputs the input signal decomposed into the frequency components to the quantizing distortion calculation unit 910. The quantizing distortion calculation unit 910 compares the decoded signal decomposed into the frequency components with the input signal decomposed into the frequency components, and calculates the quantizing distortion quantity for each frequency component. For example, a difference between the magnitude of each frequency component of the decoded signal decomposed into the frequency components and the magnitude of each frequency component of the input signal decomposed into the frequency components could be the quantizing distortion in the above frequency. The quantizing distortion calculation unit 910 outputs the quantizing distortion quantity of each frequency to the analysis information generation unit 912.

The analysis information generation unit 912 receives the decoded signal decomposed into the frequency components from the conversion unit 920, and receives the quantizing distortion quantity of each frequency from the quantizing distortion calculation unit 910. With regard to the decoded signal decomposed into the frequency components, the analysis information generation unit 912 decomposes the input signal corresponding to each frequency component for each component element that corresponds to the sound source. And, the analysis information generation unit 912 generates the analysis information indicative of a relation between a plurality of the component elements. The analysis information generation unit 912 outputs the analysis information corrected so that the quantizing distortion is reduced. The calculation of the analysis information such that the quantizing distortion is reduced is similar to the case of the first configuration example, so its explanation is omitted.

As explained above, the first configuration example and the second configuration example of the signal analysis unit 900 have an effect that generating the analysis information so as to reduce an influence of the encoding distortion that occurred in the encoding unit 100 makes it possible to reduce the quantizing distortion that occurs at the moment that the receiving unit 15 performs the decoding.

Continuously, a tenth embodiment of the present invention will be explained. The tenth embodiment of the present invention is for controlling the input signal that is configured of the objective sound and the background sound as a sound source. A configuration of the tenth embodiment of the present invention is shown in FIG. 42 and FIG. 43 similarly to that of the ninth embodiment of the present invention. This embodiment differs from the ninth embodiment of the present invention in FIG. 43 in a configuration of an analysis information generation unit 911.

Figure 45:
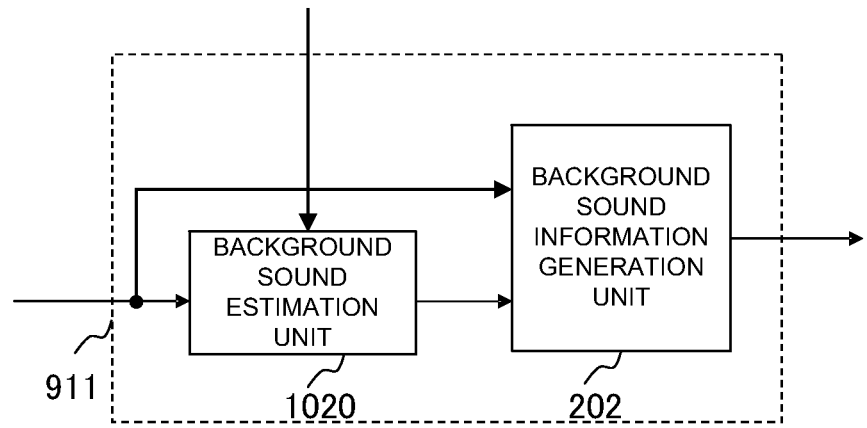
FIG. 45 shows a configuration example of an analysis information generation unit 911.

A configuration example of the analysis information generation unit 911 in the tenth embodiment of the present invention will be explained in details by making a reference FIG. 45. Upon comparing the analysis information generation unit 121 shown in FIG. 6 with the analysis information generation unit 911 shown in FIG. 45, the latter differs from the former in a point that the quantizing distortion quantity of each frequency coming from the quantizing distortion calculation unit 910 is inputted. In addition, while the analysis information generation unit 121 is configured of the background sound estimation unit 200, the analysis information generation unit 911 is configured of a background sound estimation unit 1020. Explanation of a portion which overlaps the portion explained in FIG. 6 and FIG. 43 is omitted.

The analysis information generation unit 911 receives the input signal decomposed into the frequency components and the quantizing distortion quantity of each frequency, and outputs the analysis information. The analysis information generation unit 911 is configured of a background sound information generation unit 202 and the background sound estimation unit 1020.

The background sound estimation unit 1020 receives the input signal decomposed into the frequency components and the quantizing distortion quantity of each frequency. The background sound estimation unit 1020 estimates the background sound by taking the quantizing distortion quantity into consideration. For example, the background sound estimation unit 1020 can perform a process similar to the process, which the background sound estimation unit 200 being included in the analysis information generation unit 121 performs, with the background sound obtained by adding the quantizing distortion to the estimated background sound defined as an estimated background sound. The background sound estimation unit 1020 outputs the information of the background sound in which the quantizing distortion has been taken into consideration to the background sound information generation unit 202. The background sound information generation unit 202 generates the analysis information based upon the information of the background sound. And, the background sound information generation unit 202 outputs the analysis information in which the quantizing distortion has been taken into consideration.

The receiving unit 15 controls the decoded signal based upon the analysis information in which the quantizing distortion has been taken into consideration. This configuration makes it possible to take a high-quality control in which the quantizing distortion has been taken into consideration at the moment of controlling the decoded signal. In addition, this configuration yields an effect that the quantizing distortion, which occurs when the receiving unit 15 performs the decoding, can be reduced.

In addition, in the tenth embodiment of the present invention, the background sound information generation unit 202 may be adapted to output the suppression coefficient as analysis information, the signal versus background sound ratio or the background sound itself.

Figure 42:
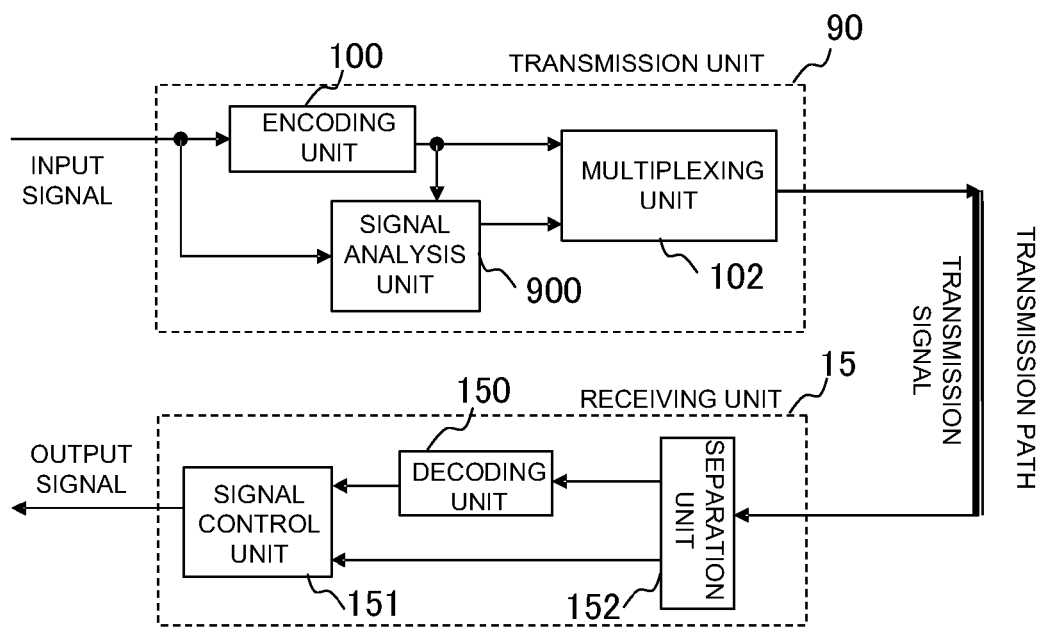
FIG. 42 is a block diagram illustrating a ninth embodiment of the present invention.
Figure 43:
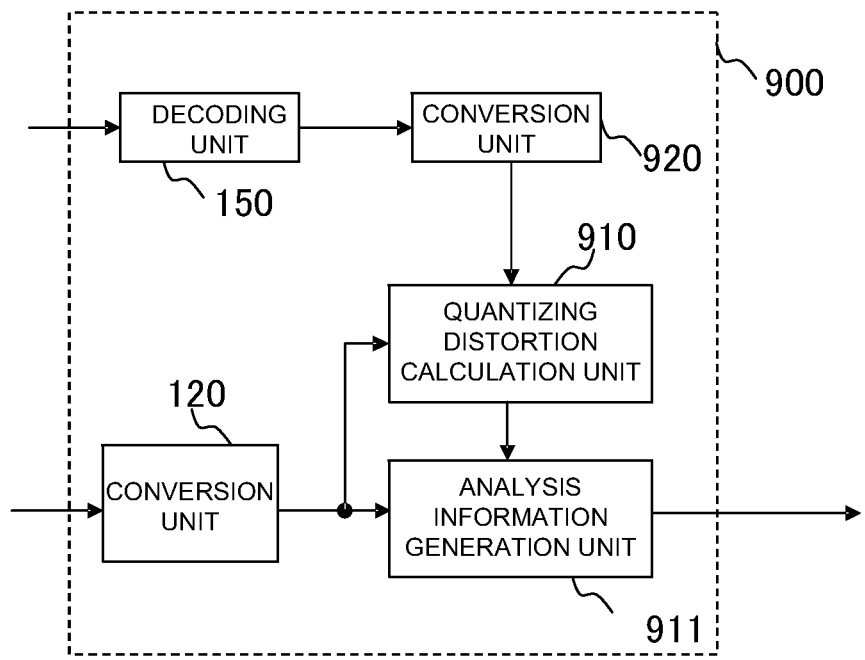
FIG. 43 shows a configuration example of a signal analysis unit 900.

The analysis information generation unit 911 in FIG. 43 calculates and encodes the suppression coefficient when encoding and outputting the suppression coefficient as analysis information. The analysis information generation unit 911 in FIG. 43 may employ the configuration of the background sound information generation unit 202 shown in FIG. 7 as that of the background sound information generation unit 202 thereof so as to output the suppression coefficient. In this case, the signal control unit 151 of the receiving unit 15 in FIG. 42 is configured so as to correspond to the control of the decoded signal by the suppression coefficient.

The analysis information generation unit 911 in FIG. 43 calculates and encodes the signal versus background sound ratio when encoding and outputting the signal versus background sound ratio as analysis information. The analysis information generation unit 911 in FIG. 43 may employ the configuration of the background sound information generation unit 202 shown in FIG. 10 or the configuration of the background sound information generation unit 202 shown in FIG. 12 as that of the background sound information generation unit 202 thereof so as to encode the signal versus background sound ratio. In this case, the signal control unit 151 of the receiving unit 15 in FIG. 42 is configured so as to correspond to the control of the decoded signal by the signal versus background sound ratio.

The analysis information generation unit 911 in FIG. 43 encodes and outputs the estimated background sound estimated in the background sound estimation unit 1020 when encoding and outputting the background sound itself as analysis information.

Figure 46:
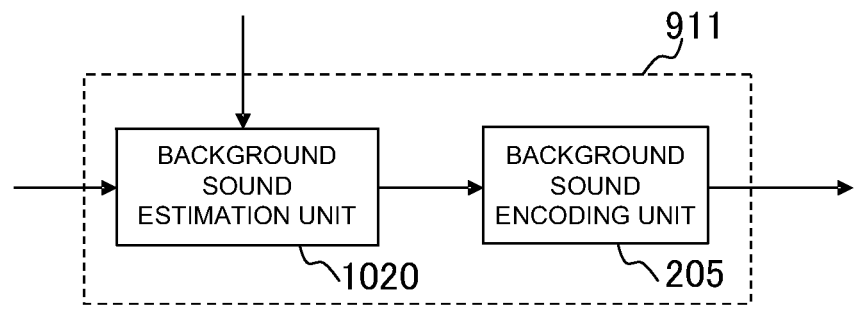
FIG. 46 shows a second configuration example of the analysis information generation unit 911.

A configuration example of the analysis information generation unit 911 for outputting the background sound itself as analysis information will be explained by making a reference to FIG. 46. The analysis information generation unit 911 of this configuration example receives the input signal decomposed into the frequency components and the quantizing distortion quantity of each frequency, and outputs the encoded background sound. The analysis information generation unit 911 is configured of a background sound encoding unit 205 and a background sound estimation unit 1020. An operation of the background sound estimation unit 1020 overlaps the operation explained in FIG. 45, so its explanation is omitted. Further, an operation of the background sound encoding unit 205 overlaps the operation explained in FIG. 13, so its explanation is omitted.

In this case, the signal control unit 151 of the receiving unit 15 in FIG. 42 is configured so as to correspond to the control of the decoded signal by the background sound.

Above, the tenth embodiment of the present invention is for controlling the decoded signal based upon the suppression coefficient in which the quantizing distortion has been taken into consideration, the signal versus background sound ratio, or the background sound. This configuration makes it possible to take a high-quality control in which the quantizing distortion has been taken into consideration at the moment of controlling the decoded signal. In addition, this configuration yields an effect that the quantizing distortion and the encoding distortion, which occur at the moment that the receiving unit 15 performs the decoding, can be reduced.

Next, an eleventh embodiment of the present invention will be explained. The eleventh embodiment of the present invention is for reducing the arithmetic quantity in the transmission side unit, and the arithmetic quantity relating to the control for each component element corresponding to each sound source, which is taken by the receiving side unit based upon the analysis information.

Next, the eleventh embodiment of the present invention will be explained by making a reference to FIG. 47. The eleventh embodiment of the present invention shown in FIG. 47 differs from the first embodiment of the present invention shown in FIG. 1 in a point that the transmission unit 10 is replaced with a transmission unit 13, and a point that the receiving unit 15 is replaced with a receiving unit 18. With this configuration, the eleventh embodiment of the present invention can share the conversion unit existing in the transmission unit, and can share the conversion unit existing in the receiving unit. As a result, the arithmetic quantity of the transmission unit 13 and the receiving unit 18 can be reduced.

Figure 47:
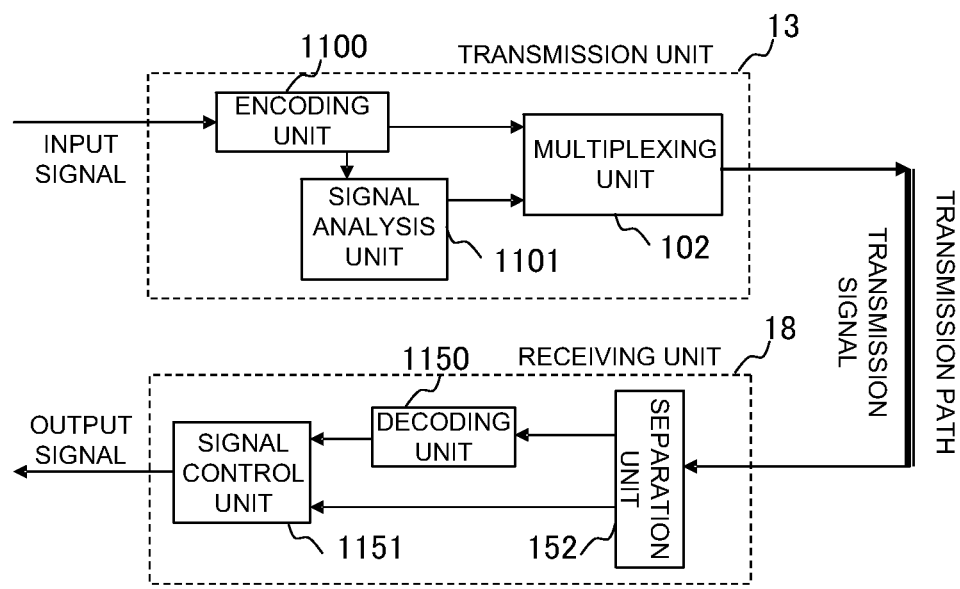
FIG. 47 is a block diagram illustrating an eleventh embodiment of the present invention.

The transmission unit 13 shown in FIG. 47 differs from the transmission unit 10 shown in FIG. 1 in a point that the encoding unit 100 is replaced with an encoding unit 1100, and a point that the signal analysis unit 101 is replaced with a signal analysis unit 1101. In this example, the encoding unit 1100 outputs the input signal decomposed into the frequency components to the signal analysis unit 1101.

Figure 48:
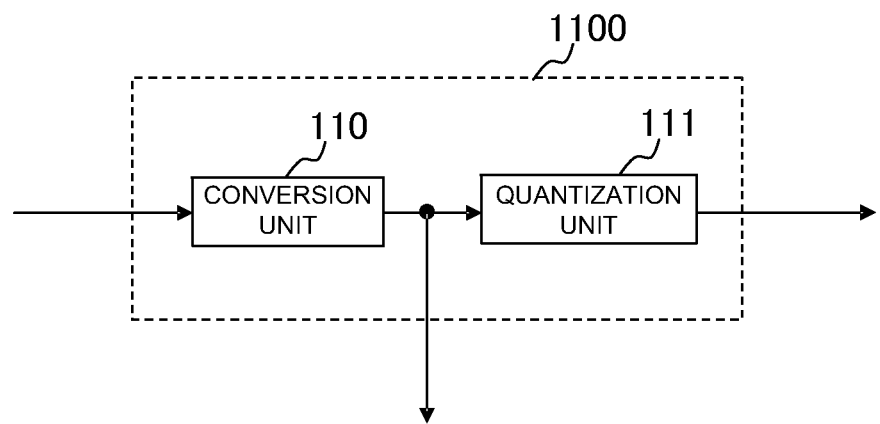
FIG. 48 shows a configuration example of an encoding unit 1100.

A configuration example of the encoding unit 1100 will be explained in details by making a reference to FIG. 48. The encoding unit 1100 shown in FIG. 48 differs from the encoding unit 100 shown in FIG. 2 in a point that the first converted signal, being an output of the conversion unit 110, is outputted to the signal analysis unit 1101. An operation of the conversion unit 110 and the quantization unit 111 overlaps the operation explained in FIG. 2, so its explanation is omitted. Herein, the arithmetic quantity of the encoding unit 1100 is almost identical to that of the encoding unit 100 because the encoding unit 1100 differs from the encoding unit 100 shown in FIG. 2 only in the signal being outputted.

Figure 49:
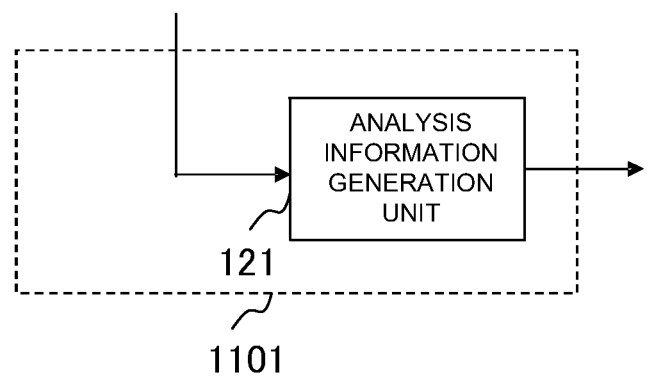
FIG. 49 shows a configuration example of a signal analysis unit 1101.

A configuration example of the signal analysis unit 1101 will be explained in details by making a reference to FIG. 49. The point in which the signal analysis unit 1101 shown in FIG. 49 differs from the signal analysis unit 101 shown in FIG. 4 is that the conversion 120 included in the signal analysis unit 101 is deleted. An operation of the analysis information generation unit 121 overlaps the operation explained in FIG. 4, so its explanation is omitted.

The signal analysis unit 1101 receives the first converted signal from the encoding unit 1100. The received first converted signal is inputted into the analysis information generation unit 121. Herein, upon comparing the conversion unit 110 within the encoding unit 1100 shown in FIG. 48 with the conversion unit 120 within the signal analysis unit 101 shown in FIG. 4, the first converted signal, being an output of the former, and the second converted signal, being an output of the latter, become identical to each other when the input signal being supplied to the conversion unit is identical and an operation of the conversion unit is identical. For this, it is possible to delete the conversion unit 120 in the signal analysis unit 1101, and to use the first converted signal being outputted by the signal analysis unit 1101 as the second converted signal when an operation of the conversion unit 110 is identical to that of the conversion unit 120. With this configuration, the arithmetic quantity of the signal analysis unit 1101 is curtailed by a portion equivalent to the arithmetic quantity of the conversion unit 120 as compared with the arithmetic quantity of the signal analysis unit 101.

With regard to the receiving unit, the receiving unit 18 shown in FIG. 47 differs from the receiving unit 15 shown in FIG. 1 in a point that the decoding unit 150 is replaced with a decoding unit 1150, and a point that the signal control unit 151 is replaced with a signal control unit 1151.

Figure 50:
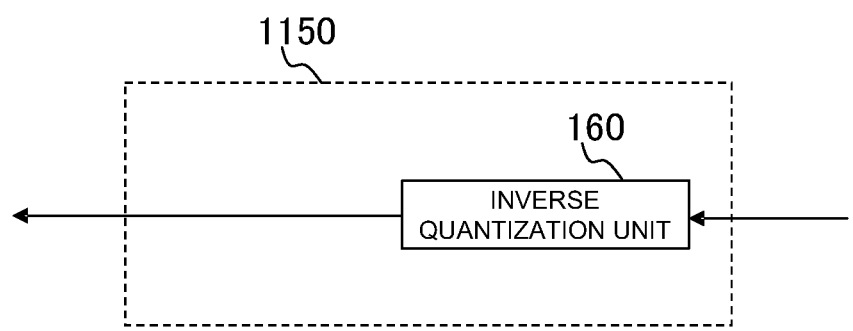
FIG. 50 shows a configuration example of a decoding unit 1150.

A configuration example of the decoding unit 1150 will be explained by making a reference to FIG. 50. The decoding unit 1150 differs from decoding unit 150 shown in FIG. 3 in point that the inverse conversion unit 161 is deleted. An operation of the inverse quantization unit 160 overlap the operation explained in FIG. 3, so its explanation is omitted. In the decoding unit 150 shown in FIG. 3, the inverse conversion unit 161 inverse-converts the first converted signal being outputted by the inverse quantization unit 160 into a time region signal, and outputs it as a decoded signal to the conversion unit 171 shown in FIG. 5. In FIG. 5, the conversion unit 171 performs a process of receiving the decoded signal, and performs a process of converting it into the second converted signal. Herein, as mentioned above, the first converted signal can be used as the second converted signal when an operation of the conversion unit 110 is identical to that of the conversion unit 120. With this, the decoding unit 1150 outputs the first converted signal being outputted by the inverse quantization unit 160 to the signal processing unit 172 being included in the signal control unit 1151 in this embodiment. Thus, in this embodiment, the inverse conversion unit 161 is deleted.

Figure 51:
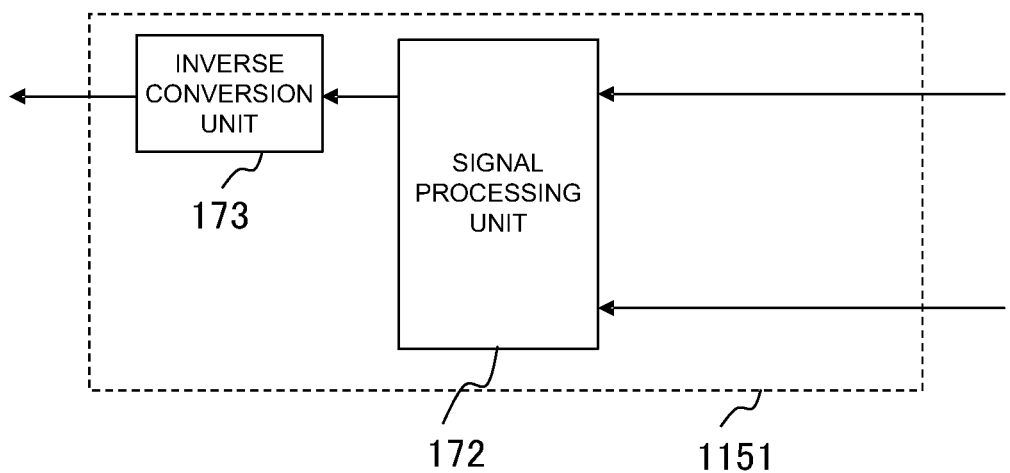
FIG. 51 shows a configuration example of a signal control unit 1151.

A configuration example of the signal control unit 1151 will be explained in details by making a reference to FIG. 51. The signal control unit 1151 shown in FIG. 51 differs from the signal control unit 151 shown in FIG. 5 in point that the conversion unit 171 is deleted. An operation of the signal processing unit 172 and the inverse conversion unit 173 overlaps the operation explained in FIG. 5, so its explanation is omitted.

Figure 5:
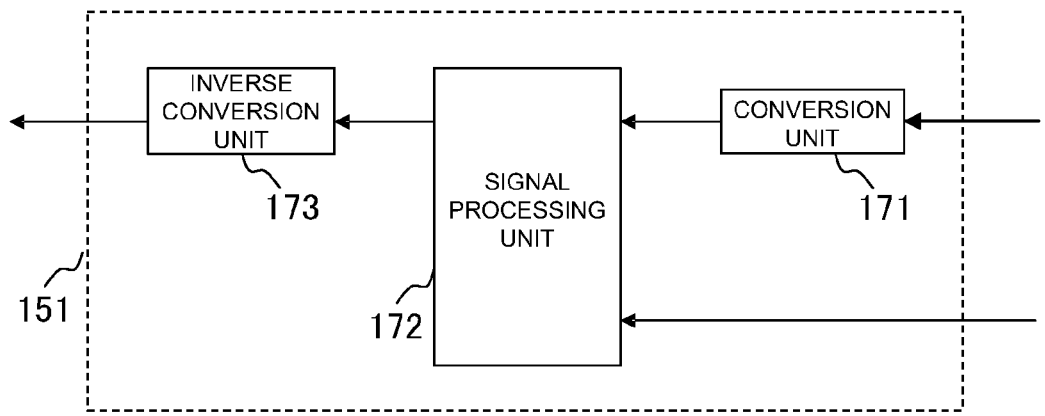
FIG. 5 shows a configuration example of a signal control unit 151.

In the signal control unit 151 of FIG. 5, the conversion unit 171 converts the decoded signal inputted as a time region signal into the second converted signal, and outputs it to the signal processing unit 172. As mentioned above, the first converted signal can be used as the second converted signal when an operation of the conversion unit 110 is identical to that of the conversion unit 120. With this, the signal processing unit 172 being included in the signal control unit 1151 can receive the first converted signal being outputted by the inverse quantization unit 160. Thus, in this example, the conversion unit 171 is deleted.

Herein, upon paying attention to the signal being inputted into the signal control unit 1151 from the decoding unit 1150, it can be seen that a difference between the first embodiment shown in FIG. 1 and the eleventh embodiment shown in FIG. 47 is whether or not the signal being outputted by the inverse quantization unit 160 goes through the inverse conversion unit 161 and the conversion unit 171. When the first converted signal can be used as the second converted signal, the frequency component of the signal being outputted by the inverse quantization unit 160 is identical to the frequency component of the signal being inputted into the signal processing unit 172 in both of the first embodiment and the eleventh embodiment. Thus, the signal processing unit 172 within the signal control unit 1151 outputs a result identical to the result that the signal processing unit 172 shown in FIG. 5 outputs. Further, the arithmetic quantity of the decoding unit 1150 is curtailed by a portion equivalent to the arithmetic quantity of the inverse conversion unit 161 shown in FIG. 3 as compared with the arithmetic quantity of the decoding unit 150. In addition, the arithmetic quantity of the signal control unit 1151 is curtailed by a portion equivalent to the arithmetic quantity of the conversion unit 171 shown in FIG. 5 as compared with the arithmetic quantity of the signal control unit 151.

Above, the eleventh embodiment of the present invention has an effect that the arithmetic quantity is curtailed by a portion equivalent to the respective arithmetic quantities of the conversion unit 120, the inverse conversion unit 161, and the conversion unit 171 as compared with the case of the first embodiment in addition to the effect of the first embodiment of the present invention. In addition, the configuration of the eleventh embodiment capable of curtailing the arithmetic quantity is applicable to the second embodiment to the tenth embodiment. With this, each embodiment has an effect of curtailing the arithmetic quantity that is similar to the effect of the eleventh embodiment of the present invention.

Above, so far, the method of analyzing the input signal that is configured of a plurality of the sound sources, calculating the analysis information, and controlling the decoded signal based upon the analysis information in the receiving side was explained in the first embodiment to the eleventh embodiment of the present invention. Herein, the details will be explained by employing a specific example. As an input signal, for example, there exist sound, musical instrument sound, etc. that differ for each utilization method. In addition to these, operational sound that each machine utters, sound or a foot step of a manipulator, etc. exist in the case of aiming for the monitoring with sound.

The signal analysis control system relating to the present invention is configured to analyze the input signal, and encode the analyzed result as analysis information when a plurality of the component elements exist in the input signal. A configuration similar to the configuration shown in FIG. 1 is applied when a plurality of the component elements exist. The configuration of the signal analysis unit 101 and the signal control unit 151, the information that the signal analysis unit 101 outputs to the multiplexing unit 102, and the information being sent to the signal control unit 151 from the separation unit 152 will be explained in details, respectively.

Figure 52:
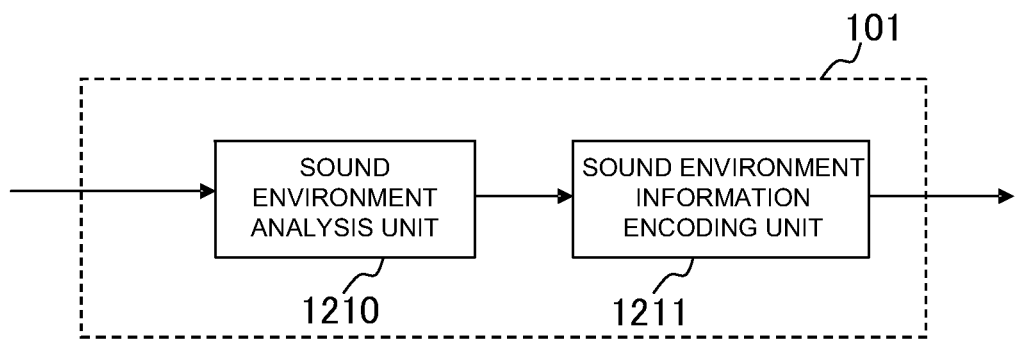
FIG. 52 shows a second configuration example of the signal analysis unit 101.

A second configuration example of the signal analysis unit 101 will be explained in details by making a reference to FIG. 52. The second configuration example of the signal analysis unit 101 is applied when a plurality of the component elements exist. This signal analysis unit 101 is configured of a sound environment analysis unit 1210 and a sound environment information encoding unit 1211. The sound environment analysis unit 1210 analyzes the information of a plurality of the component elements being included in the input signal. The sound environment analysis unit 1210 outputs the component element analysis information to the sound environment information encoding unit 1211. The sound environment information encoding unit 1211 encodes the component element analysis information inputted from the sound environment analysis unit 1210. And, the sound environment information encoding unit 1211 outputs the encoded component element analysis information to the multiplexing unit 102 shown in FIG. 1. Herein, the multiplexing unit 102 shown in FIG. 1 carries out the multiplexing corresponding to the component element analysis information inputted from the sound environment information encoding unit 1211.

The sound environment analysis unit 1210 will be further explained in details.

As a method of analyzing the information of a plurality of the sound sources in the sound environment analysis unit 1210, various methods are employable. For example, as a method of analyzing the information of a plurality of the sound sources, the method of the signal separation disclosed in Non-patent document 11 (Speech Enhancement, Springer, 2005, pp. 371-402) may be employed. Further, as a method of analyzing the information of a plurality of the sound sources, the method of the signal separation, which is called an auditory scene analysis, a computational auditory scene analysis, a single input signal separation, a single channel signal separation, etc., may be employed. With these methods of the signal separation, the sound environment analysis unit 1210 separates the input signal into a plurality of the component elements. In addition, the sound environment analysis unit 1210 converts each separated component elements into the component element analysis information that should be outputted, and outputs it. This component element analysis information can be outputted in various formats. For example, as component element analysis information, there exist the suppression coefficient for suppressing the background sound, a percentage of each component element in each frequency component, and magnitude of each frequency component of the signal of each component element itself. The percentage of the component element includes, for example, an amplitude ratio with the input signal, an energy ratio with the input signal, an average value thereof, etc. The magnitude of each frequency component of the signal includes, for example, an amplitude absolute value, an energy value, an average value thereof, etc. Further, the analysis result itself that should be outputted, or the signal that can be easily converted into the analysis result that should be outputted can be obtained in a way to the signal separation, depending upon the method of the signal separation. In that case, it is also possible to perform the process of obtaining the analysis result that should be outputted in a way to the signal separation without performing the signal separation to the end.

Figure 53:
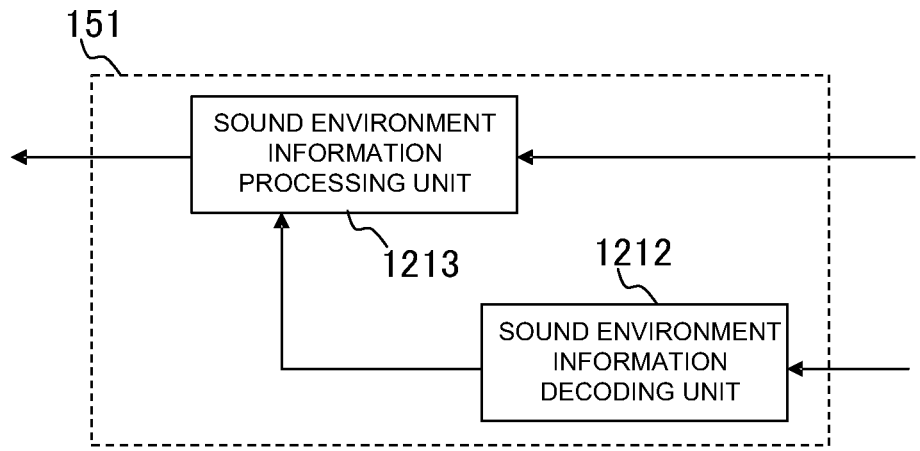
FIG. 53 shows a second configuration example of the signal control unit 151.

A configuration example of the signal control unit 151 will be explained in details by making a reference to FIG. 53. The configuration example of the signal control unit 151 is applied when a plurality of the component elements exist. The signal control unit 151 is configured of a sound environment information decoding unit 1212 and a sound environment information processing unit 1213. The signal control unit 151 receives the decoded signal from the decoding unit 150, and the signal of which the analysis information has been encoded from the separation unit 152. The sound environment information decoding unit 1212 decodes the signal received from the separation unit 152, of which the analysis information has been encoded. The sound environment information decoding unit 1212 outputs the decoded analysis information to the sound environment information processing unit 1213. The above analysis information is equivalent to the analysis information outputted by the sound environment analysis unit 1210 being included in the signal analysis unit 101 shown in FIG. 52. The sound environment information processing unit 1213 controls the decoded signal based upon the analysis information inputted from the sound environment information decoding unit 1212. This method of the control differs depending upon a purpose of the control. For example, the sound environment information processing unit 1213 may take a control for suppressing the background sound similarly to the case of the second embodiment.

Above, when the component elements being included in the input signal exist in plural, applying the present invention yields the effect that is gained in the first embodiment of the present invention.

Above, the first embodiment of the present invention was explained with the configuration, which was applied when the component elements being included in the input signal existed in plural, exemplified. Likewise, a scheme for changing the signal analysis unit, the signal control unit, or the output signal generation unit may employed for the second embodiment to the eleventh embodiment. Further, like the configurations of the fifth embodiment to the eighth embodiment, the control for localizing the output of each component element to the output signal, which is configured of a plurality of the channels, may be taken.

In addition, when the number of the channels of the input signal is plural, as a technique of the analysis in the signal analysis unit 101 of the present invention, the technique, which is called a directivity control, a beamforming, a blind source separation, or an independent component analysis, may be employed. In particular, when the number of the channels of the input signal is larger than the number of the objective sound, the signal may be analyzed not by employing the above-mentioned method of estimating the background sound information or the method of the analysis being employed in a thirteenth embodiment, but by employing only the directivity control, the beamforming, the blind source separation, or the independent component analysis. For example, the technology relating to the directivity control and the beamforming is disclosed in Non-patent document 12 (Microphone arrays, Springer, 2001), and Non-patent document 13 (Speech Enhancement, Springer, 2005, pp. 229-246). Further, the technology relating to the method of the blind source separation and the independent component analysis is disclosed in Non-patent document 14 (Speech Enhancement, Springer, 2005, pp. 271-369).

The configuration shown in FIG. 1 is applied for the first embodiment of the present invention when the foregoing method of the analysis is applied. In addition, the configuration of the signal analysis unit 101, the configuration of the signal control unit 151, the information that the signal analysis unit 101 outputs to the multiplexing unit 102, and the information being sent to the signal control unit 151 from the separation unit 152 will be explained in details. The input signal is a signal of a plurality of the channels. A basic operation, which is similar to the operation of the first embodiment, overlaps the operation explained in FIG. 1, so its explanation is omitted.

A third configuration example of the signal analysis unit 101 will be explained in details by making a reference to FIG. 54. The third configuration example of the signal analysis unit 101 corresponds to the case that the number of the channels of the input signal is plural. The signal analysis unit 101 of this configuration example employs the method of the independent component analysis as a method of analyzing the input signal. The signal analysis unit 101 of this configuration example outputs a filter coefficient for the signal separation of the component element corresponding to each sound source being included in the input signal as analysis information.

The signal analysis unit 101 is configured of a signal separation analysis unit 1200 and a separation filter encoding unit 1201. The signal separation analysis unit 1200 calculates a separation filter coefficient with the method of the independent component analysis. The separation filter coefficient is a filter coefficient that is employed for performing the signal separation of the component element corresponding to each sound source being included in the input signal. And, the signal separation analysis unit 1200 outputs the separation filter coefficient to the separation filter encoding unit 1201. The separation filter encoding unit 1201 encodes the separation filter coefficient inputted from the signal separation analysis unit 1200. The separation filter encoding unit 1201 outputs the encoded separation filter coefficient as analysis information.

A third configuration example of the signal control unit 151 will be explained in details by making a reference to FIG. 55. The third configuration example of the signal control unit 151 corresponds to the case that the number of the channels of the input signal is plural.

The signal control unit 151 is configured of a separation filter decoding unit 1202 and a filter 1203. The separation filter decoding unit 1202 receives the encoded separation filter coefficient as analysis information from the separation unit 152. And, the separation filter decoding unit 1202 decodes the encoded separation filter coefficient, and outputs the separation filter coefficient to the filter 1203. The filter 1203 receives the decoded signal of a plurality of the channels from the decoding unit 150, and receives the separation filter coefficient from the separation filter decoding unit 1202. And, the filter 1203 performs the filtering process based upon the separation filter coefficient for the decoded signal of a plurality of the channels. The filter 1203 outputs the signal in which the signal of the component element corresponding to each sound source has been separated.

As explained above, in the signal analysis control system of the present invention, the transmission unit analyzes the input signal when the number of the channels of the input signal is plural. This configuration enables the receiving unit to control the input signal, which is configured of a plurality of the sound sources, for each component element corresponding to each sound source based upon the information of the signal analysis made by the transmission unit also when the number of the channels of the input signal is plural. In addition, the receiving unit can curtail the arithmetic quantity relating to the signal analysis because the transmission unit analyzes the signal.

Figure 54:
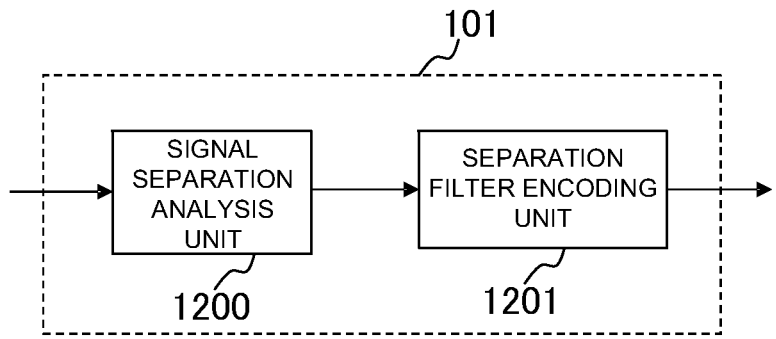
FIG. 54 shows a third configuration example of the signal analysis unit 101.
Figure 55:
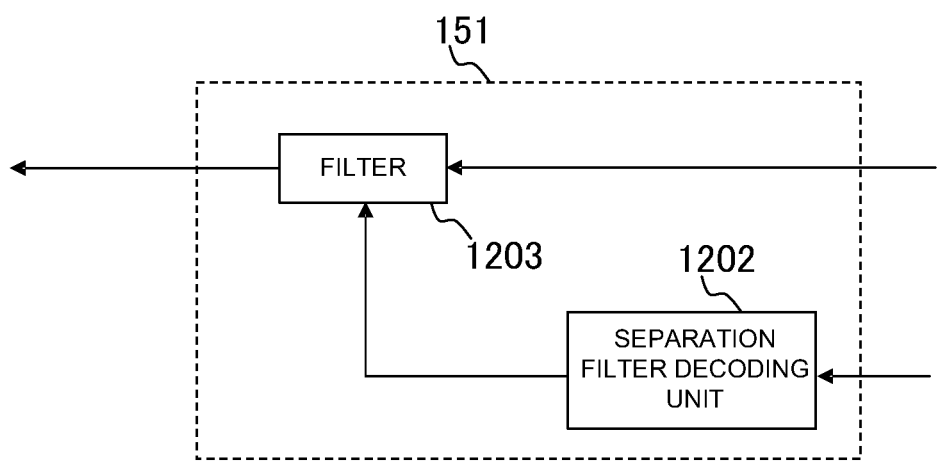
FIG. 55 shows a third configuration example of the signal control unit 151.

Further, while the filter coefficient of the separation filter was employed as analysis information of the input signal in the configuration examples shown in FIG. 54 and FIG. 55, the analysis information employed in the first embodiment to the eleventh embodiment may be employed. For this, it is enough for the signal separation analysis unit 1200 shown in FIG. 54 to be configured so as to calculate the separation filter, and to perform the signal separation employing the separation filter. With this, the separation filter encoding unit 1201 is configured of the sound environment information encoding unit 1211 shown in FIG. 52.

In addition, not only of the method of the independent component analysis but also the methods disclosed in the Non-patent documents 12 to 15 may be employed as a method of analyzing the input signal in the signal analysis unit 101. Further, these methods of the analysis may be combined with the methods of the analysis in the first embodiment to the eleventh embodiment of the present invention, and employed. In addition, the analysis result that should be outputted, or the signal that can be easily converted into the analysis result that should be outputted can be obtained in a way to the analysis, depending upon the method of the analysis. In that case, the process of the analysis may be changed so that the analysis result is outputted without the analysis performed to the end.

Figure 56:
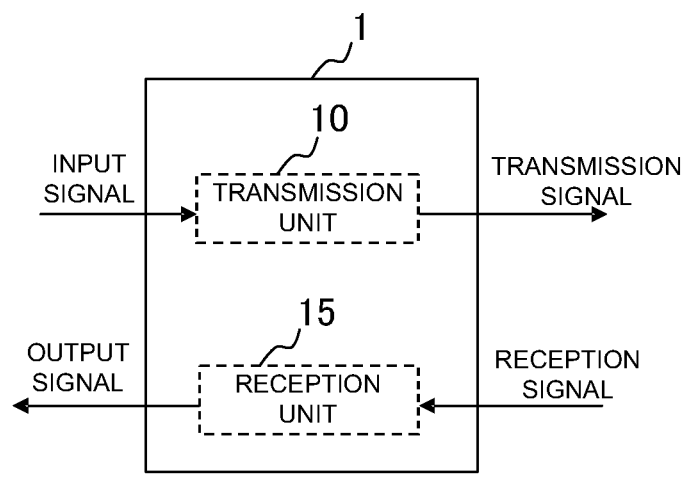
FIG. 56 is a block diagram illustrating a twelfth embodiment of the present invention.

The twelfth embodiment of the present invention will be explained by making a reference to FIG. 56. Only One-way communication was taken into consideration in the embodiments ranging from the first embodiment up to the eleventh embodiment. That is, the communication between the transmission unit integrally built in a terminal and the receiving unit integrally built in another terminal was explained. In the twelfth embodiment, which takes bilateral communication into consideration, both of the transmission unit and the receiving unit for which the present invention has been applied are integrally built in one transmission/reception terminal. As a terminal having both of the transmission unit and the receiving unit integrally built therein, for which the present invention has been applied, a combination of any of the transmission units of the first embodiment to the eleventh embodiment, and any of the receiving units of the first embodiment to the eleventh embodiment may employed. In the twelfth embodiment of the present invention, incorporating both of the transmission unit and the receiving unit into the terminal yields an effect of the present invention at the moment of utilizing it for the bilateral communication devices such as a television conference terminal and a mobile telephone.

The signal analysis control system of the present invention is applicable in the case that the one-way sound communication is made, for example, in the case of a broadcast. It is enough for the transmission terminal of a broadcast station to have, for example, at least the transmission unit 10 shown in FIG. 1. The so-called broadcast station includes not only a licensed broadcast station but also a point in which sound is transmitted and no reception is almost performed, for example, a main site of a multi-point television conference. Any of the transmission units of the second embodiment to the eleventh embodiment of the present invention may be employed for this transmission terminal.

Further, the signal analysis control system of the present invention is applicable to a point as well in which only the reception is performed. It is enough for the reception terminal in a point in which only the reception is performed to have, for example, at least the receiving unit 15 shown in FIG. 1. Any of the receiving units of the second embodiment to the eleventh embodiment of the present invention may be employed for this reception terminal.

Figure 57:
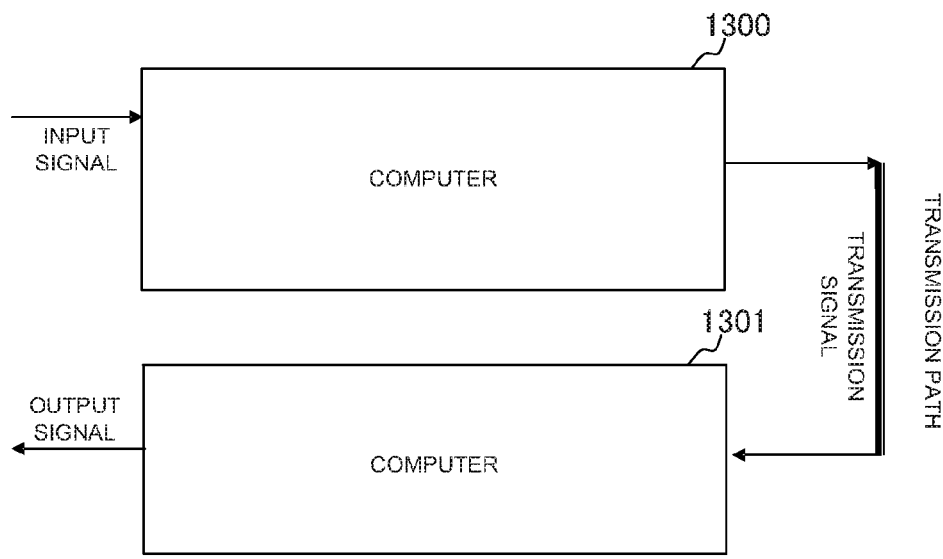
FIG. 57 s a block diagram illustrating a thirteenth embodiment of the present invention.
Figure 58:
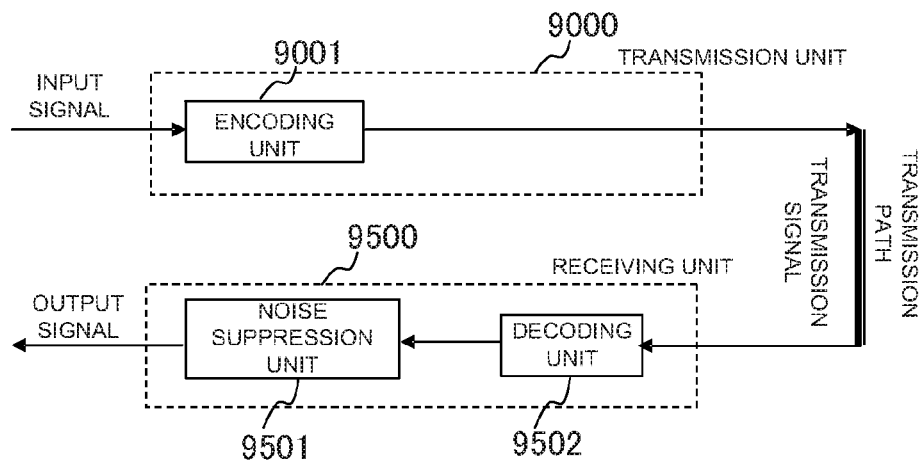
FIG. 58 is a block diagram illustrating the conventional example.

In addition, the signal process device based upon the thirteenth embodiment of the present invention will be explained in details by making a reference to FIG. 57. The thirteenth embodiment of the present invention is configured of computers 1300 and 1301 each of which operates under a program control. The computer could be any of a central processing device, a processor, and a data processing device.

The computer 1300, which performs a process relating to any of the first embodiment to the twelfth embodiment, operates based upon a program for receiving the input signal and outputting the transmission signal. On the other hand, the computer 1301, which performs a process relating to any of the first embodiment to the twelfth embodiment, operates based upon a program for receiving the transmission signal and outputting the output signal. Additionally, in the case of having both of the transmission unit and receiving unit explained in the twelfth embodiment, the transmission process and the reception process may be executed by employing the identical computer.

While in the first embodiment to the thirteenth embodiment explained above, the operations of the transmission unit, the transmission path, and the receiving unit were exemplified, they may be replaced with the recoding unit, the storage medium, and the reproduction unit, respectively. For example, the transmission unit 10 shown in FIG. 1 may output the transmission signal as a bit stream to the storage medium, and record the bit stream into the storage medium. Further, the receiving unit 15 may take out the bit stream recorded into the storage medium, and generate the output signal by decoding the bit stream and performing a process therefor.

Above, while the present invention has been described with respect to the preferred embodiments and examples, the present invention is not always limited to the above-mentioned embodiment and examples, and alterations to, variations of, and equivalent to these embodiments and the examples can be implemented without departing from the spirit and scope of the present invention.

The 1st invention inventions is characterized in that a signal analysis device, comprising: a signal receiving unit for receiving an input signal including a plurality of component elements; and a signal analysis unit for generating analysis information indicative of a relation between said plurality of component elements from said input signal.

In addition, the 2nd invention in the above-mentioned 1st invention is characterized in that said component element includes objective sound and background sound.

In addition, the 3rd invention in the above-mentioned 1st invention is characterized in that said signal analysis unit comprises: a conversion unit for generating a converted signal in which said input signal has been decomposed into frequency components; and an analysis information generation unit for decomposing said converted signal into said plurality of component elements and generating said analysis information.

In addition, the 4th invention in the above-mentioned 3rd invention is characterized in that said component element includes objective sound and background sound.

In addition, the 5th invention in the above-mentioned 4th invention is characterized in that said analysis information generation unit comprises: a background sound estimation unit for estimating the background sound from said converted signal; and a background sound information generation unit for generating a suppression coefficient for suppressing the background sound from said converted signal and said estimated background sound.

In addition, the 6th invention in the above-mentioned 4th invention is characterized in that said analysis information generation unit comprises: a background sound estimation unit for estimating the background sound from said converted signal; and a background sound information generation unit for generating a ratio of the objective sound and the background sound from said converted signal and said estimated background sound.

In addition, the 7th invention in the above-mentioned 4th invention is characterized in that said analysis information generation unit comprises a background sound estimation unit for estimating the background sound from said converted signal.

In addition, the 8th invention inventions is characterized in that a signal control device, comprising: a signal receiving unit for receiving a signal including a plurality of component elements, and analysis information indicative of a relation between said plurality of component elements; and a signal control unit for controlling a relation between said plurality of component elements based upon said analysis information.

In addition, the 9th invention in the above-mentioned 8th invention is characterized in that said component element includes objective sound and background sound.

In addition, the 10th invention in the above-mentioned 8th invention is characterized in that said signal control unit comprises: a conversion unit for generating a converted signal in which said signal has been decomposed into frequency components; and a signal processing unit for controlling a relation between said plurality of component elements being included in said converted signal based upon said analysis information.

In addition, the 11th invention in the above-mentioned 10th invention is characterized in that said component element includes objective sound and background sound.

In addition, the 12th invention in the above-mentioned 11th invention is characterized in that said analysis information includes a suppression coefficient for suppressing said background sound; and said signal processing unit comprises a multiplication unit for multiplying said converted signal by said suppression coefficient.

In addition, the 13th invention in the above-mentioned 11th invention is characterized in that said analysis information includes objective sound versus background sound ratio information indicative of a ratio of said objective sound and said background sound; and said signal processing unit comprises: a suppression coefficient generation unit for generating a suppression coefficient for suppressing said background sound from said objective sound versus background sound ratio information; and a multiplication unit for multiplying said converted signal by said suppression coefficient.

In addition, the 14th invention in the above-mentioned 11th invention is characterized in that said analysis information includes background sound information indicative of said background sound; and said signal processing unit comprises: a suppression coefficient generation unit for generating a suppression coefficient for suppressing said background sound from said background sound information; and a multiplication unit for multiplying said converted signal by said suppression coefficient.

In addition, the 15th invention in the above-mentioned 11th invention is characterized in that said analysis information includes background sound information indicative of said background sound; and said signal processing unit comprises a subtraction unit for subtracting said background sound from said converted signal based upon said background sound information.

In addition, the 16th invention inventions is characterized in that a signal control device, comprising: a signal receiving unit for receiving a signal including a plurality of component elements, and analysis information indicative of a relation between said plurality of component elements; and a signal control unit for receiving signal control information for controlling a specific component element, and controlling said plurality of component elements based upon said analysis information and said signal control information.

In addition, the 17th invention in the above-mentioned 16th invention is characterized in that said component element includes objective sound and background sound.

In addition, the 18th invention in the above-mentioned 16th invention is characterized in that said signal control unit comprises: a conversion unit for generating a converted signal in which said signal has been decomposed into frequency components; and a signal processing unit for controlling said plurality of component elements being included in said converted signal based upon said analysis information and said signal control information.

In addition, the 19th invention in the above-mentioned 18th invention is characterized in that said component element includes objective sound and background sound.

In addition, the 20th invention in the above-mentioned 19th invention is characterized in that said analysis information includes a suppression coefficient for suppressing said background sound; and said signal processing unit comprises: a suppression coefficient modification unit for modifying said suppression coefficient based upon said signal control information; and a multiplication unit for multiplying said converted signal by said modified suppression coefficient.

In addition, the 21th invention in the above-mentioned 20th invention is characterized in that said suppression coefficient modification unit comprises a multiplication unit for multiplying said suppression coefficient by said signal control information.

In addition, the 22th invention in the above-mentioned 20th invention is characterized in that said suppression coefficient modification unit comprises a comparison unit for comparing said suppression coefficient with said signal control information.

In addition, the 23th invention in the above-mentioned 20th invention is characterized in that said suppression coefficient modification unit comprises: a multiplication unit for multiplying said suppression coefficient by said signal control information; a comparison unit for comparing said suppression coefficient with said signal control information; and a selection unit for selecting a result by said multiplication unit and a result by said comparison unit based upon said signal control information.

In addition, the 24th invention in the above-mentioned 23th invention is characterized in that said signal control information includes at least one of a maximum value and a minimum value of the suppression coefficient.

In addition, the 25th invention in the above-mentioned 19th invention is characterized in that said analysis information includes objective sound versus background sound ratio information indicative of a ratio of said objective sound and said background sound; and wherein said signal processing unit comprises: an objective sound versus background sound ratio information modification unit for modifying said objective sound versus background sound ratio information based upon said signal control information; a suppression coefficient conversion unit for converting said modified objective sound versus background sound ratio into a suppression coefficient; and a multiplication unit for multiplying said converted signal by said suppression coefficient.

In addition, the 26th invention in the above-mentioned 19th invention is characterized in that said analysis information includes objective sound versus background sound ratio information indicative of a ratio of said objective sound and said background sound; and said signal processing unit comprises: a suppression coefficient conversion unit for converting said objective sound versus background sound ratio into a suppression coefficient; a suppression coefficient modification unit for modifying said suppression coefficient based upon said signal control information; and a multiplication unit for multiplying said converted signal by said modified suppression coefficient.

In addition, the 27th invention in the above-mentioned 19th invention is characterized in that said analysis information includes background sound information indicative of said background sound; and said signal processing unit comprises: a background sound information modification unit for modifying said background sound information based upon said signal control information; a suppression coefficient conversion unit for converting said modified background sound information into a suppression coefficient; and a multiplication unit for multiplying said converted signal by said suppression coefficient.

In addition, the 28th invention in the above-mentioned 19th invention is characterized in that said analysis information includes background sound information indicative of said background sound; and said signal processing unit comprises: a suppression coefficient conversion unit for converting said background sound information into a suppression coefficient; a suppression coefficient modification unit for modifying said suppression coefficient based upon said signal control information; and a multiplication unit for multiplying said converted signal by said modified suppression coefficient.

In addition, the 29th invention in the above-mentioned 19th invention is characterized in that said analysis information includes background sound information indicative of said background sound; and said signal processing unit comprises: a background sound information modification unit for modifying said background sound information based upon said signal control information; and a subtraction unit for subtracting said modified background sound information from said converted signal.

In addition, the 30th invention is characterized in that a signal control device, comprising: a signal receiving unit for receiving a signal including a plurality of component elements, and analysis information indicative of a relation between said plurality of component elements; and an output signal generation unit for receiving component element rendering information for controlling an output of said component element, controlling said component element based upon said analysis information and said component element rendering information, and generating an output signal.

In addition, the 31st invention in the above-mentioned 30th invention is characterized in that said output signal generation unit comprises a component element information conversion unit for converting said component element rendering information into rendering information indicative of a relation between said signal and said output signal based upon said analysis information.

In addition, the 32nd invention in the above-mentioned 30th invention is characterized in that said output signal generation unit receives signal control information for controlling a specific component element, controls said component element based upon said signal control information, said analysis information, and said component element rendering information, and generates the output signal.

In addition, the 33rd invention in the above-mentioned 32nd invention is characterized in that said output signal generation unit comprises: a signal control unit for generating a parameter indicative of a relation between said signal and said component element based upon said signal and said analysis information, and modifying said parameter based upon said signal control information; and a component element information conversion unit for converting said component element rendering information into rendering information indicative of a relation between said signal and said output signal based upon said modified parameter.

In addition, the 34th invention in the above-mentioned 32nd invention is characterized in that said output signal generation unit comprises: a signal control unit for generating a parameter indicative of a relation between said signal and said component element based upon said analysis information and said signal control information, and modifying said parameter based upon said signal control information; and a component element information conversion unit for converting said component element rendering information into rendering information indicative of a relation between said signal and said output signal based upon said modified parameter.

In addition, the 35th invention in the above-mentioned 33rd or 34th inventions is characterized in that said signal control device comprising a rendering unit for converting said signal based upon said rendering information, and generating said output signal.

In addition, the 36th invention in the above-mentioned 30th invention is characterized in that said component element includes objective sound and background sound.

In addition, the 37th invention in the above-mentioned 35th invention is characterized in that said output signal generation unit comprises a component element information conversion unit for converting said component element rendering information into rendering information indicative of a relation between said signal and said output signal based upon said analysis information.

In addition, the 38th invention in the above-mentioned 36th invention is characterized in that said analysis information includes a suppression coefficient for suppressing said background sound; and said output signal generation unit comprises: a signal control unit for generating a component element parameter for controlling said component element based upon said suppression coefficient; and a component element information conversion unit for converting said component element rendering information into rendering information indicative of a relation between said signal and said output signal based upon said component element parameter.

In addition, the 39th invention in the above-mentioned 36th invention is characterized in that said analysis information includes objective sound versus background sound ratio information indicative of a ratio of said objective sound and said background sound; and said output signal generation unit comprises: a signal control unit for generating a component element parameter for controlling said component element based upon said objective sound versus background sound ratio information; and a component element information conversion unit for converting said component element rendering information into rendering information indicative of a relation between said signal and said output signal based upon said component element parameter.

In addition, the 40th invention in the above-mentioned 36th invention is characterized in that said analysis information includes background sound information indicative of said background sound; and said output signal generation unit comprises: a signal control unit for generating a component element parameter for controlling said component element based upon said signal and said background sound information; and a component element information conversion unit for converting said component element rendering information into rendering information indicative of a relation between said signal and said output signal based upon said component element parameter.

In addition, the 41st invention in the above-mentioned any one of 38th to 40th inventions is characterized in that said signal control device comprising a rendering unit for converting said signal and generating said output signal based upon said rendering information.

In addition, the 42nd invention is characterized in that a signal analysis method, comprising generating analysis information from an input signal including a plurality of component elements, said analysis information indicating a relation between said plurality of component elements.

In addition, the 43rd invention in the above-mentioned 42nd invention is characterized in that said component element includes objective sound and background sound.

In addition, the 44th invention in the above-mentioned 42nd invention is characterized in that said signal analysis method comprising: generating a converted signal in which said input signal has been decomposed into frequency components; and decomposing said converted signal into said plurality of component elements, and generating said analysis information.

In addition, the 45th invention in the above-mentioned 42nd invention is characterized in that said component element includes objective sound and background sound.

In addition, the 46th invention in the above-mentioned 45th invention is characterized in that said signal analysis method comprising: estimating the background sound from said converted signal; and generating a suppression coefficient for suppressing the background sound from said converted signal and said estimated background sound as said analysis information.

In addition, the 47th invention in the above-mentioned 44th invention is characterized in that a signal analysis method comprising: estimating background sound from said converted signal; and generating a ratio of objective sound and the background sound from said converted signal and said estimated background sound as said analysis information.

In addition, the 48th invention in the above-mentioned 44th invention is characterized in that said signal analysis method comprising estimating the background sound from said converted signal.

In addition, the 49th invention is characterized in that a signal control method, comprising: receiving a signal including a plurality of component elements, and analysis information indicative of a relation between said plurality of component elements; and controlling a relation between said plurality of component elements based upon said analysis information.

In addition, the 50th invention in the above-mentioned 49th invention is characterized in that said component element includes objective sound and background sound.

In addition, the 51st invention in the above-mentioned 49th invention is characterized in that said signal control method comprising: generating a converted signal in which said signal has been decomposed into frequency components; and controlling a relation between said plurality of component elements being included in said converted signal based upon said analysis information.

In addition, the 52nd invention in the above-mentioned 51st invention is characterized in that said component element includes objective sound and background sound.

In addition, the 53rd invention in the above-mentioned 52nd invention is characterized in that said analysis information includes a suppression coefficient for suppressing said background sound; and said signal control method comprises multiplying said converted signal by said suppression coefficient, and taking a control based upon this multiplication result.

In addition, the 54th invention in the above-mentioned 52nd invention is characterized in that said analysis information includes objective sound versus background sound ratio information indicative of a ratio of said objective sound and said background sound; and said signal control method comprises: generating a suppression coefficient for suppressing said background sound from said objective sound versus background sound ratio information; and multiplying said converted signal by said suppression coefficient, and taking a control based upon this multiplication result.

In addition, the 55th invention in the above-mentioned 52nd invention is characterized in that said analysis information includes background sound information indicative of said background sound; and said signal control method comprises: generating a suppression coefficient for suppressing said background sound from said background sound information; and multiplying said converted signal by said suppression coefficient, and taking a control based upon this multiplication result.

In addition, the 56th invention in the above-mentioned 52nd invention is characterized in that said analysis information includes background sound information indicative of said background sound; and said signal control method comprises subtracting said background sound from said converted signal based upon said background sound information, and taking a control based upon this subtraction result.

In addition, the 57th invention is characterized in that a signal control method, comprising receiving a signal including a plurality of component elements, and analysis information indicative of a relation between said plurality of component elements, and signal control information for controlling a specific component element, and controlling said plurality of component elements based upon said analysis information and said signal control information.

In addition, the 58th invention in the above-mentioned 57th invention is characterized in that said component element includes objective sound and background sound.

In addition, the 59th invention in the above-mentioned 57th invention is characterized in that said signal control method comprising: generating a converted signal in which said signal has been decomposed into frequency components; and controlling said plurality of component elements being included in said converted signal based upon said analysis information and said signal control information.

In addition, the 60th invention in the above-mentioned 59th invention is characterized in that said component element includes objective sound and background sound.

In addition, the 61th invention in the above-mentioned 60th invention is characterized in that said analysis information includes a suppression coefficient for suppressing said background sound; and said signal control method comprises: modifying said suppression coefficient based upon said signal control information; and multiplying said converted signal by said modified suppression coefficient, and taking a control based upon this multiplication result.

In addition, the 62th invention in the above-mentioned 61st invention is characterized in that said signal control method comprising multiplying said suppression coefficient by said signal control information, and modifying the suppression coefficient.

In addition, the 63rd invention in the above-mentioned 61st invention is characterized in that said signal control method comprising comparing said suppression coefficient with said signal control information, and modifying the suppression coefficient.

In addition, the 64th invention in the above-mentioned 61st invention is characterized in that said a signal control method comprising: multiplying said suppression coefficient by said signal control information; comparing said suppression coefficient with said signal control information; and modifying the suppression coefficient by employing one of said result by a multiplication unit and said result by a comparison unit based upon said signal control information.

In addition, the 65th invention in the above-mentioned 64th invention is characterized in that said signal control information includes at least one of a maximum value and a minimum value of the suppression coefficient.

In addition, the 66th invention in the above-mentioned 60th invention is characterized in that said analysis information includes objective sound versus background sound ratio information indicative of a ratio of said objective sound and said background sound; and wherein said signal control method comprises: modifying said objective sound versus background sound ratio information based upon said signal control information; converting said modified objective sound versus background sound ratio into a suppression coefficient; and multiplying said converted signal by said suppression coefficient, and taking a control based upon this multiplication result.

In addition, the 67th invention in the above-mentioned 60th invention is characterized in that said analysis information includes objective sound versus background sound ratio information indicative of a ratio of said objective sound and said background sound; and wherein said signal control method comprises: converting said objective sound versus background sound ratio into a suppression coefficient; modifying said suppression coefficient based upon said signal control information; and multiplying said converted signal by said modified suppression coefficient, and taking a control based upon this multiplication result.

In addition, the 68th invention in the above-mentioned 60th invention is characterized in that said analysis information includes background sound information indicative of said background sound; and said signal control method comprises: modifying said background sound information based upon said signal control information; converting said modified background sound information into a suppression coefficient; and multiplying said converted signal by said suppression coefficient, and taking a control based upon this multiplication result.

In addition, the 69th invention in the above-mentioned 60th invention is characterized in that said analysis information includes background sound information indicative of said background sound; and said signal control method comprises: converting said background sound information into a suppression coefficient; modifying said suppression coefficient based upon said signal control information; and multiplying said converted signal by said modified suppression coefficient, and taking a control based upon this multiplication result.

In addition, the 70th invention in the above-mentioned 60th invention is characterized in that said analysis information includes background sound information indicative of said background sound; and said signal control method comprises: modifying said background sound information based upon said signal control information; and subtracting said modified background sound information from said converted signal, and taking a control based upon this subtraction result.

In addition, the 71st invention is characterized in that a signal control method, comprising: receiving a signal including a plurality of component elements, analysis information indicative of a relation between said plurality of component elements, and component element rendering information for controlling an output of said component element; and controlling said component element based upon said analysis information and said component element rendering information, and generating an output signal.

In addition, the 72th invention in the above-mentioned 71th invention is characterized in that said signal control method comprising converting said component element rendering information into rendering information indicative of a relation between said signal and said output signal based upon said analysis information.

In addition, the 73th invention in the above-mentioned 71th invention is characterized in that said signal control method comprising receiving signal control information for controlling a specific component element, controlling said component element based upon said signal control information, said analysis information, and said component element rendering information, and generating the output signal.

In addition, the 74th invention in the above-mentioned 73rd invention is characterized in that said signal control method comprising: generating a parameter indicative of a relation between said signal and said component element based upon said signal and said analysis information, and modifying said parameter based upon said signal control information; and converting said component element rendering information into rendering information indicative of a relation between said signal and said output signal based upon said modified parameter.

In addition, the 75th invention in the above-mentioned 73rd invention is characterized in that said signal control method comprising: generating a parameter indicative of a relation between said signal and said component element based upon said analysis information and said signal control information, and modifying said parameter based upon said signal control information; and converting said component element rendering information into rendering information indicative of a relation between said signal and said output signal based upon said modified parameter.

In addition, the 76th invention in the above-mentioned 74th or 75th inventions is characterized in that said signal control method comprising converting said signal based upon said rendering information, and generating said output signal.

In addition, the 77th invention in the above-mentioned 71th invention is characterized in that said component element includes objective sound and background sound.

In addition, the 78th invention in the above-mentioned 76th invention is characterized in that said signal control method comprising converting said component element rendering information into rendering information indicative of a relation between said signal and said output signal based upon said analysis information.

In addition, the 79th invention in the above-mentioned 77th invention is characterized in that said analysis information includes a suppression coefficient for suppressing said background sound; and said signal control method comprises: generating a component element parameter for controlling said component element based upon said suppression coefficient; and converting said component element rendering information into rendering information indicative of a relation between said signal and said output signal based upon said component element parameter.

In addition, the 80th invention in the above-mentioned 77th invention is characterized in that said analysis information includes objective sound versus background sound ratio information indicative of a ratio of said objective sound and said background sound; and said signal control method comprises: generating a component element parameter for controlling said component element based upon said objective sound versus background sound ratio information; and converting said component element rendering information into rendering information indicative of a relation between said signal and said output signal based upon said component element parameter.

In addition, the 81st invention in the above-mentioned 77th invention is characterized in that said analysis information includes background sound information indicative of said background sound; and said signal control method comprises: generating a component element parameter for controlling said component element based upon said signal and said background sound information; and converting said component element rendering information into rendering information indicative of a relation between said signal and said output signal based upon said component element parameter.

In addition, the 82nd invention in the above-mentioned any one of 79th to 81st inventions is characterized in that said signal control method comprising converting said signal and generating said output signal based upon said rendering information.

In addition, the 83rd invention is characterized in that a system comprising: a signal receiving unit for receiving a signal including a plurality of component elements; a signal analysis unit for generating analysis information indicative of a relation between said plurality of component elements from said signal; a signal receiving unit for receiving said signal including said plurality of component elements, and said analysis information; and a signal control unit for controlling a relation between said plurality of component elements based upon said analysis information.

In addition, the 84th invention is characterized in that a system comprising: a signal receiving unit for receiving a signal including a plurality of component elements; a signal analysis unit for generating analysis information indicative of a relation between said plurality of component elements from said signal; a signal receiving unit for receiving said signal including said plurality of component elements, and said analysis information; and a signal control unit for receiving signal control information for controlling a specific component element, and controlling said plurality of component elements based upon said analysis information and said signal control information.

In addition, the 85th invention is characterized in that a system comprising: a signal receiving unit for receiving a signal including a plurality of component elements; a signal analysis unit for generating analysis information indicative of a relation between said plurality of component elements from said signal; a signal receiving unit for receiving said signal including said plurality of component elements, and said analysis information; and an output signal generation unit for receiving component element rendering information for controlling an output of said component element, controlling said component element based upon said analysis information and said component element rendering information, and generating an output signal.

In addition, the 86th invention is characterized in that a signal analysis program, said program causing an information processing device to execute: a signal receiving process of receiving an input signal including a plurality of component elements; and a signal analysis process of generating analysis information indicative of a relation between said plurality of component elements from said input signal.

In addition, the 87th invention is characterized in that a signal control program, comprising: a signal receiving process of receiving a signal including a plurality of component elements, and analysis information indicative of a relation between said plurality of component elements; and a signal control process of controlling a relation between said plurality of component elements based upon said analysis information.

In addition, the 85th invention is characterized in that a signal control program, said program causing an information processing device to execute: a signal receiving process of receiving a signal including a plurality of component elements and analysis information indicative of a relation between said plurality of component elements; and a signal control process of receiving signal control information for controlling a specific component element, and controlling said plurality of component elements based upon said analysis information and said signal control information.

In addition, the 89th invention is characterized in that a signal control program, comprising: a signal receiving process of receiving a signal including a plurality of component elements, and analysis information indicative of a relation between said plurality of component elements; and an output signal generation process of receiving component element rendering information for controlling an output of said component element, controlling said component element based upon said analysis information and said component element rendering information, and generating an output signal.

This application is based upon and claims the benefit of priority from Japanese patent application No. 2007-168544, filed on Jun. 27, 2007, the disclosure of which is incorporated herein in its entirety by reference.

APPLICABILITY IN INDUSTRY

The present invention may be applied to an apparatus that performs signal analysis or signal control. The present invention may also be applied to a program that causes an information processing device to execute signal analysis or signal control.

The invention claimed is:

1. A signal analysis device in a signal analysis control system having the signal analysis device and a signal control device capable of conducting transmission and reception of a signal via a network or a recording medium, comprising:
   a processor programmed to:
   input an input signal of a single channel to be transmitted to said signal control device, including objective sound and background sound;
   decompose said input signal into frequency components to obtain a converted signal, estimate said background sound from said converted signal, calculate a suppression coefficient to be applied said signal including objective sound and background sound, based upon the converted signal and an information of the estimated background sound, for suppressing said background sound by said signal control device, encode said suppression coefficient to generate analysis information; and
   transmit said signal of said single channel including objective sound and said background sound and said analysis information to said signal control device via a network or a recording medium, wherein said signal including objective sound and background sound is transmitted without separating objective sound and background sound.

2. A signal control device in a signal analysis control system having a signal analysis device and the signal control device capable of conducting transmission and reception of a signal via a network or a recording medium, comprising:
   a processor programmed to:
   receive, from said signal analysis device, a signal of a single channel including objective sound and background sound that objective sound and background sound are not separated, and analysis information in which a suppression coefficient to be applied said signal including objective sound and background sound for suppressing said background sound was encoded, via a network or a recording medium, wherein said suppression coefficient was generated based upon a converted signal that obtained by decomposing said signal into frequency components, and an information of the background sound that estimated from said converted signal; and
   suppress and control said background sound based upon said analysis information.

3. A signal control device in a signal analysis control system having a signal analysis device and the signal control device capable of conducting transmission and reception of a signal via a network or a recording medium, comprising:
   a processor programmed to:
   receive a signal of a single channel including objective sound and background sound that objective sound and background sound are not separated, and analysis information in which a suppression coefficient to be applied said signal including objective sound and background sound for suppressing said background sound was encoded, from said signal analysis device, via a network or a recording medium; and
   obtain a signal control information for modifying said suppression coefficient, obtain said suppression coefficient by decoding the received analysis information, modify said suppression coefficient based upon said signal control information, suppress and control said background sound based upon the modified suppression coefficient.

4. A signal control device in a signal analysis control system having a signal analysis device and the signal control device capable of conducting transmission and reception of a signal via a network or a recording medium, comprising:
   a processor programmed to:
   receive, from said signal analysis device, a signal of a single channel including objective sound and background sound that objective sound and background sound are not separated, and analysis information in which a suppression coefficient to be applied said signal including objective sound and background sound for suppressing said background sound was encoded, via a network or a recording medium; and
   receive component element rendering information for controlling a localization of said objective sound and said background sound, suppress and control said background sound based upon said analysis information and said component element rendering information, and generate an output signal in which the localization of said objective sound is controlled.

5. A signal control device according to claim 4, wherein the processor is further programmed to:
   receive signal control information for controlling a specific component element, control said component element based upon said signal control information, said analysis information, and said component element rendering information, and generate the output signal.

6. A signal control device according to claim 5, wherein the processor is further programmed to:
   generate a parameter indicative of a relation between said signal and said component element based upon said signal and said analysis information, and modifies said parameter based upon said signal control information; and
   convert said component element rendering information into rendering information indicative of a relation between said signal and said output signal based upon said modified parameter.

7. A signal control device according to claim 5, wherein the processor is further programmed to:
   generate a parameter indicative of a relation between said signal and said component element based upon said analysis information and said signal control information, and modify said parameter based upon said signal control information; and convert said component element rendering information into rendering information indicative of a relation between said signal and said output signal based upon said modified parameter.

8. A signal analysis method in a signal analysis control system having a signal analysis device and a signal control device capable of conducting transmission and reception of a signal via a network or a recording medium, comprising the steps of:
   decomposing an input signal of a single channel to be transmitted to said signal control device including objective sound and background sound into frequency components to obtain a converted signal, estimating said background sound from said converted signal, calculating a suppression coefficient to be applied said signal including objective sound and background sound based upon the converted signal and an information of the estimated background sound for suppressing said background sound by said signal control device, and encoding said suppression coefficient to generate analysis information; and
   transmitting said signal of said single channel including said objective sound and said background sound, and said analysis information to the signal control device via a network or a recording medium, wherein said signal including objective sound and background sound is transmitted without separating objective sound and background sound.

9. A signal control method in a signal analysis control system having a signal analysis device and a signal control device capable of conducting transmission and reception of a signal via a network or a recording medium, comprising the steps of:
receiving, from said signal analysis device, a signal of a single channel including objective sound and background sound that objective sound and background sound are not separated, and analysis information in which a suppression coefficient to be applied said signal including objective sound and background sound for suppressing said background sound was encoded, via a network or a recording medium, wherein said suppression coefficient was generated based upon a converted signal that obtained by decomposing said signal into frequency components, and an information of the background sound that estimated from said converted signal; and
suppressing and controlling said background sound based upon said analysis information.

10. A signal control method in a signal analysis control system having a signal analysis device and a signal control device capable of conducting transmission and reception of a signal via a network or a recording medium, comprising the steps of:
receiving, from said signal analysis device, a signal of a single channel including objective sound and background sound that objective sound and background sound are not separated, and analysis information in which a suppression coefficient to be applied said signal including objective sound and background sound for suppressing said background sound was encoded, from said signal analysis device via a network or a recording medium;
obtaining a signal control information for modifying said suppression coefficient, obtaining said suppression coefficient by decoding the received analysis information, modifying said suppression coefficient based upon said signal control information; and
suppressing and controlling said background sound based upon the modified suppression coefficient.

11. A signal control method in a signal analysis control system having a signal analysis device and a signal control device capable of conducting transmission and reception of a signal via a network or a recording medium, comprising the steps of:
receiving, from said signal analysis device, a signal of a single channel including objective sound and background sound that objective sound and background sound are not separated, and analysis information in which a suppression coefficient to be applied said signal including objective sound and background sound for suppressing said background sound was encoded, via a network or a recording medium;
receiving component element rendering information for controlling a localization of said objective sound and said background sound ; and
suppressing and controlling said background sound based upon said analysis information and said component element rendering information, and generating an output signal in which the localization of said objective sound is controlled.

12. A signal control method according to claim 11, comprising the steps of:
receiving signal control information for controlling a specific component element, controlling said component element based upon said signal control information, said analysis information, and said component element rendering information, and
generating the output signal.

13. A signal control method according to claim 12, comprising the steps of:
generating a parameter indicative of a relation between said signal and said component element based upon said signal and said analysis information, and modifying said parameter based upon said signal control information; and
converting said component element rendering information into rendering information indicative of a relation between said signal and said output signal based upon said modified parameter.

14. A signal control method according to claim 12, comprising the steps of:
generating a parameter indicative of a relation between said signal and said component element based upon said analysis information and said signal control information, and modifying said parameter based upon said signal control information; and
converting said component element rendering information into rendering information indicative of a relation between said signal and said output signal based upon said modified parameter.

15. A signal analysis control system having a signal analysis device and a signal control device capable of conducting transmission and reception of a signal via a network or a recording medium, wherein
said signal analysis device comprises a first processor programmed to:
input a signal of a single channel to be transmitted to said signal control device, including objective sound and background sound;
decompose said input signal into frequency components to obtain a converted signal, estimate said background sound from said converted signal, calculate a suppression coefficient to be applied said signal including objective sound and background sound, based upon the converted signal and an information of the estimated background sound for suppressing said background sound by said signal control device, encode said suppression coefficient to generate analysis information; and
transmit said signal of said single channel including said objective sound and said background sound, and said analysis information to said signal control device via a network or a recording medium, wherein said signal including objective sound and background sound is transmitted without separating objective sound and background sound
said signal control device comprises a second processor programmed to:
receive said signal of said single channel including said objective sound and said background sound, and said analysis information via said network or said recording medium; and
obtain a signal control information for modifying said suppression coefficient, obtain said suppression coefficient by decoding the received analysis information, modify said suppression coefficient based upon said signal control information, suppress and control said background sound based upon the modified suppression coefficient.

16. A signal analysis control system having a signal analysis device and a signal control device capable of conducting transmission and reception of a signal via a network or a recording medium, wherein
said signal analysis device comprises a first processor programmed to:
input a signal of a single channel to be transmitted to said signal control device, including objective sound and background sound;
decompose said input signal into frequency components to obtain a converted signal, estimate said background sound from said converted signal, calculate a suppression coefficient to be applied said signal including objective sound and background sound, based upon the converted signal and an information of the estimated background sound for suppressing said background sound by said signal control device, encode said suppression coefficient to generate analysis information; and
transmit said signal of said single channel including said objective sound and said background sound, and said analysis information via a network or a recording medium, wherein said signal including objective sound and background sound is transmitted without separating objective sound and background sound;
said signal control device comprises a second processor programmed to:
receive said signal of said single channel including said objective sound and said background sound, and said analysis information via said network or said recording medium; and
receive component element rendering information for controlling a localization of said objective sound and said background sound, suppress and control said background sound based upon said analysis information and said component element rendering information, and generate an output signal in which the localization of said objective sound is controlled.

17. A non-transitory computer readable medium storing signal analysis program, said program causing a computer to execute:
inputting of an input signal to be transmitted to a signal control device, including objective sound and background sound;
decomposition of said input signal of a single channel including objective sound and background sound into frequency components to obtain a converted signal, estimation of said background sound from said converted signal, calculation of a suppression coefficient to be applied said signal including objective sound and background sound, bases upon the converted signal and an information of the estimated background sound for suppressing said background sound by said signal control device, and encoding of said suppression coefficient to generate analysis information; and
transmission of said signal of said single channel including said objective sound and said background sound and said analysis information via a network or a recording medium, wherein said signal including objective sound and background sound is transmitted without separating objective sound and background sound.

* * * * *